United States Patent
Yoneda

(10) Patent No.: US 10,170,565 B2
(45) Date of Patent: Jan. 1, 2019

(54) IMAGING DEVICE, METHOD FOR DRIVING IMAGING DEVICE, AND ELECTRONIC DEVICE

(71) Applicant: Semiconductor Energy Laboratory Co., Ltd., Atsugi-shi, Kanagawa-ken (JP)

(72) Inventor: Seiichi Yoneda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/095,324

(22) Filed: Apr. 11, 2016

(65) Prior Publication Data
US 2016/0316159 A1 Oct. 27, 2016

(30) Foreign Application Priority Data

Apr. 22, 2015 (JP) .................................. 2015-087194

(51) Int. Cl.
*H01L 29/24* (2006.01)
*H01L 29/66* (2006.01)
(Continued)

(52) U.S. Cl.
CPC .......... *H01L 29/24* (2013.01); *H01L 27/1225* (2013.01); *H01L 27/1255* (2013.01);
(Continued)

(58) Field of Classification Search
CPC ...... H04N 5/355; H04N 5/3559; H04N 5/374; H04N 5/3745; H01L 27/14609;
(Continued)

(56) References Cited

U.S. PATENT DOCUMENTS 6,667,767 B1 12/2003 Muramatsu et al.
8,378,391 B2 2/2013 Koyama et al.
(Continued)

FOREIGN PATENT DOCUMENTS

| CN | 101256097 A | 9/2008 |
| CN | 101656271 A | 2/2010 |

(Continued)

OTHER PUBLICATIONS

International Search Report (Application No. PCT/IB2016/052032) dated Jul. 19, 2016.
(Continued)

*Primary Examiner* — Paul M Berardesca
(74) *Attorney, Agent, or Firm* — Fish & Richardson P.C.

(57) ABSTRACT

An imaging device capable of obtaining high-quality imaging data is provided. The imaging device includes a photoelectric conversion element, a first transistor, a second transistor, a third transistor, a fourth transistor, a fifth transistor, a sixth transistor, and a first capacitor. Variation in the threshold voltage of amplifier transistors can be compensated. Furthermore, the imaging device can have a difference detecting function for holding differential data between imaging data for an initial frame and imaging data for a current frame and outputting a signal corresponding to the differential data.

14 Claims, 46 Drawing Sheets

(51) Int. Cl.
  *H01L 27/12* (2006.01)
  *H01L 27/146* (2006.01)
  *H01L 29/786* (2006.01)
  *H04N 5/3745* (2011.01)
  *H04N 5/365* (2011.01)

(52) U.S. Cl.
  CPC .. *H01L 27/14609* (2013.01); *H01L 27/14612* (2013.01); *H01L 27/14665* (2013.01); *H01L 27/14692* (2013.01); *H01L 29/66969* (2013.01); *H01L 29/7869* (2013.01); *H04N 5/3651* (2013.01); *H04N 5/3745* (2013.01); *H04N 5/37457* (2013.01); *H01L 27/14636* (2013.01)

(58) Field of Classification Search
  CPC ......... H01L 27/14612; H01L 27/14643; H01L 27/14645; H01L 27/14654; H01L 27/14656
  See application file for complete search history.

(56) References Cited

U.S. PATENT DOCUMENTS

| | | | |
|---|---|---|---|
| 8,916,869 | B2 | 12/2014 | Koyama et al. |
| 9,117,713 | B2 | 8/2015 | Koyama |
| 2003/0174009 | A1 | 9/2003 | Kimura et al. |
| 2008/0054319 | A1 | 3/2008 | Mouli |
| 2008/0158211 | A1 | 7/2008 | Kwon |
| 2010/0044711 | A1 | 2/2010 | Imai |
| 2013/0250151 | A1 | 9/2013 | Kato |
| 2014/0246670 | A1 | 9/2014 | Koyama |
| 2015/0034831 | A1 | 2/2015 | Miyake et al. |
| 2015/0048366 | A1 | 2/2015 | Koyama et al. |
| 2016/0064443 | A1 | 3/2016 | Inoue et al. |
| 2016/0064444 | A1 | 3/2016 | Inoue et al. |
| 2016/0133660 | A1 | 5/2016 | Inoue et al. |
| 2016/0134789 | A1* | 5/2016 | Inoue .................. H04N 5/2253 348/374 |

FOREIGN PATENT DOCUMENTS

| | | |
|---|---|---|
| EP | 1940161 A | 7/2008 |
| EP | 2157615 A | 2/2010 |
| JP | 2000-050167 A | 2/2000 |
| JP | 2003-229734 A | 8/2003 |
| JP | 2008-166688 A | 7/2008 |
| JP | 2010-074138 A | 4/2010 |
| JP | 2011-119711 A | 6/2011 |
| JP | 2013-198056 A | 9/2013 |
| JP | 2015-046873 A | 3/2015 |
| KR | 2000-0012052 A | 2/2000 |
| KR | 2015-0016127 A | 2/2015 |
| TW | 201515465 | 4/2015 |

OTHER PUBLICATIONS

Written Opinion (Application No. PCT/IB2016/052032) dated Jul. 19, 2016.

* cited by examiner

FIG. 4    31,32,33,35=ON  36=OFF

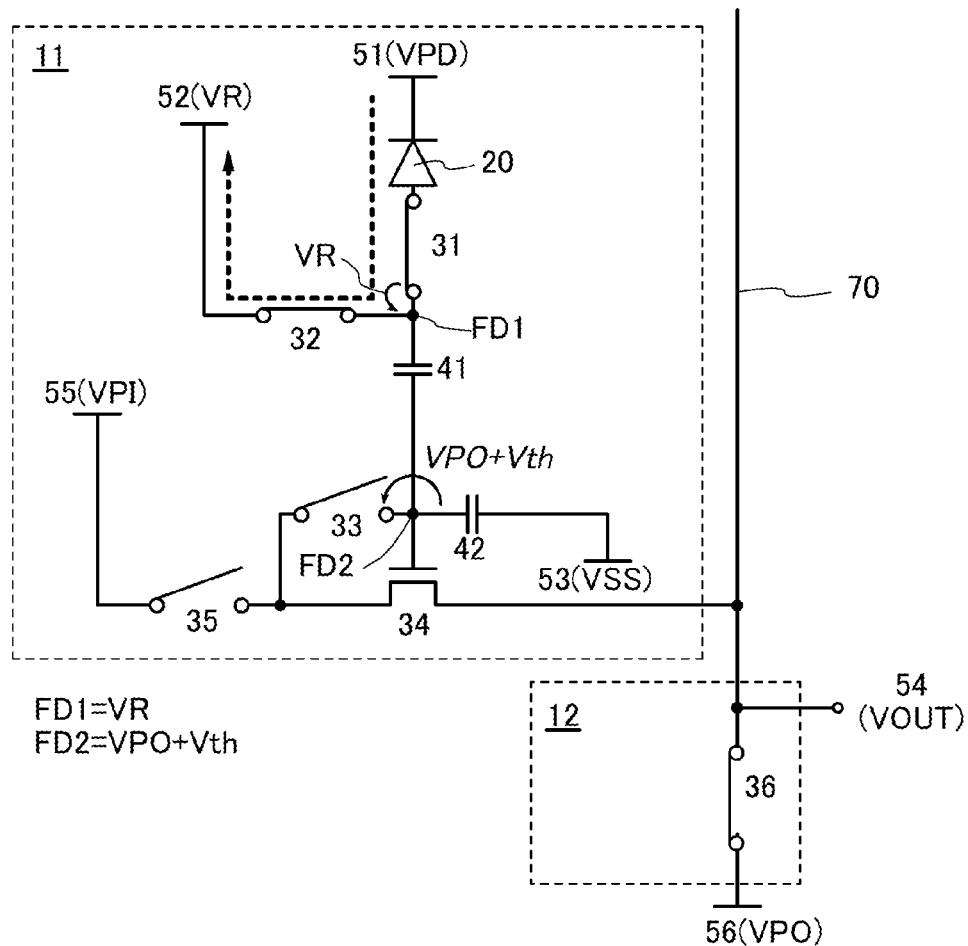

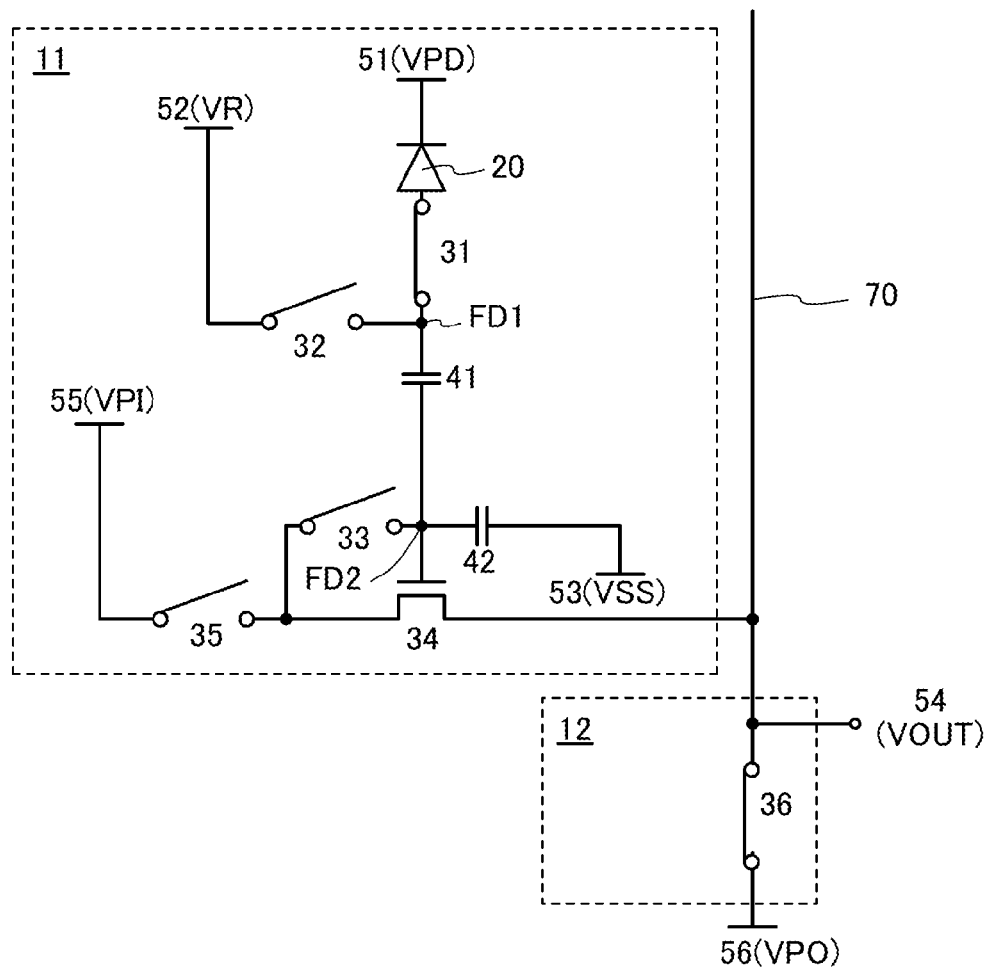
FIG. 7   31,36=ON   32,33,35=OFF

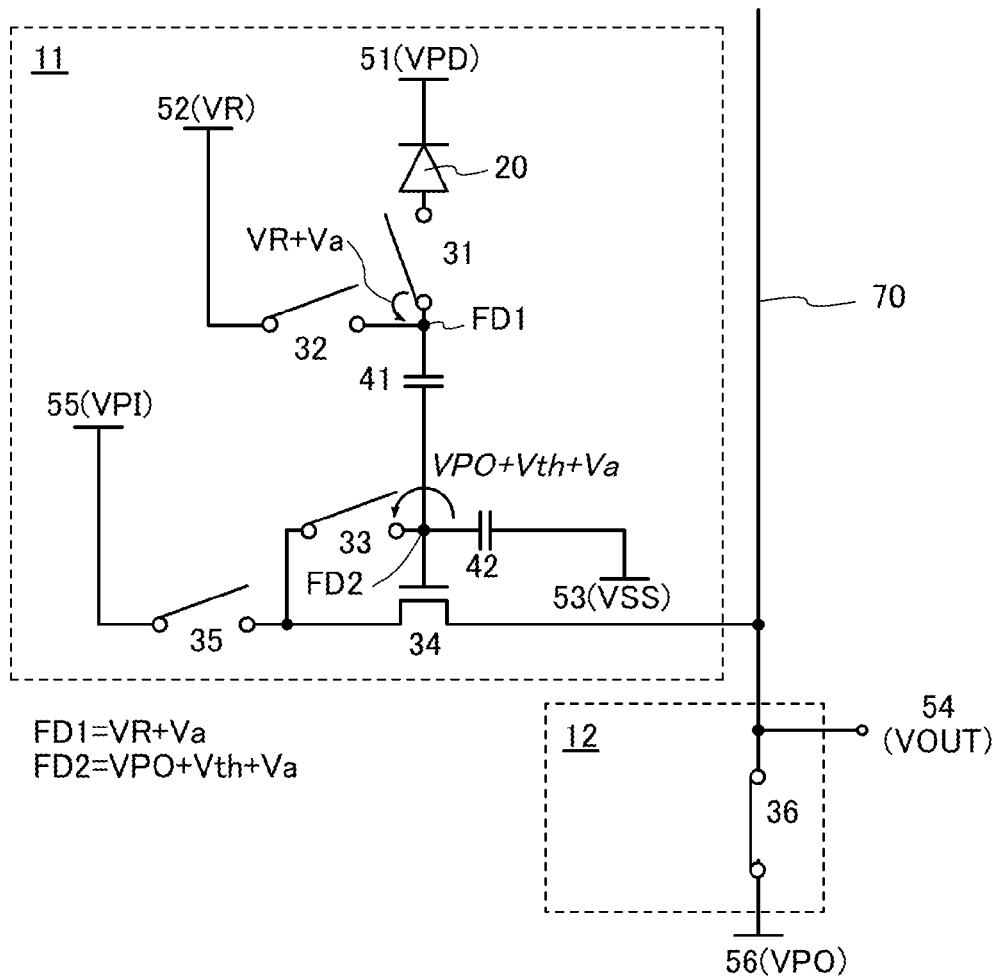

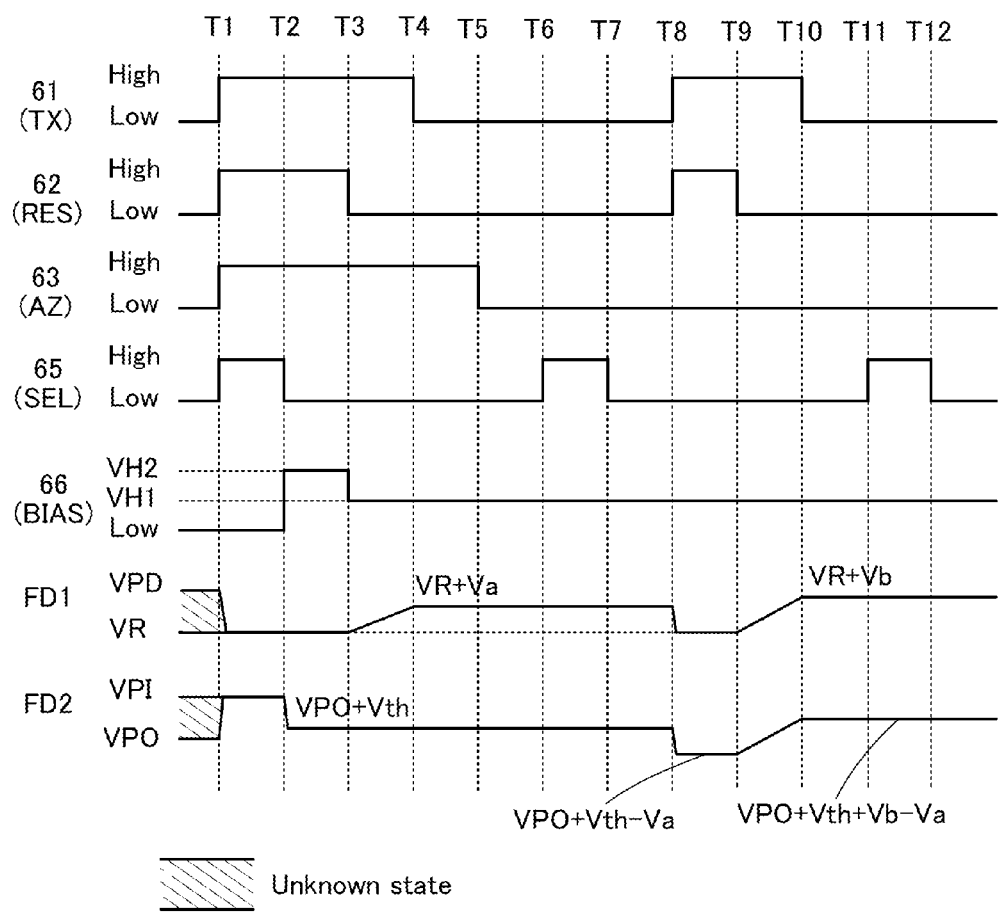

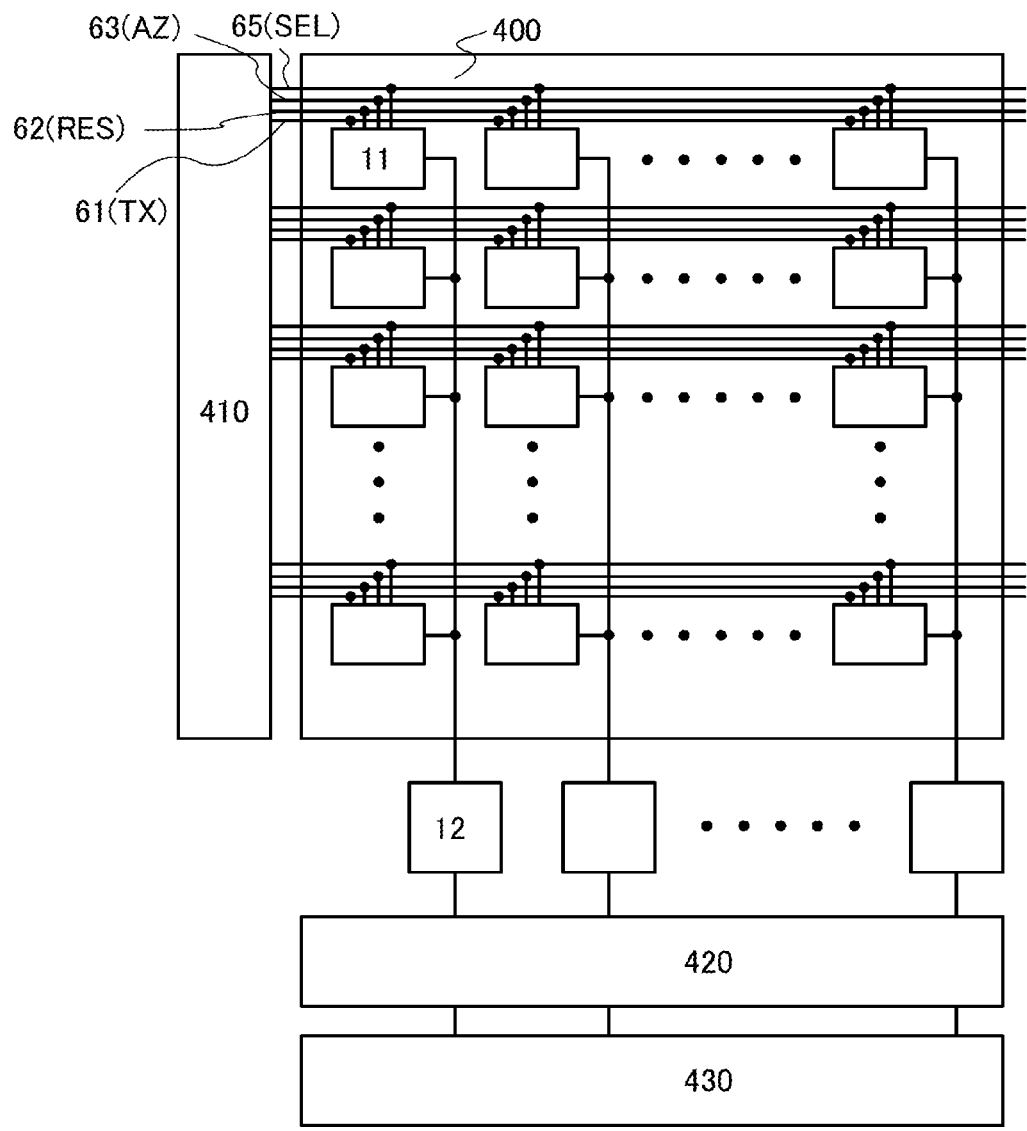

FIG. 33A1
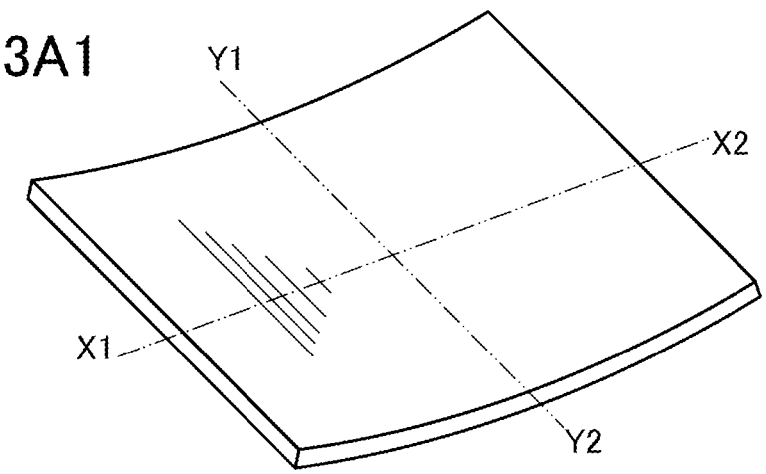
FIG. 33A2
FIG. 33A3
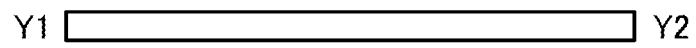
FIG. 33B1
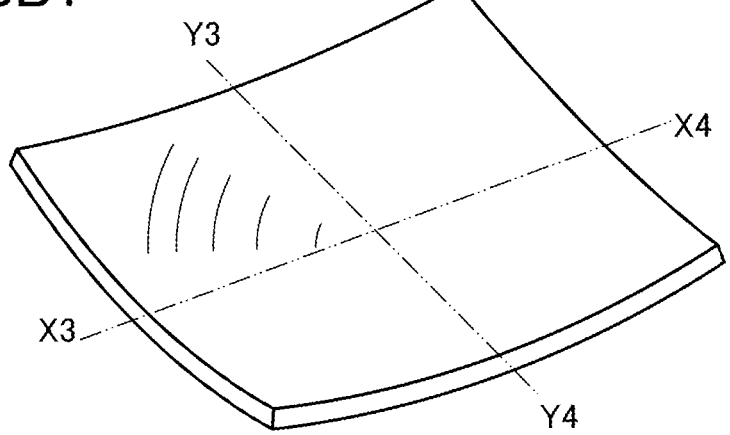
FIG. 33B2
FIG. 33B3

IMAGING DEVICE, METHOD FOR DRIVING IMAGING DEVICE, AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

BACKGROUND ART

As a semiconductor device in which pixels each provided with a photosensor are arranged in a matrix, a complementary metal oxide semiconductor (CMOS) image sensor is known. CMOS image sensors are provided in many portable devices such as digital cameras or cellular phones as imaging elements.

Silicon is widely known as a semiconductor material applicable to a transistor generally included in a CMOS image sensor or the like. As another material, an oxide semiconductor has attracted attention.

For example, Patent Document 1 discloses that a transistor including an oxide semiconductor and having extremely low off-state current is used in part of a pixel circuit and a transistor including a silicon semiconductor with which a CMOS circuit can be formed is used in a peripheral circuit, so that an imaging device with high speed operation and low power consumption can be manufactured.

REFERENCE

[Patent Document 1] Japanese Published Patent Application No. 2011-119711

DISCLOSURE OF INVENTION

A CMOS image sensor includes an amplifier transistor for outputting data in each pixel. In order to obtain high-quality imaging data, electrical characteristics of the transistors in all the pixels are preferably uniform. However, as miniaturization progresses, the degree of difficulty of a transistor manufacturing process increases, and it is difficult to reduce variation in electrical characteristics.

Output data can be compensated by retaining data for compensating variation in electrical characteristics in a capacitor or the like. However, total imaging time becomes long if data is written to a capacitor by each imaging. In addition, the increase in power consumption becomes a problem.

Thus, an object of one embodiment of the present invention is to provide an imaging device capable of obtaining high-quality imaging data. Another object of one embodiment of the present invention is to provide an imaging device capable of compensating variation in the threshold voltage of amplifier transistors included in pixel circuits. Another object of one embodiment of the present invention is to provide an imaging device with low power consumption. Another object of one embodiment of the present invention is to provide an imaging device that is suitable for high-speed operation. Another object of one embodiment of the present invention is to provide an imaging device with high sensitivity. Another object of one embodiment of the present invention is to provide an imaging device with a wide dynamic range. Another object of one embodiment of the present invention is to provide an imaging device with high resolution. Another object of one embodiment of the present invention is to provide an imaging device formed at low cost. Another object of one embodiment of the present invention is to provide an imaging device with high reliability. Another object of one embodiment of the present invention is to provide a novel imaging device or the like. Another object of one embodiment of the present invention is to provide a novel semiconductor device or the like. Another object of one embodiment of the present invention is to provide a method for driving a novel imaging device.

The description of these objects does not disturb the existence of other objects. In one embodiment of the present invention, there is no need to achieve all the objects. Other objects will be apparent from and can be derived from the description of the specification, the drawings, the claims, and the like. Other objects will be apparent from and can be derived from the description of the specification, the drawings, the claims, and the like.

One embodiment of the present invention relates to an imaging device capable of compensating variation in the threshold voltage of amplifier transistors included in pixel circuits.

One embodiment of the present invention is an imaging device including a photoelectric conversion element, a first transistor, a second transistor, a third transistor, a fourth transistor, a fifth transistor, a sixth transistor, and a first capacitor. One terminal of the photoelectric conversion element is electrically connected to one of a source electrode and a drain electrode of the first transistor. The other of the source electrode and the drain electrode of the first transistor is electrically connected to one of a source electrode and a drain electrode of the sixth transistor and one terminal of the first capacitor. One of a source electrode and a drain electrode of the third transistor is electrically connected to the other terminal of the first capacitor and a gate electrode of the fourth transistor. The other of the source electrode and the drain electrode of the third transistor is electrically connected to one of a source electrode and a drain electrode of the fourth transistor and one of a source electrode and a drain electrode of the fifth transistor. The other of the source electrode and the drain electrode of the fourth transistor is electrically connected to one of a source electrode and a drain electrode of the second transistor.

Another embodiment of the present invention is an imaging device including a photoelectric conversion element, a first transistor, a third transistor, a fourth transistor, a fifth transistor, a second transistor, and a first capacitor. One terminal of the photoelectric conversion element is electrically connected to one of a source electrode and a drain electrode of the first transistor. The other of the source electrode and the drain electrode of the first transistor is electrically connected to one terminal of the first capacitor. One of a source electrode and a drain electrode of the third transistor is electrically connected to the other terminal of the first capacitor and a gate electrode of the fourth transistor. The other of the source electrode and the drain electrode of the third transistor is electrically connected to one of a source electrode and a drain electrode of the fourth transistor and one of a source electrode and a drain electrode of the fifth transistor. The other of the source electrode and the drain electrode of the fourth transistor is electrically connected to one of a source electrode and a drain electrode of the second transistor.

Each of the first, third, and sixth transistors may include an oxide semiconductor in an active layer. The oxide semiconductor may include In, Zn, and M (M is Al, Ti, Ga, Sn, Y, Zr, La, Ce, Nd, or Hf).

Each of the first, third, and sixth transistors may have a back gate electrode.

The imaging device may further include a second capacitor, and one terminal of the second capacitor may be electrically connected to the other terminal of the first capacitor.

The photoelectric conversion element may include a material containing selenium.

Another embodiment of the present invention is a method for driving the imaging device that comprises a plurality of pixels each comprising the fourth transistor, in which the first transistor, the sixth transistor, the third transistor, and the fifth transistor are turned on and the second transistor is turned off at a first time; then, the fifth transistor is turned off and the second transistor is turned on at a second time. By this process, variation in the threshold voltage of the fourth transistors is compensated.

A potential that is applied to a gate electrode of the second transistor at the second time may be higher than a potential applied to the gate electrode of the second transistor in imaging operation performed after the second time.

Another embodiment of the present invention is an electronic device including the imaging device and a display device.

According to one embodiment of the present invention, an imaging device capable of obtaining high-quality imaging data can be provided. An imaging device capable of compensating variation in the electrical characteristics of amplifier transistors included in pixel circuits can be provided. A low-power imaging device can be provided. An imaging device that is suitable for high-speed operation can be provided. An imaging device with high sensitivity can be provided. An imaging device with a wide dynamic range can be provided. An imaging device with high resolution can be provided. An imaging device formed at low cost can be provided. An imaging device with high reliability can be provided. A novel imaging device or the like can be provided. A novel semiconductor device or the like can be provided. A method for driving a novel imaging device can be provided.

The description of these effects does not disturb the existence of other effects. In one embodiment of the present invention, there is no need to obtain all the effects. Other effects will be apparent from and can be derived from the description of the specification, the drawings, the claims, and the like.

BRIEF DESCRIPTION OF DRAWINGS

In the accompanying drawings:
FIG. 6 illustrates imaging operation;
FIG. 7 illustrates imaging operation;
FIG. 8 illustrates imaging operation;
FIG. 14 is a timing chart illustrating compensation operation and imaging operation;
FIG. 32 is a block diagram illustrating a structure of an imaging device;
FIGS. 33A1, 33A2, 33A3, 33B1, 33B2, and 33B3 illustrate bent imaging devices.

BEST MODE FOR CARRYING OUT THE INVENTION

Figure 1:
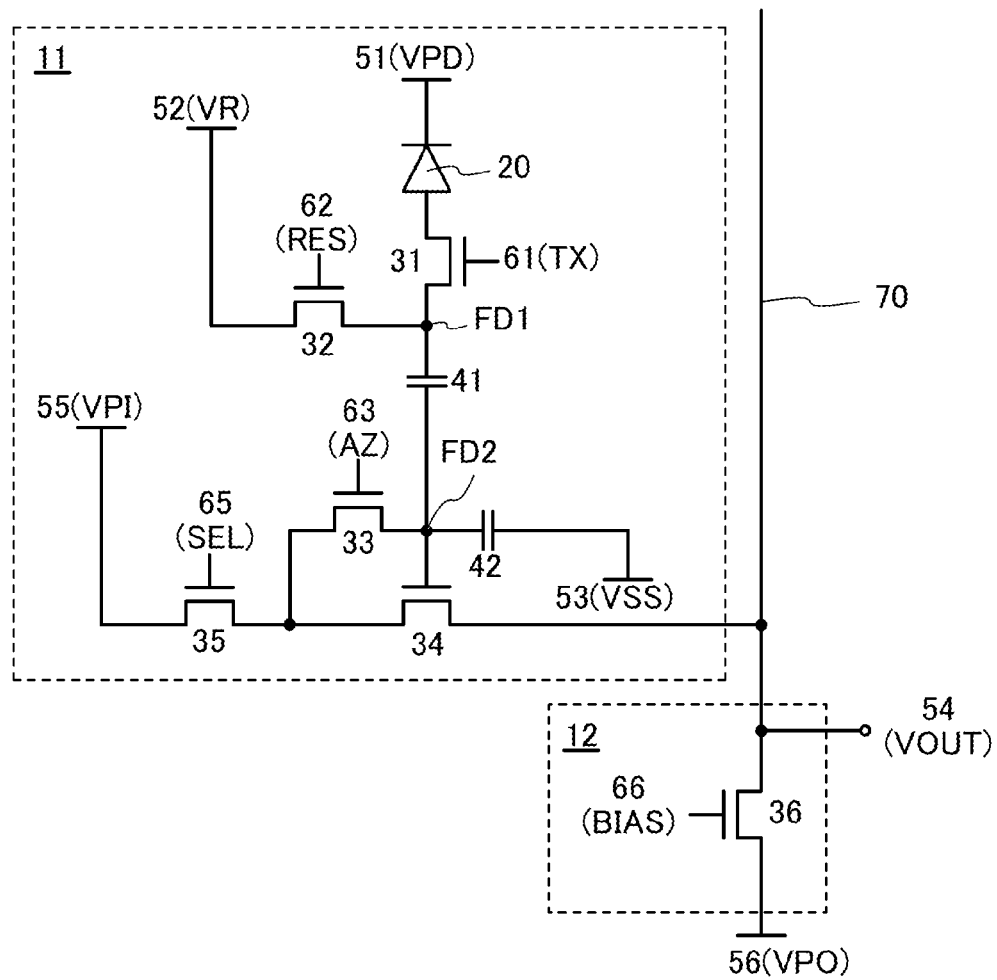
FIG. 1 illustrates a pixel circuit.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

In this specification, functions of a "source electrode" and a "drain electrode" of a transistor are sometimes replaced with each other when a transistor of opposite polarity is used or when the direction of current flowing is changed in circuit operation, for example. Therefore, the terms "source electrode" and "drain electrode" can be replaced with each other in this specification. In addition, the term "electrode" can be changed into the term "wiring".

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source electrode (or a first terminal or the like) of a transistor is electrically connected to X through (or not through) Z1 and a drain electrode (or a second terminal or the like) of the transistor is electrically connected to Y through (or not through) Z2, or the case where a source electrode (or a first terminal or the like) of a transistor is directly connected to part of Z1 and another part of Z1 is directly connected to X while a drain electrode (or a second terminal or the like) of the transistor is directly connected to part of Z2 and another part of Z2 is directly connected to Y, can be expressed by using any of the following expressions.

Examples of the expressions include, "X, Y, a source electrode (or a first terminal or the like) of a transistor, and a drain electrode (or a second terminal or the like) of the transistor are electrically connected to each other, and X, the source electrode (or the first terminal or the like) of the transistor, the drain electrode (or the second terminal or the like) of the transistor, and Y are electrically connected to each other in this order", "a source electrode (or a first terminal or the like) of a transistor is electrically connected to X, a drain electrode (or a second terminal or the like) of the transistor is electrically connected to Y, and X, the source electrode (or the first terminal or the like) of the transistor, the drain electrode (or the second terminal or the like) of the transistor, and Y are electrically connected to each other in this order", and "X is electrically connected to Y through a source electrode (or a first terminal or the like) and a drain electrode (or a second terminal or the like) of a transistor, and X, the source electrode (or the first terminal or the like) of the transistor, the drain electrode (or the second terminal or the like) of the transistor, and Y are provided to be connected in this order". When the connection order in a circuit configuration is defined by an expression similar to the above examples, a source electrode (or a first terminal or the like) and a drain electrode (or a second terminal or the like) of a transistor can be distinguished from each other to specify the technical scope.

Other examples of the expressions include, "a source electrode (or a first terminal or the like) of a transistor is electrically connected to X through at least a first connection path, the first connection path does not include a second connection path, the second connection path is a path between the source electrode (or the first terminal or the like) of the transistor and a drain electrode (or a second terminal or the like) of the transistor, Z1 is on the first connection path, the drain electrode (or the second terminal or the like) of the transistor is electrically connected to Y through at least a third connection path, the third connection path does not include the second connection path, and Z2 is on the third connection path" and "a source electrode (or a first terminal or the like) of a transistor is electrically connected to X at least with a first connection path through Z1, the first connection path does not include a second connection path, the second connection path includes a connection path through which the transistor is provided, a drain electrode (or a second terminal or the like) of the transistor is electrically connected to Y at least with a third connection path through Z2, and the third connection path does not include the second connection path." Still another example of the expression is "a source electrode (or a first terminal or the like) of a transistor is electrically connected to X through at least Z1 on a first electrical path, the first electrical path does not include a second electrical path, the second electrical path is an electrical path from the source electrode (or the first terminal or the like) of the transistor to a drain electrode (or a second terminal or the like) of the transistor, the drain electrode (or the second terminal or the like) of the transistor is electrically connected to Y through at least Z2 on a third electrical path, the third electrical path does not include a fourth electrical path, and the fourth electrical path is an electrical path from the drain electrode (or the second terminal or the like) of the transistor to the source electrode (or the first terminal or the like) of the transistor." When the connection path in a circuit configuration is defined by an expression similar to the above examples, a source electrode (or a first terminal or the like) and a drain electrode (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive layer, and a layer).

Even when independent components are electrically connected to each other in a circuit diagram, one component has functions of a plurality of components in some cases. For example, when part of a wiring has a function as an electrode, one conductive layer functions as the wiring and the electrode. Thus, the term "electrical connection" in this specification also means such a case where one conductive layer has functions of a plurality of components.

Note that the terms "film" and "layer" can be interchanged with each other depending on circumstances or conditions. For example, the term "conductive film" can be changed into the term "conductive layer" in some cases. In addition, the term "insulating film" can be changed into the term "insulating layer" in some cases.

Embodiment 1

In this embodiment, an imaging device that is one embodiment of the present invention is described with reference to drawings.

An imaging device of one embodiment of the present invention includes a pixel circuit capable of compensating variation in the threshold voltage of transistors that function as source follower amplifier transistors in pixels of the imaging device that outputs signal charge (data) by the source followers.

Figure 2:
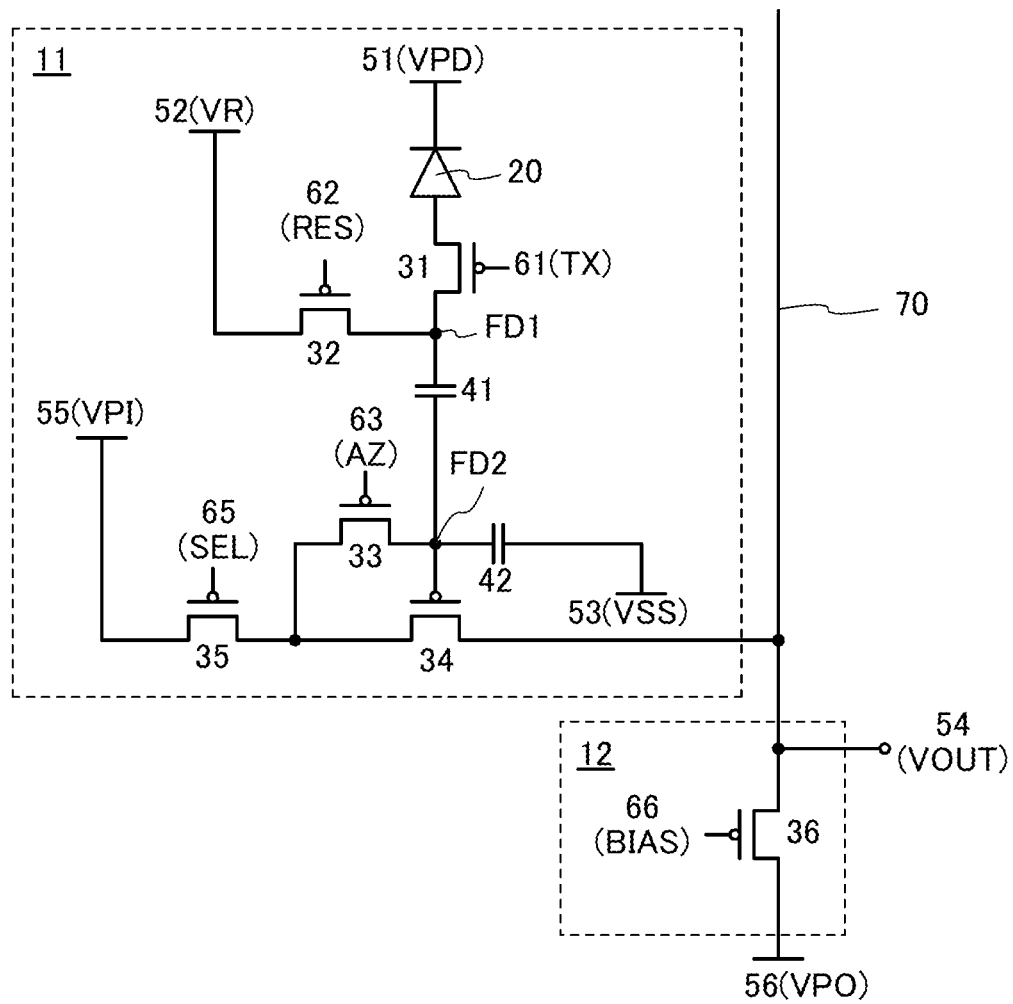
FIG. 2 illustrates a pixel circuit.

FIG. 1 is a circuit diagram of a circuit 11 capable of functioning as a pixel circuit and a circuit 12 capable of functioning as an output circuit, included in an imaging device in one embodiment of the present invention. In FIG. 1 and the like, transistors are n-ch transistors; however, one embodiment of the present invention is not limited thereto. The transistors may be p-ch transistors as illustrated in FIG. 2 by reversing the magnitude relationship of a potential. Alternatively, some of the n-ch transistors may be replaced with p-ch transistors. Alternatively, CMOS transistors may be employed.

The circuit 11 includes a photoelectric conversion element 20, a transistor 31, a transistor 32, a transistor 33, a transistor 34, a transistor 35, a capacitor 41, and a capacitor 42.

The circuit 12 includes a transistor 36.

In the circuit 11 in FIG. 1, one terminal of the photoelectric conversion element 20 is electrically connected to one of a source electrode and a drain electrode of the transistor 31. The other of the source electrode and drain electrode of the transistor 31 is electrically connected to one of a source electrode and a drain electrode of the transistor 32 and one terminal of the capacitor 41. One of a source electrode and a drain electrode of the transistor 33 is electrically connected to the other terminal of the capacitor 41, one terminal of the capacitor 42, and a gate electrode of the transistor 34. The other of the source electrode and drain electrode of the transistor 33 is electrically connected to one of a source electrode and a drain electrode of the transistor 34 and one of a source electrode and a drain electrode of the transistor 35.

The other terminal of the photoelectric conversion element 20 is electrically connected to a wiring 51 (VPD). The other of the source electrode and the drain electrode of the transistor 32 is electrically connected to a wiring 52 (VR). The other terminal of the capacitor 42 is electrically connected to a wiring 53 (VSS). The other of the source electrode and the drain electrode of the transistor 35 is electrically connected to a wiring 55 (VPI).

A gate electrode of the transistor 31 is electrically connected to a wiring 61 (TX). A gate electrode of the transistor 32 is electrically connected to a wiring 62 (RES). A gate electrode of the transistor 33 is electrically connected to a wiring 63 (AZ). A gate electrode of the transistor 35 is electrically connected to a wiring 65 (SEL). The other of the source electrode and the drain electrode of the transistor 34 is electrically connected to a wiring 70.

In the circuit 12, one of a source electrode and a drain electrode of the transistor 36 is electrically connected to the wiring 70. The other of the source electrode and the drain electrode of the transistor 36 is electrically connected to a wiring 56 (VPO). A gate electrode of the transistor 36 is electrically connected to a wiring 66 (BIAS). The wiring 70 is electrically connected to a wiring 54 ($V_{OUT}$).

Here, the wiring 51 (VPD), the wiring 52 (VR), the wiring 53 (VSS), the wiring 55 (VPI), and the wiring 56 (VPO) can function as power supply lines. In addition, the wiring 61 (TX), the wiring 62 (RES), the wiring 63 (AZ), the wiring 65 (SEL), and the wiring 66 (BIAS) can function as signal lines.

In the above structure, a node where the other of the source electrode and the drain electrode of the transistor 31, the one of the source electrode and the drain electrode of the transistor 32, and the one terminal of the capacitor 41 are connected to one another is denoted by FD1.

Furthermore, a node to which the one of the source electrode and the drain electrode of the transistor 33, the gate electrode of the transistor 34, the other terminal of the capacitor 41, and the one terminal of the capacitor 42 are connected is denoted by FD2.

In the circuit 11, the photoelectric conversion element 20 is a light-receiving element and can have a function of generating current corresponding to the amount of light incident on the circuit 11. The transistor 31 can have a function of controlling accumulation/release of charge in/from the node FD1 by the photoelectric conversion element 20. The transistor 32 can have a function of resetting the potential of the node FD1. The transistor 33 can have a function of resetting the potential of the node FD2. The transistor 34 can have a function as an amplifying transistor configured to output a signal corresponding to the potential of the node FD2. The transistor 35 can have a function of controlling selection of the circuit 11 (pixel circuit) at the time of reading.

In the circuit 12, the transistor 36 can function as a bias transistor. The wiring 54 ($V_{OUT}$) can have a function of outputting a signal corresponding to the potential of the node FD2.

In the imaging device of one embodiment of the present invention with the above structure, an output signal is compensated when the circuit 11 stores the threshold voltage of the transistor 34 included in the circuit 11.

Figure 3:
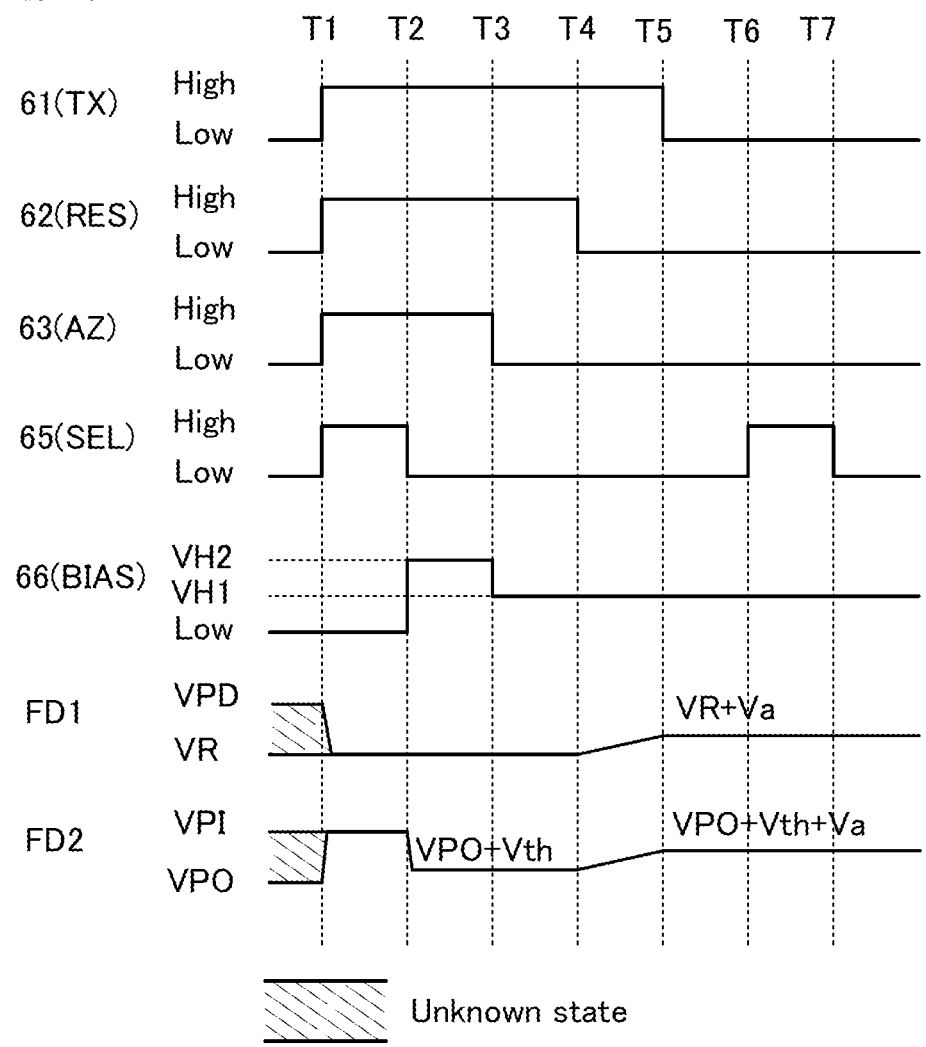
FIG. 3 is a timing chart illustrating compensation operation and imaging operation.
Figure 4:
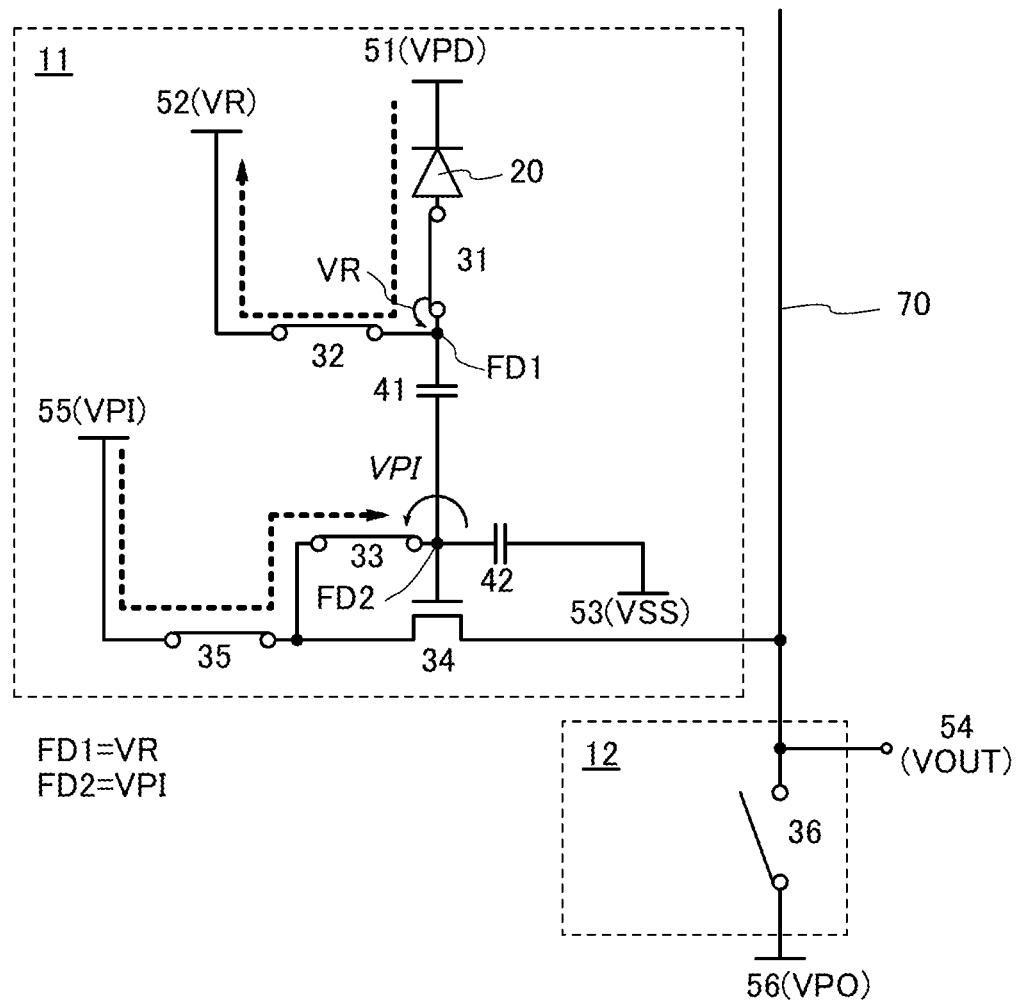
FIG. 4 illustrates compensation operation.
Figure 5:
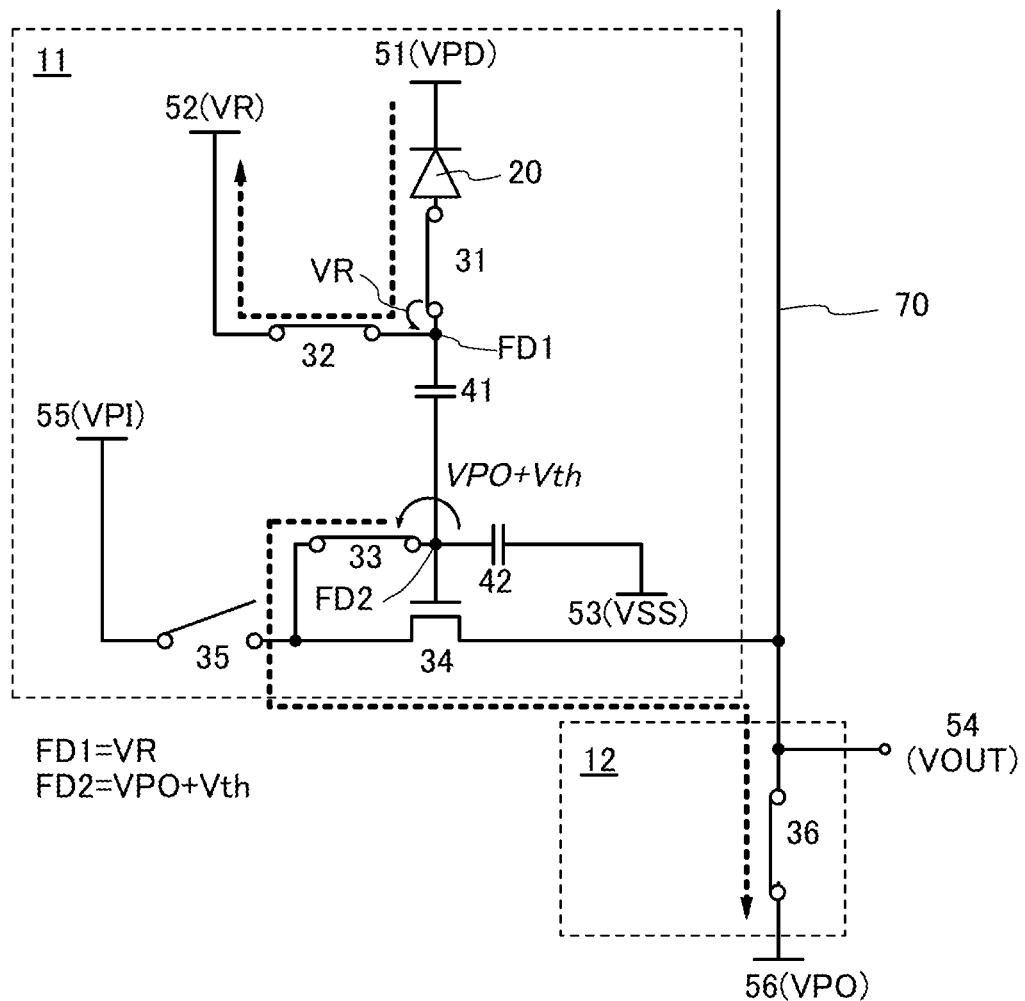
FIG. 5 illustrates compensation operation.

Details of the compensation operation of the output signal and imaging operation after the compensation in the circuit in FIG. 1 will be described with reference to a timing chart in FIG. 3 and circuit diagrams in FIG. 4, FIG. 5, FIG. 6, FIG. 7, and FIG. 8. The compensation operation of the output signal is performed from time T1 to T3, and the imaging operation is performed after time T3. In the timing chart in FIG. 3, the potentials of the wiring 61 (TX), the wiring 62 (RES), the wiring 63 (AZ), the wiring 65 (SEL), the wiring 66 (BIAS), the node FD1, and the node FD2 are illustrated. Note that each transistor is turned on or off in accordance with a potential which is supplied to a wiring connected to a gate electrode of each transistor for turning on/off the transistor.

In FIG. 4, FIG. 5, FIG. 6, FIG. 7, and FIG. 8, the transistors other than the transistor 34 are described as switches in order to clarify conduction state of the transistors. In addition, some reference numerals are omitted. Note that, the wiring 51 (VPD) has a high potential, the wiring 52 (VR) has a low potential, the wiring 53 (VSS) has a low potential, the wiring 55 (VPI) has a high potential, and the wiring 56 (VPO) has a low potential; however, the wiring can be supplied with another potential to be operated.

Note that in this specification, the low potential can be a ground potential (GND).

First, the compensation operation of the threshold voltage "Vth" of the transistor 34 is described. At time T1, high potentials are applied to the wiring 61 (TX), the wiring 62 (RES), the wiring 63 (AZ), and the wiring 65 (SEL) so that the transistor 31, the transistor 32, the transistor 33, and the transistor 35 are turned on. Furthermore, a low potential is applied to the wiring 66 (BIAS) so that the transistor 36 is turned off. Accordingly, the potential of the node FD1 is set to the potential "VR" of the wiring 52 (VR), and the potential of the node FD2 is set to the potential "VPI" of the wiring 55 (VPI) (see a current path indicated by a broken line in FIG. 4).

At time T2, a high potential is applied to the wiring 66 (BIAS) so that the transistor 36 is turned on. Furthermore, a low potential is applied to the wiring 65 (SEL) so that the transistor 35 is turned off. Accordingly, the potential of the node FD2 is discharged. When the potential of the node FD2 changes from "VPI" to "VPO+Vth", the discharge is terminated, and the potential is held (see FIG. 5). Here, in order to change the potential of the node FD2 as quickly as possible, the potential of the wiring 66 (BIAS) is preferably made as high as possible. For example, it is preferable to apply a potential "VH2" that is higher than a high potential "VH1" that is applied to the wiring 66 (BIAS) in the imaging operation described later. However, the potential "VH1" may be applied to the wiring 66 (BIAS). The above is the description of the compensation operation.

It is not necessary to perform the compensation operation by each imaging and imaging can be successively performed only by one compensation operation. Needless to say, the compensation operation may be performed before imaging, after imaging, at the time of power-on, at the time of power-off, or at given timing using a timer or the like.

Next, the imaging operation will be described. At time T3, a low potential is applied to the wiring 63 (AZ) so that the transistor 33 is turned off (see FIG. 6). Accordingly, the node FD2 is brought into a floating state. Note that although the potential of the wiring 66 (BIAS) is preferably decreased to "VH1", it may remain at the potential "VH2".

At time T4, a low potential is applied to the wiring 62 (RES) so that the transistor 32 is turned off (see FIG. 7). Accordingly, charge is accumulated in the node FD1 from the wiring 51 (VPD) through the photoelectric conversion element 20; thus, the potential of the node FD1 is increased. As the illuminance of light delivered to the photoelectric conversion element 20 becomes higher, the potential of the node FD1 becomes higher.

At time T5, a low potential is applied to the wiring 61 (TX) so that the transistor 31 is turned off. In the case where the potential of the node FD1 is increased by "Va" at time T4 to time T5, the potential of the node FD1 is held at "VR+Va" at time T5. Furthermore, because the node FD1 is electrically connected to the node FD2 through the capacitor 41, and the node FD2 is in a floating state, the potential of the node FD2 is increased by "Va" owing to the capacitive coupling of the node FD1 and the node FD2. That is the potential of the node FD2 changes from "VPO+Vth" to "VPO+Vth+Va" (see FIG. 8).

At time T6, a high potential is applied to the wiring 65 (SEL) so that the transistor 35 is turned on. In addition, a potential "VH1" is applied to the wiring 66 (BIAS). When a difference between a gate potential and a source potential of the transistor 34 is "Vgs", the current "I" flowing through the transistor 34 is represented by Formula 1. Note that "α" is a constant.

$$I = \alpha/2(Vgs - Vth)^2 \quad \text{[Formula 1]}$$
$$= \alpha/2(VPO + Vth + Va - VOUT - Vth)^2$$
$$= \alpha/2(VPO + Va - VOUT)^2$$

Note that the values of current flowing through the transistor 34 and the transistor 36 are equal. The current "I" is also represented by Formula 2. Here, a difference between a gate potential and a source potential of the transistor 36 is "Vgs'", and the threshold voltage of the transistor 36 is "Vth'". Note that parameters of the transistor 34 and the transistor 36, such as the channel length, the channel width, the thickness of a gate insulating film, and the mobility are assumed to be equal.

$$I = \alpha/2(Vgs' - Vth')^2 \quad \text{[Formula 2]}$$
$$= \alpha/2(VH1 - VPO - Vth')^2$$

The following Formula 3 is established based on Formula 1 and Formula 2.

$$\alpha/2(VPO+Va-VOUT)^2 = \alpha/2(VH1-VPO-Vth')^2 \quad \text{[Formula 3]}$$

By modifying Formula 3, Formula 4 is obtained. That is, the potential of the wiring 54 ($V_{OUT}$) becomes "2VPO+Va+Vth'−VH1", which indicates that the potential of the wiring 54 ($V_{OUT}$) does not depend on the threshold voltage "Vth" of the transistor 34.

$$VOUT = 2VPO+Va+Vth'-VH1 \quad \text{[Formula 4]}$$

Thus, a signal that does not include variation in the threshold voltage "Vth" of the transistor 34 can be output to the wiring 54 ($V_{OUT}$), and high-quality imaging data can be obtained. Note that in the circuit configuration in FIG. 1, as the illuminance of light delivered to the photoelectric conversion element 20 becomes higher, the signal output from the wiring 54 ($V_{OUT}$) becomes higher.

At time T7, when a low potential is applied to the wiring 65 (SEL), the transistor 35 is turned off. Through the above steps, the imaging operation is terminated.

Note that at time T1 to time T3, a low potential may be applied to the wiring 61 (TX) so that the transistor 31 is turned off. For example, the transistor 31 may be turned off at time T1 and turned on at time T2 by application of a low potential and a high potential to the wiring 61 (TX) at time T1 and time T2, respectively. However, at time T4, the transistor 32 needs to be turned off while the transistor 31 is turned on; thus, at time T3, the transistor 31 is preferably turned on.

Note that from time T1 to time T2, and from time T3 to time T6, a given potential can be applied to the wiring 66 (BIAS). For example, to the wiring 66 (BIAS), a low potential may be applied from time T1 to time T2, and a potential "VH1" may be applied from time T2 to time T7. Alternatively, for example, a low potential may be applied from time T1 to time T2 and time T7, and a potential "VH1" may be applied from time T2 to time T7. Alternatively, for example, a potential "VH2" may be applied from time T1 to time T6, and a potential "VH1" may be applied from time T6 to time T7. Further alternatively, a potential "VH1" may be applied from time T1 to time T7.

A transistor whose active layer or active region includes an oxide semiconductor (hereinafter referred to as an OS transistor) is preferably used in the imaging device of one embodiment of the present invention.

The use of the OS transistor in the circuit 11 can broaden the dynamic range of imaging. In the circuit configuration in FIG. 1, a decrease in the illuminance of light entering the photoelectric conversion element 20 reduces the potential of the node FD1; thus, a potential of the node FD2 is also decreased. Since the OS transistor has extremely low off-state current, current based on a gate potential of the transistor 34 can be accurately output even when the potential of the node FD2 (the gate potential) is extremely low. Thus, it is possible to broaden the detection range of illuminance, i.e., the dynamic range.

A period during which charge can be held in the node FD1 and the node FD2 can be extremely long owing to the low off-state current of the transistor. Therefore, a global shutter system in which imaging data is obtained in all the pixels at the same time can be used without a complicated circuit configuration and driving method.

Figure 9A:
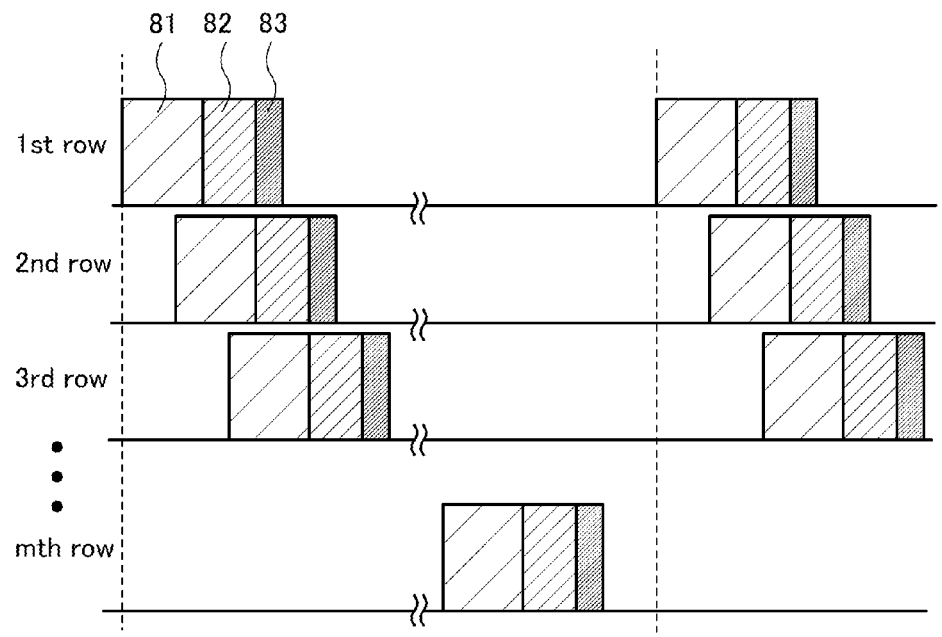
FIGS. 9A and 9B illustrate operations of a rolling shutter system and a global shutter system, respectively.

In general, in an imaging device where pixels are arranged in a matrix, a rolling shutter system is employed in which imaging operation 81, data holding operation 82, and read operation 83 are performed row by row as illustrated in FIG. 9A. In the case of employing the rolling shutter system, simultaneousness of imaging is lost. Therefore, when an object moves, an image is distorted.

Figure 9B:
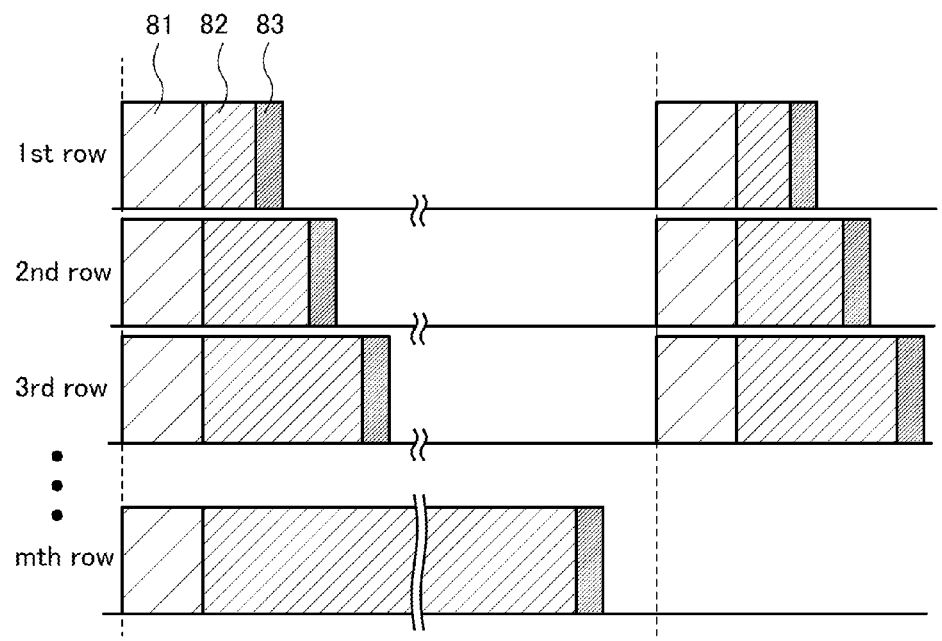

As a result, in one embodiment of the present invention, it is preferable to employ a global shutter system in which the imaging operation 81 can be performed simultaneously in all the rows and the read operation 83 can be sequentially performed row by row as illustrated in FIG. 9B. By employing the global shutter system, simultaneousness of imaging in all the pixels in the imaging device can be secured, and an image with little distortion can be easily formed even when an object moves.

The OS transistor has lower temperature dependence of change in electrical characteristics than a transistor whose active layer or active region includes silicon (hereinafter referred to as a Si transistor), and thus can be used in an extremely wide range of temperatures. Thus, an imaging device and a semiconductor device which include OS transistors are suitable for use in automobiles, aircrafts, and spacecrafts.

Moreover, the OS transistor has higher drain withstand voltage than the Si transistor. In a photoelectric conversion element including a selenium-based material in a photoelectric conversion layer, a relatively high voltage (e.g., 10 V or more) is preferably applied to easily cause the avalanche phenomenon. Therefore, by combination of the OS transistor and the photoelectric conversion element in which the above selenium-based material is used for the photoelectric conversion layer, a highly reliable imaging device can be obtained.

A transistor connected to either of the node FD1 and the node FD2 needs to be a transistor with low noise. The channel of a transistor including two or three oxide semiconductor layers to be described later is a buried channel, which has significantly high resistance to noise. Thus, the use of the transistor leads to an image with low noise.

Thus, it is preferable that at least the transistors 31 to 33 be OS transistors. Furthermore, any one or more or all of the transistors 34 to 36 may be an OS transistor (OS transistors).

Note that part or all of the transistors 31 to 36 may be a Si transistor (Si transistors). For example, any one of the transistors 31 to 36 may be a Si transistor (Si transistors);

alternatively, two or more of the transistors 31 to 36 may be Si transistors. Further alternatively, the transistors 34 to 36 may be Si transistors.

Figure 10:
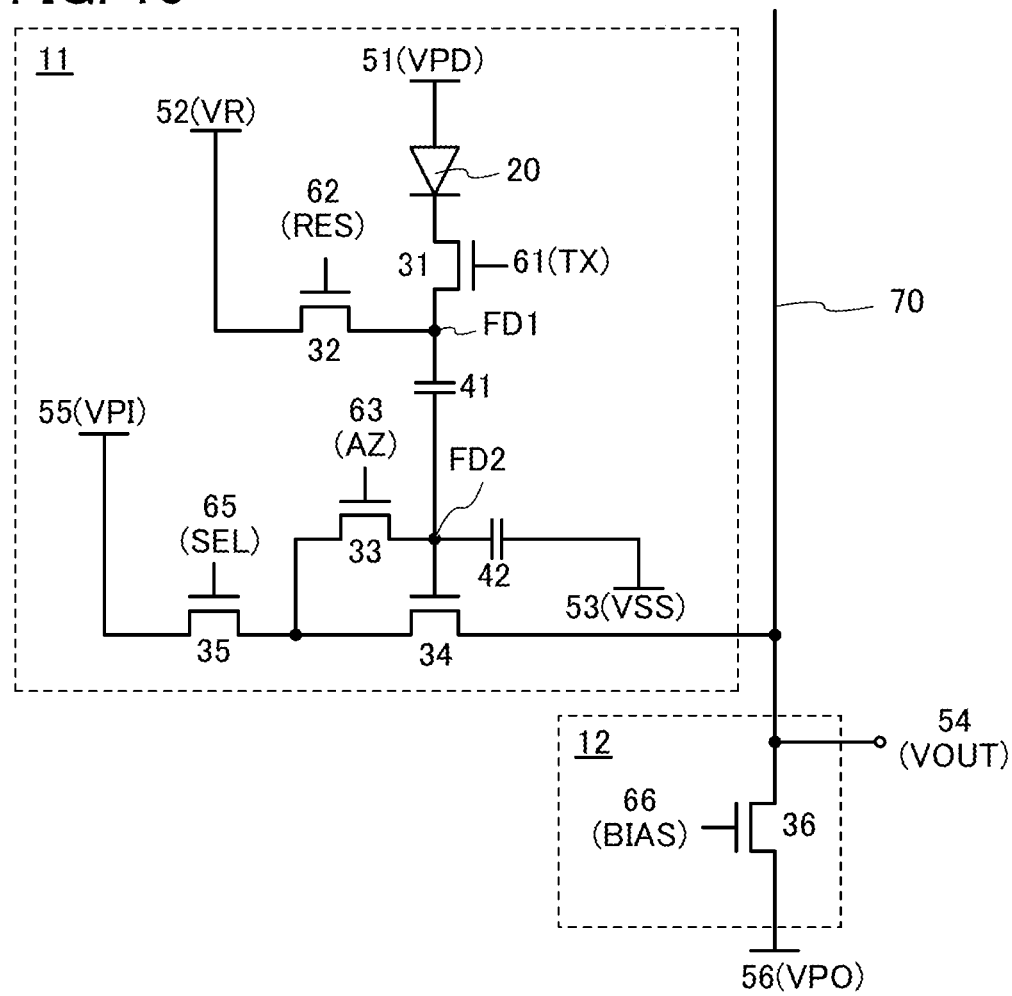
FIG. 10 illustrates a pixel circuit.

An imaging device of one embodiment of the present invention may have a structure illustrated in FIG. 10. The connection direction of the photoelectric conversion element 20 in the circuit 11 in FIG. 10 is opposite to that in FIG. 1. In this case, the wiring 51 (VPD) has a low potential and the wiring 52 (VR) has a high potential. Although the description of the circuit in FIG. 1 can be referred to for the compensation operation and the imaging operation in FIG. 10, as the illuminance of light delivered to the photoelectric conversion element 20 becomes higher, the potential of the node FD1 becomes lower. Thus, in the circuit configuration in FIG. 10, as the illuminance of light delivered to the photoelectric conversion element 20 becomes higher, a signal output from the output terminal (OUT) becomes smaller.

Figure 11A:
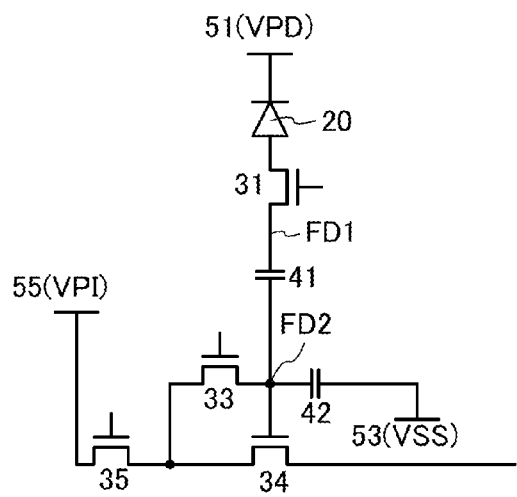
FIGS. 11A to 11C illustrate pixel circuits.

In FIG. 11A, the transistor 32 is omitted from the circuit 11 in FIG. 1. In that case, the wiring 51 (VPD) can be changed to either a low potential or a high potential. Reset operation of the node FD1 can be performed when the wiring 51 (VPD) has a low potential. In a predetermined period, when the wiring 51 (VPD) has a low potential, forward bias is applied to the photoelectric conversion element 20. Thus, the potential of the node FD1 can be set to the potential of the wiring 51 (VPD).

When imaging data is obtained, a high potential is applied to the wiring 51 (VPD). When the wiring 51 (VPD) has a high potential, reverse bias is applied to the photoelectric conversion element 20; thus, charge can be accumulated in the node FD1 from the wiring 51 (VPD) in accordance with the illuminance of light. In that case, as the illuminance of light delivered to the photoelectric conversion element 20 becomes higher, the potential of the node FD1 is increased. Therefore, in the circuit configurations in FIGS. 11A to 11C, as the illuminance of light delivered to the photoelectric conversion element 20 becomes higher, a signal output from the wiring 54 ($V_{OUT}$) becomes larger.

Figure 11B:
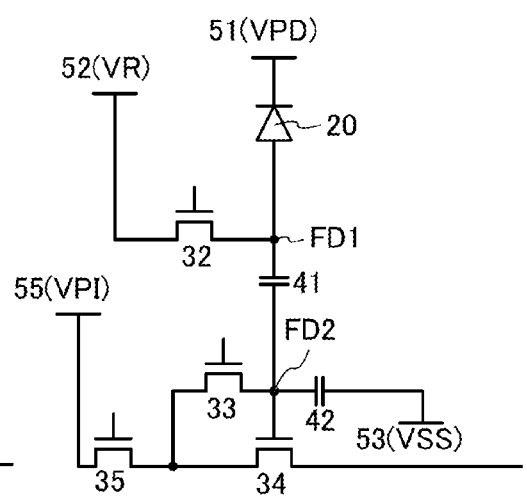
Figure 11C:
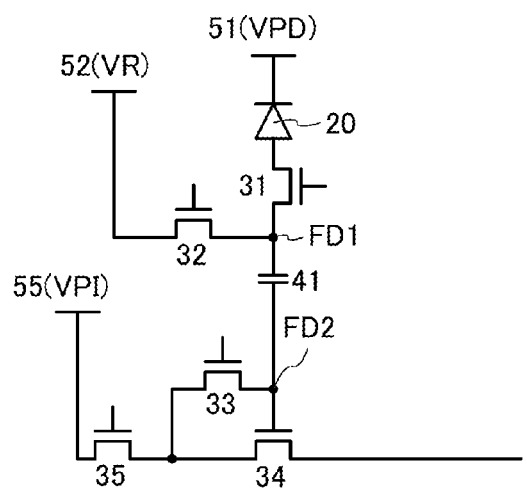

As another configuration of the circuit 11 in one embodiment of the present invention, the transistor 31 may be omitted as illustrated in FIG. 11B; alternatively, the capacitor 42 may be omitted as illustrated in FIG. 11C.

Figure 12A:
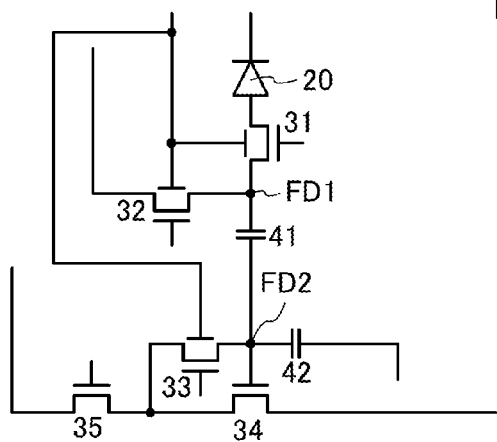
FIGS. 12A to 12F illustrate pixel circuits.
Figure 12B:
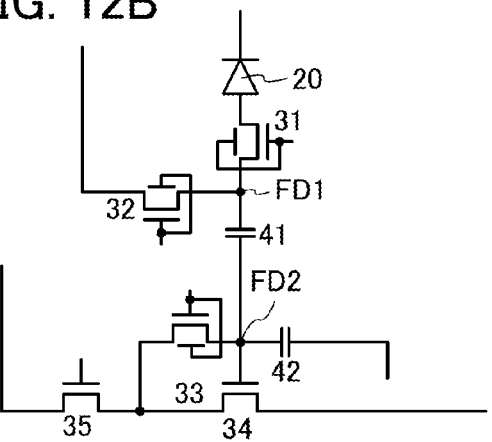
Figure 12C:
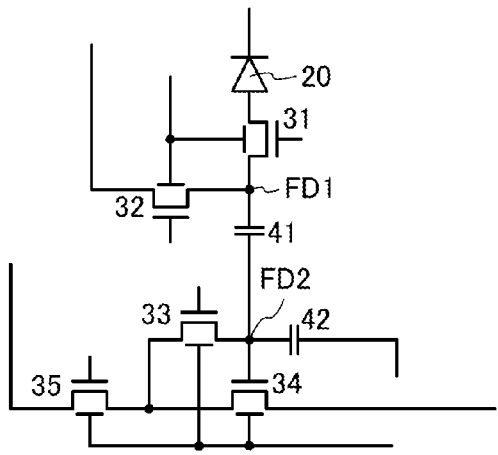
Figure 12D:
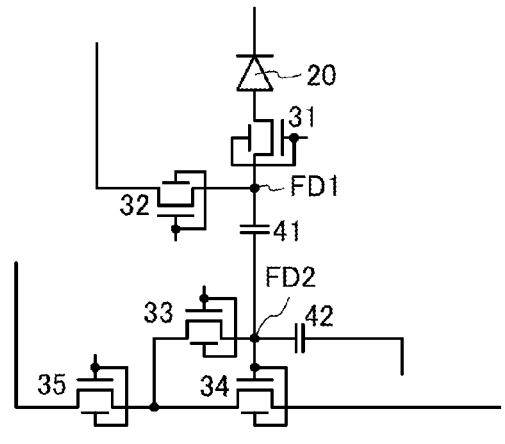

The transistors 31 to 33 in the circuit 11 may each have a back gate electrode as illustrated in FIGS. 12A and 12B. FIG. 12A illustrates a configuration of applying a constant potential to the back gate electrodes, which enables control of the threshold voltages. FIG. 12B illustrates a configuration in which the back gate electrodes are supplied with the same potential as their respective front gate electrodes, which enables an increase in on-state current. The transistors 31 to 35 may each include a back gate as illustrated in FIGS. 12C and 12D.

Figure 12E:
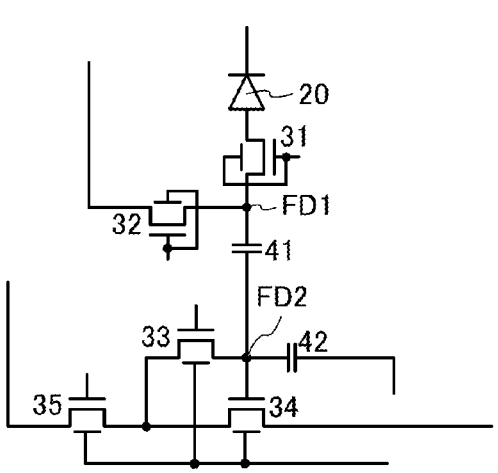
Figure 12F:
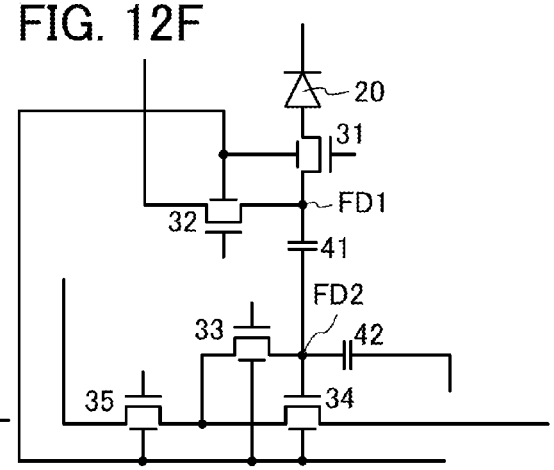

The circuit may have a configuration as illustrated in FIG. 12E where a configuration of applying the same potential to a front gate electrode and a back gate electrode, a configuration of applying a constant potential to a back gate electrode may be arbitrarily combined as necessary for the transistors in one circuit. Alternatively, a circuit configuration in which a back gate is not provided may be arbitrarily combined with any of the above configurations. Note that in the configuration of applying a constant potential to a back gate electrode, for example, all the back gate electrodes may be supplied with the same potential as illustrated in FIG. 12F.

Since an OS transistor has lower on-state current than a Si transistor, a back gate electrode is preferably provided. For example, since it is particularly preferable to use OS transistors as the transistors 31 to 33, back gate electrodes are preferably provided for the transistors 31 to 33.

Though not shown in figures, a back gate electrode may be provided for the transistor 36 in the circuit 12.

Note that part of wirings is omitted in FIGS. 11A to 11C and FIGS. 12A to 12F.

Figure 13:
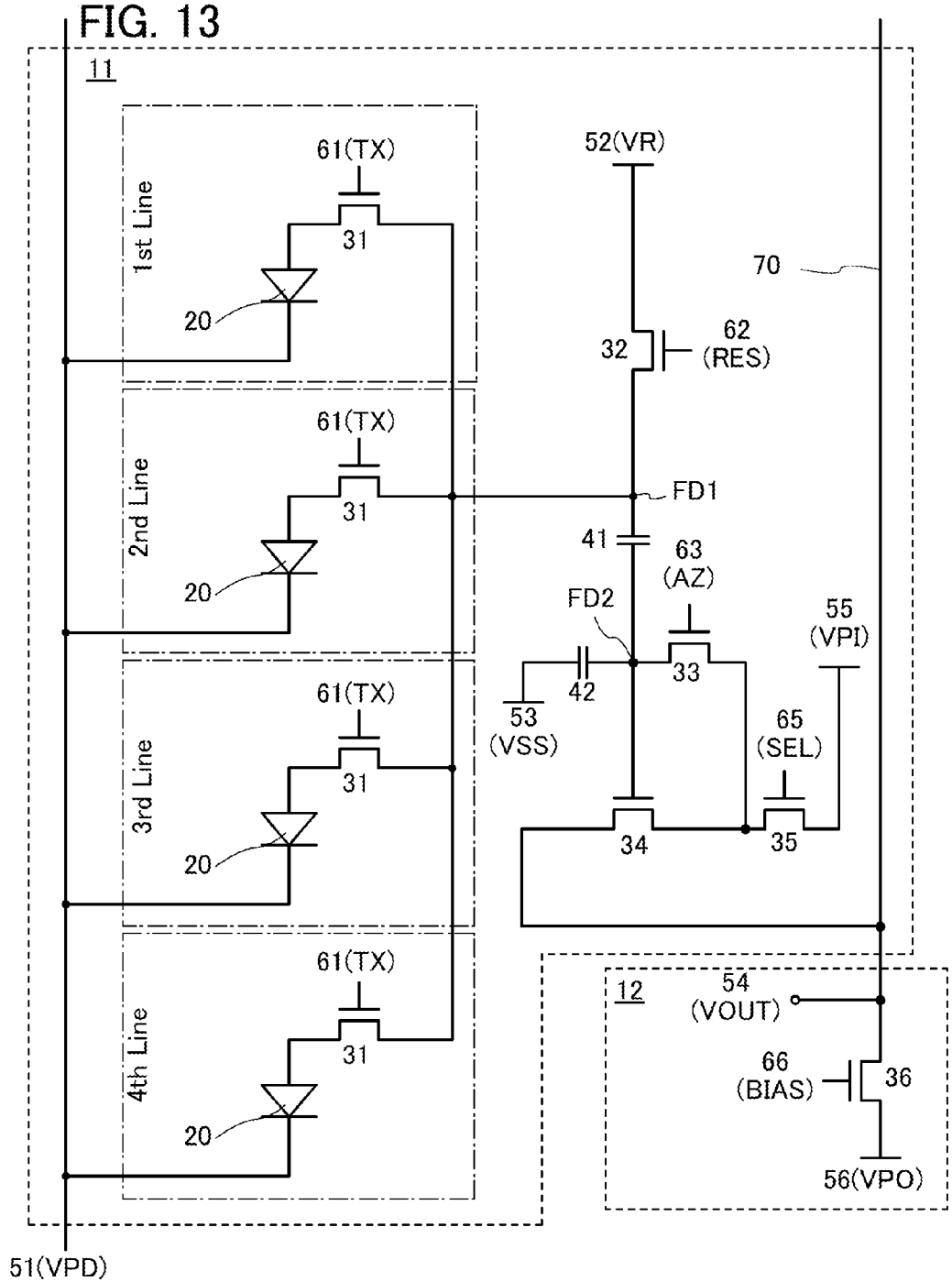
FIG. 13 illustrates a pixel circuit.

The circuit 11 may have a configuration in which the transistors 32 to 35 are shared among a plurality of pixels as illustrated in FIG. 13. FIG. 13 illustrates a structure in which the transistors 32 and 35 are shared among a plurality of pixels in a perpendicular direction; however, the transistors 32 and 35 may be shared among a plurality of pixels in a horizontal direction or in a horizontal and perpendicular direction. With such a structure, the number of transistors included in one pixel can be reduced.

Although FIG. 13 illustrates a structure in which the transistors 32 to 35 are shared among four pixels, the transistors 32 and 35 may be shared among two pixels, three pixels, or five or more pixels.

Such a structure can provide an imaging device that includes a highly integrated pixel array. According to one embodiment of the present invention, an imaging device capable of obtaining high-quality imaging data can be provided.

Note that any of the configurations in FIG. 1, FIG. 2, FIG. 10, and FIG. 13 can be optionally combined with one another.

In the one embodiment of the present invention, an output signal that does not depend on variation in the threshold voltage "Vth" of the transistor 34 capable of functioning as an amplifier transistor included in the pixel circuit can be obtained.

In Embodiment 1, one embodiment of the present invention has been described. Other embodiments of the present invention are described in Embodiments 2 to 8. Note that one embodiment of the present invention is not limited to the above examples. An example in which one embodiment of the present invention is applied to an imaging device is described, one embodiment of the present invention is not limited thereto. Depending on circumstances, one embodiment of the present invention is not necessarily applied to an imaging device. One embodiment of the present invention may be applied to a semiconductor device with an another function, for example. In one embodiment of the present invention, although examples in which a function of compensating variation or degradation in the electrical characteristics of a transistor is provided or compensation operation is performed are illustrated, one embodiment of the present invention is not limited thereto. Depending on circumstances or conditions, one embodiment of the present invention does not necessarily compensate variation or degradation in the electrical characteristics of a transistor.

This embodiment can be implemented in an appropriate combination with any of the structures described in the other embodiments.

Embodiment 2

In this embodiment, an example of a driving method of a pixel circuit that is different from that in Embodiment 1 is described.

The pixel circuit described in Embodiment 1 can perform first operation and second operation. In the first operation, the compensation of the threshold voltage "Vth" of the transistor 34 and imaging of an initial frame can be performed. In the second operation, imaging of a difference detection frame can be performed and data indicating a difference (difference data) between the initial frame and the difference detection frame can be output. In the second operation, difference data can be output without a comparison process or the like in an external circuit; thus, the pixel circuit can be applied to a low-power security camera or the like.

Next, the first operation and the second operation of the circuit in FIG. 1 is described with reference to a timing chart in FIG. 14. Note that the first operation is performed until time T8, and the second operation is performed after time T8.

First, the compensation operation of the threshold voltage "Vth" of the transistor 34 in the first operation is described. At time T1, a high potential is applied to each of the wiring 61 (TX), the wiring 62 (RES), the wiring 63 (AZ), and the wiring 65 (SEL) so that the transistors 31, 32, 33, and 35 are turned on. Furthermore, a low potential is applied to the wiring 66 (BIAS) so that the transistor 36 is turned off. Accordingly, the potential "VR" of the wiring 52 (VR) is held in the node FD1 and the potential "VPI" of the wiring 55 (VPI) is held in the node FD2.

At time T2, a high potential is applied to the wiring 66 (BIAS) so that the transistor 36 is turned on. Furthermore, a low potential is applied to the wiring 65 (SEL) so that the transistor 35 is turned off. Accordingly, the potential of the node FD2 is discharged. When the potential of the node FD2 changes from "VPI" to "VPO+Vth", the discharge is terminated, and the potential is held (see FIG. 5). Here, in order to change the potential of the node FD2 as quick as possible, the potential of the wiring 66 (BIAS) is preferably made as high as possible. For example, it is preferable to apply a potential "VH2" that is higher than a high potential "VH1" that is applied to the wiring 66 (BIAS) in the imaging operation described later. However, the potential "VH1" may be applied to the wiring 66 (BIAS). The above is the description of the compensation operation.

It is not necessary to perform the compensation operation by each imaging and imaging can be successively performed only by one compensation operation. Needless to say, the compensation operation may be performed before imaging, after imaging, at the time of power-on, at the time of power-off, or at given timing using a timer or the like.

Next, the imaging operation in the first operation is described. At time T3, a low potential is applied to the wiring 62 (RES) so that the transistor 32 is turned off. Accordingly, charge is accumulated in the node FD1 from the wiring 51 (VPD) through the photoelectric conversion element 20; thus, the potential of the node FD1 is increased. Note that although the potential of the wiring 66 (BIAS) is preferably decreased to "VH1", it may remain at the potential "VH2".

At time T4, a low potential is applied to the wiring 61 (TX) so that the transistor 31 is turned off. When the potential of the node FD1 is increased by "Va" by the operation at time T3 to time T4, the potential of the node FD1 is held at "VR+Va". Since the node FD2 is electrically connected to the wiring 56 (VPO), the potential of the node FD2 is not changed.

At time T5, a low potential is applied to the wiring 63 (AZ) so that the transistor 33 is turned off.

At time T6, a high potential is applied to the wiring 65 (SEL) so that the transistor 35 is turned on. A potential "VH1" is applied to the wiring 66 (BIAS). The potential "$V_{OUT}$" that is applied to the wiring 54 through the above steps can be calculated in a manner similar to those in Formulae 1 to 4 in Embodiment 1, and becomes "2VPO+Vth'−VH1". In other words, the potential "$V_{OUT}$" does not depend on the threshold voltage "Vth" of the transistor 34.

Thus, a signal that does not include variation in the threshold voltage "Vth" of the transistor 34 can be output to the wiring 54 ($V_{OUT}$).

At time T7, a low potential is applied to the wiring 65 (SEL) so that the transistor 35 is turned off. Through the above steps, the imaging operation in the first operation is terminated.

Next, the second operation will be described. At time T8, high potentials are applied to the wiring 61 (TX) and the wiring 62 (RES) so that the transistors 31 and 32 are turned on. Accordingly, the potential of the node FD1 is reset to the potential "VR" that is the potential of the wiring 52 (VR). That is, the potential of the node FD1 is decreased by "Va". The potential of the node FD2 is also decreased by "Va" owing to the capacitive coupling of the node FD1 and the node FD2. That is, the potential of the node FD2 changes from "VPO+Vth" to "VPO+Vth−Va".

As described above, it can be said that "Va" is the potential that reflects illuminance of an initial frame.

At time T9, a low potential is applied to the wiring 62 (RES) so that the transistor 32 is turned off. Thus, charge is accumulated in the node FD1 from the wiring 51 (VPD) through the photoelectric conversion element 20 and the potential of the node FD1 is increased.

At time T10, a low potential is applied to the wiring 61 (TX) so that the transistor 31 is turned off. If the potential of the node FD1 is increased by "Vb" at time T9 to time T10, the potential of the node FD1 is held at "VR+Vb" at time T10. Furthermore, the potential of the node FD2 is also increased by "Vb" owing to the capacitive coupling of the node FD1 and the node FD2. That is, the potential of the node FD2 changes from "VPO+Vth−Va" to "VPO+Vth+Vb−Va".

As described above, it can be said that "Vb" is the potential that reflects illuminance of a current frame.

At time T11, a high potential is applied to the wiring 65 (SEL) so that the transistor 35 is turned on. Furthermore, a potential "VH1" is applied to the wiring 66 (BIAS). The potential "$V_{OUT}$" that is applied to the wiring 54 ($V_{OUT}$) through the above steps can be calculated in a manner similar to those in Formulae 1 to 4 in Embodiment 1, and becomes "2VPO+Vb−Va+Vth'−VH1". In other words, the potential "$V_{OUT}$" does not depend on the threshold voltage "Vth" of the transistor 34.

Thus, a signal that does not include variation in the threshold voltage "Vth" of the transistor 34 can be output to the wiring 54 ($V_{OUT}$).

Furthermore, the potential of the wiring 54 ($V_{OUT}$) contains "Vb−Va". As described above, "Vb" is the potential that reflects illuminance of the difference detection frame, and "Va" is the potential that reflects illuminance of the initial frame. Thus, the second operation in which difference data is output from the wiring 54 ($V_{OUT}$) can be performed.

At time T12, a low potential is applied to the wiring 65 (SEL) so that the transistor 35 is turned off. Through the above steps, the second operation is terminated.

Note that at time T1 or time T2, a low potential may be applied to the wiring 61 (TX) so that the transistor 31 is turned off. For example, the transistor 31 may be turned off at time T1 and turned on at time T2 by application of a low potential and a high potential to the wiring 61 (TX) at time T1 and time T2, respectively. However, at time T3, the transistor 32 needs to be turned off while the transistor 31 is turned on; thus, the transistor 31 is preferably turned on at time T2.

Note that at time T1 to time T2, at time T3 to time T6, at time T7 to time T11, and time T12, a given potential can be applied to the wiring 66 (BIAS). For example, at time T1 to time T2, at time T3 to time T12, a potential "VH1" may be applied. Alternatively, at time T1 to time T2, at time T3 to time T6, at time T7 to time T11, and time T12, a low potential may be applied. Further alternatively, for example, at time T1 to time T6, a potential "VH2" may be applied.

This embodiment can be implemented in an appropriate combination with any of the structures described in the other embodiments.

Embodiment 3

In this embodiment, specific structure examples of the imaging device in one embodiment of the present invention are described below with reference to drawings.

Figure 15A:
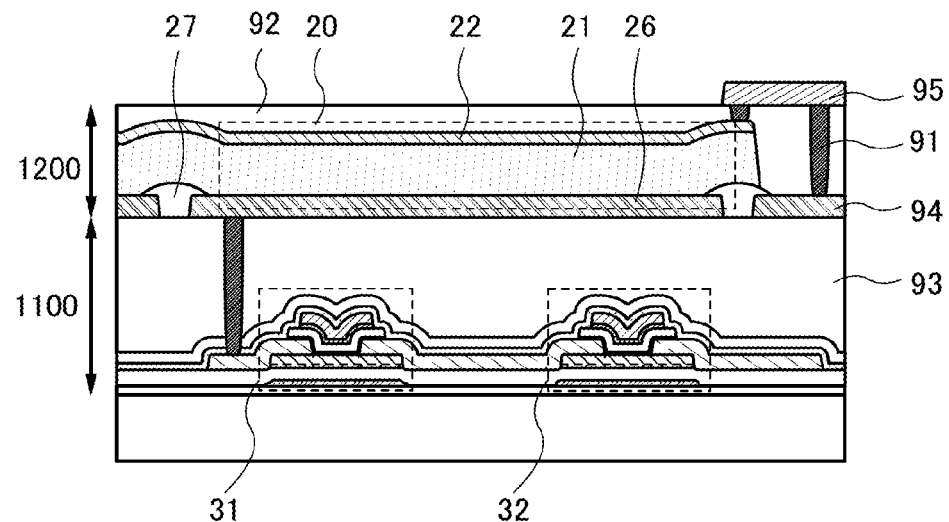
FIGS. 15A to 15C are cross-sectional views each illustrating a structure of an imaging device.

FIG. 15A is an example of a cross-sectional view of the imaging device in one embodiment of the present invention and illustrates an example of specific connection between the photoelectric conversion element 20 and the transistors 31 and 32 which are included in the circuit 11 in FIG. 1. Note that FIG. 15A does not illustrate the transistors 33 to 35. The imaging device includes a layer 1100 including the transistors 31 to 35 and a layer 1200 including the photoelectric conversion element 20.

Although the wirings, the electrodes, and conductors 91 are illustrated as independent components in cross-sectional views in this embodiment, some of them are provided as one component in some cases when they are electrically connected to each other. Moreover, the structure in which the gate electrodes, the source electrodes, or the drain electrodes of the transistors are connected to wirings through the conductors 91 is only an example, and there is a case in which the gate electrodes, the source electrodes, and the drain electrodes of the transistors function as wirings.

Insulating layers 92, 93, and the like each functioning as a protective film, an interlayer insulating layer, or a planarization film are provided over the components. For example, an inorganic insulating film such as a silicon oxide film or a silicon oxynitride film can be used as the insulating layers 92, and 93, and the like. Alternatively, an organic insulating film such as an acrylic resin or a polyimide resin may be used. Top surfaces of the insulating layers 92 and 93 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. Furthermore, a layer that is not illustrated in the drawing is included in the stacked-layer structure. Furthermore, one or more of the layers illustrated in the drawing are not included in some cases.

Figure 15B:
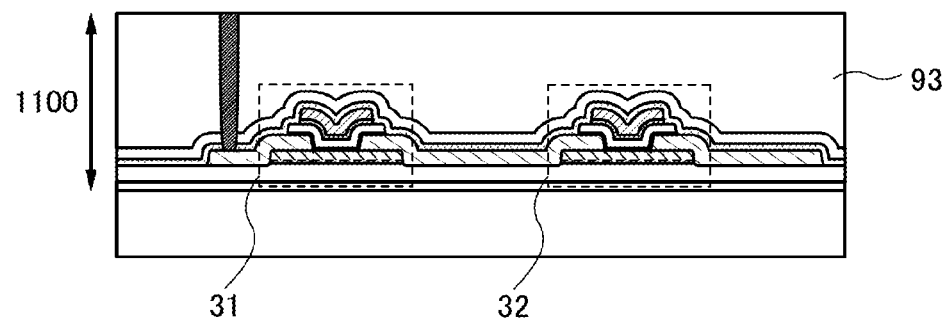
Figure 15C:
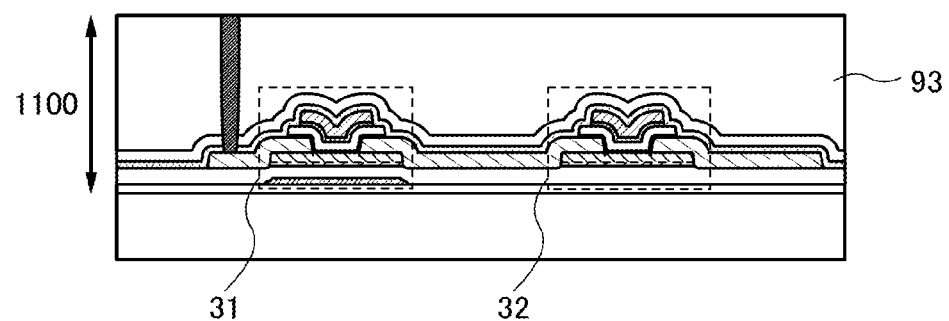

Note that although each transistor includes a back gate electrode in FIG. 15A, as illustrated in FIG. 15B, each transistor does not necessarily include a back gate electrode. Alternatively, as illustrated in FIG. 15C, one or more transistors, for example, only the transistor 31 may include a back gate electrode. The back gate electrode might be electrically connected to a corresponding front gate electrode of the transistor. Alternatively, different fixed potentials might be supplied to the back gate electrode and the front gate electrode. Note that these descriptions on the existence of back gate electrodes can be applied to other imaging devices described in this embodiment.

A variety of elements can be used as the photoelectric conversion element 20 provided in the layer 1200. FIG. 15A illustrates the photoelectric conversion element 20 including a selenium-based material for a photoelectric conversion layer 21. The photoelectric conversion element 20 including a selenium-based material has high external quantum efficiency with respect to visible light. In the photoelectric conversion element, a highly sensitive sensor in which the amount of amplification of electrons with respect to the amount of incident light by an avalanche phenomenon is large can be obtained. Furthermore, the selenium-based material has a high light absorption coefficient, which leads to an advantage that the photoelectric conversion layer 21 is easily formed to be thin.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient than those of amorphous selenium.

Furthermore, the photoelectric conversion layer 21 may be a layer including a compound of copper, indium, and selenium (CIS). Alternatively, a layer including a compound of copper, indium, gallium, and selenium (CIGS) may be used. With the CIS layer or the CIGS layer, a photoelectric conversion element that can utilize an avalanche phenomenon in a manner similar to that of a single layer of selenium can be formed.

In the photoelectric conversion element 20 including a selenium-based material, for example, the photoelectric conversion layer 21 can be provided between a light-transmitting conductive layer 22 and the electrode 26 formed using a metal material or the like. CIS and CIGS are p-type semiconductors and may be formed in contact with an n-type semiconductor such as cadmium sulfide or zinc sulfide to form a junction.

Comparatively high voltage (e.g., 10 V or higher) is preferably applied to the photoelectric conversion element to cause the avalanche phenomenon. Since the OS transistor has higher drain breakdown voltage than the Si transistor, comparatively high voltage can be easily applied to the photoelectric conversion element. Therefore, by combination of the OS transistor with high drain breakdown voltage and the photoelectric conversion element in which the selenium-based material is used for the photoelectric conversion layer, a highly sensitive, highly reliable imaging device can be obtained.

Figure 16A:
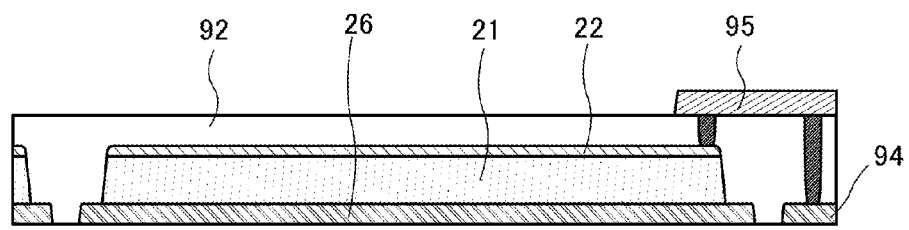
FIGS. 16A to 16D are cross-sectional views each illustrating connection of a photoelectric conversion element.
Figure 16B:
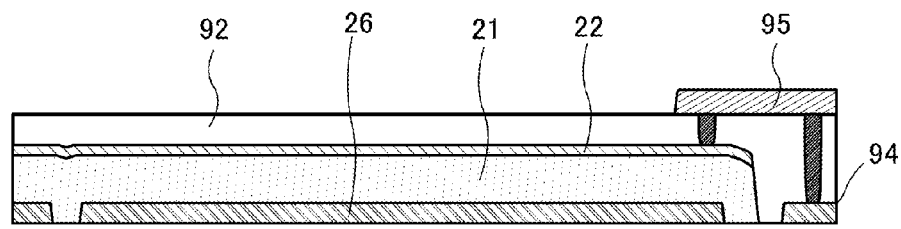
Figure 16C:
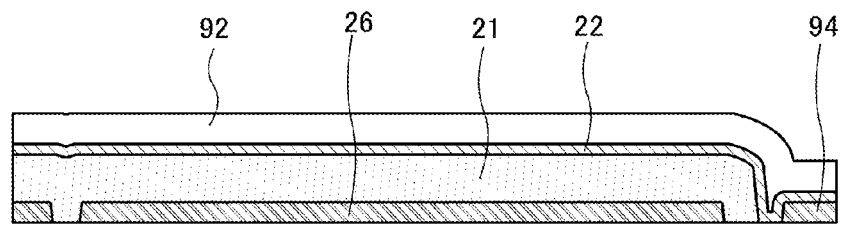
Figure 16D:
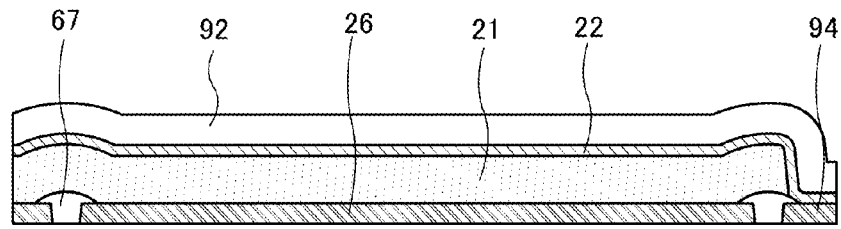

Although the photoelectric conversion layer 21 and the light-transmitting conductive layer 22 are not divided between circuits in FIG. 15A, the photoelectric conversion layer 21 and the light-transmitting conductive layer 22 may be divided between circuits as illustrated in FIG. 16A. Furthermore, a partition wall 27 formed using an insulator is preferably provided in a region between pixels where the electrode 26 is not provided so as not to generate a crack in the photoelectric conversion layer 21 and the light-transmitting conductive layer 22; however, the partition wall 27 is not necessarily provided as illustrated in FIG. 16B. Although the light-transmitting conductive layer 22 and the wiring 94 are connected to each other through a wiring 95 and the conductor 91 in FIG. 15A, the light-transmitting conductive layer 22 and the wiring 94 may be in direct contact with each other as in FIGS. 16C and 16D.

Figure 17A:
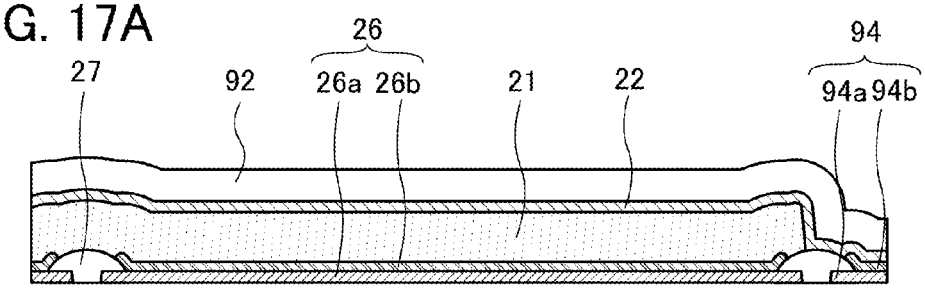
FIGS. 17A and 17B are cross-sectional views each illustrating connection of a photoelectric conversion element.

The electrode 26, the wiring 94, and the like may each be a multilayer. For example, as illustrated in FIG. 17A, the electrode 26 can include two conductive layers 26a and 26b and the wiring 94 can include two conductive layers 94a and 94b. In the structure of FIG. 17A, for example, the conductive layers 26a and 94a may be made of a low-resistance metal or the like, and the conductive layer 26b may be made of a metal or the like that exhibits an excellent contact property with the photoelectric conversion layer 21. Such a structure improves the electrical properties of the photoelectric conversion element. Furthermore, even when the conductive layer 94a contains a metal that causes electrolytic corrosion, which occurs when some kinds of metal are in contact with the light-transmitting conductive layer 22, electrolytic corrosion can be prevented because the conductive layer 94b is placed between the conductive layer 94a and the light-transmitting conductive layer 22.

The conductive layers 26a and 94a can be formed using, for example, aluminum, titanium, or a stack of titanium, aluminum, and titanium that are layered in that order. The conductive layers 26b and 94b can be formed using molybdenum, tungsten, or the like, for example.

Figure 17B:
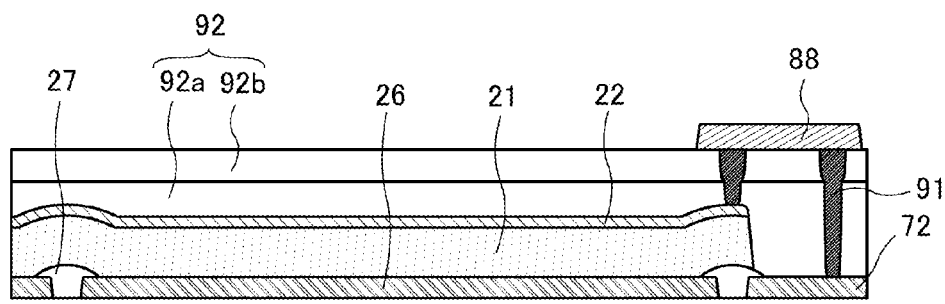

The insulating layer 92 and the like may each be a multilayer. For example, as illustrated in FIG. 17B, the conductor 91 has a difference in level in the case where the insulating layer 92 includes insulating layers 92a and 92b that have different etching rates. In the case where another insulating layer used as an interlayer insulating layer or a planarization film is a multilayer, the conductor 91 also has a difference in level. Although the insulating layer 92 is formed using two layers here, the insulating layer 92 and another insulating layer may each be formed using three or more layers.

Note that the partition wall 27 can be formed using an inorganic insulator, an insulating organic resin, or the like. The partition wall 27 may be colored black or the like in order to shield the transistors and the like from light and/or to determine the area of a light-receiving portion in each pixel.

Alternatively, a PIN diode element or the like formed using an amorphous silicon film, a microcrystalline silicon film, or the like may be used as the photoelectric conversion element 20.

Figure 18:
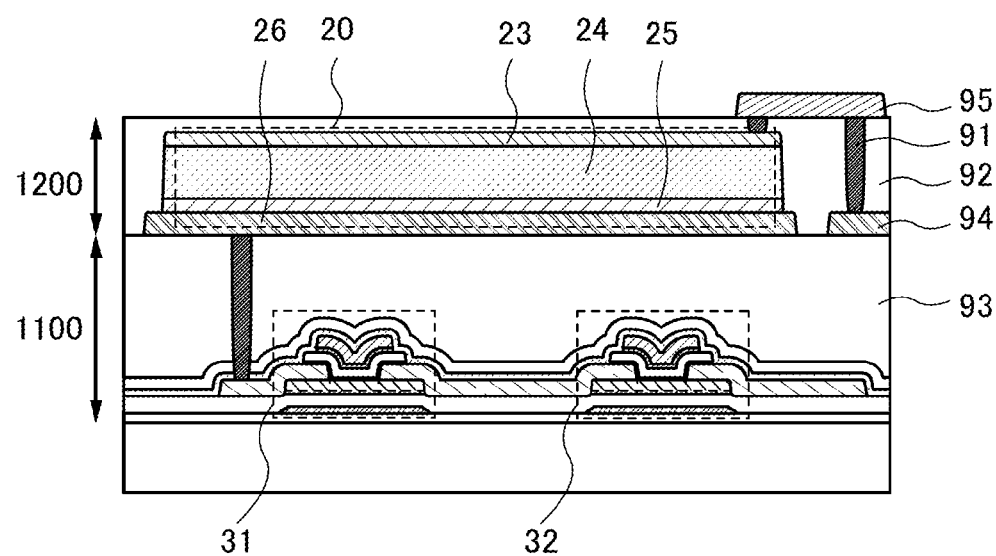
FIG. 18 is a cross-sectional view illustrating a structure of an imaging device.

FIG. 18 illustrates an example in which a thin film PIN photodiode is used as the photoelectric conversion element 20. In the photodiode, a p-type semiconductor layer 25, an i-type semiconductor layer 24, and an n-type semiconductor layer 23 are stacked in that order. The i-type semiconductor layer 24 is preferably formed using amorphous silicon. The n-type semiconductor layer 23 and the p-type semiconductor layer 25 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element 20 in FIG. 18, the p-type semiconductor layer 25 is electrically connected to the electrode 26. Furthermore, the n-type semiconductor layer 23 is electrically connected to the wiring 94 through the conductor 91.

Furthermore, any of examples illustrated in FIGS. 19A to 19F may be applied to the structure of the photoelectric conversion element 20 having a configuration of a PIN thin film photodiode and the connection between the photoelectric conversion element 20 and the wirings. Note that the structure of the photoelectric conversion element 20 and the connection between the photoelectric conversion element 20 and the wirings are not limited thereto, and other configurations may be applied.

Figure 19A:
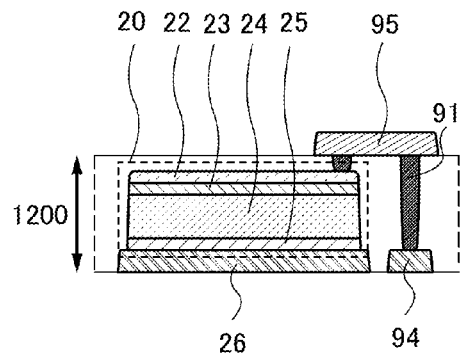
FIGS. 19A to 19F are cross-sectional views each illustrating connection of a photoelectric conversion element.

FIG. 19A illustrates a structure provided with the light-transmitting conductive layer 22 in contact with the n-type semiconductor layer 23 of the photoelectric conversion element 20. The light-transmitting conductive layer 22 functions as an electrode and can increase the output current of the photoelectric conversion element 20.

For the light-transmitting conductive layer 22, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 22 is not limited to a single layer, and may be a stacked layer of different films.

Figure 19B:
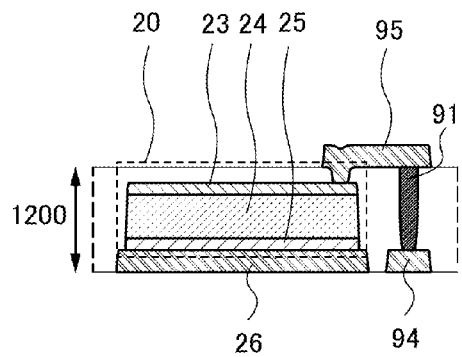

FIG. 19B illustrates a structure in which the n-type semiconductor layer 23 of the photoelectric conversion element 20 is directly connected to the wiring 95.

Figure 19C:
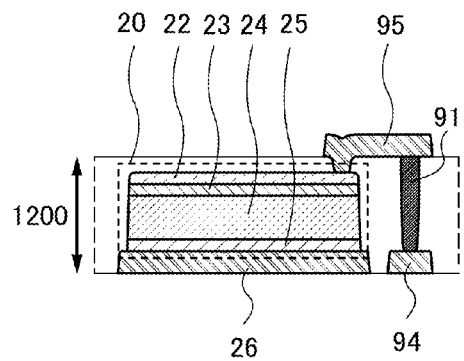

FIG. 19C illustrates a structure in which the light-transmitting conductive layer 22 in contact with the n-type semiconductor layer 23 of the photoelectric conversion element 20 is provided, and the wiring 95 is electrically connected to the light-transmitting conductive layer 22.

Figure 19D:
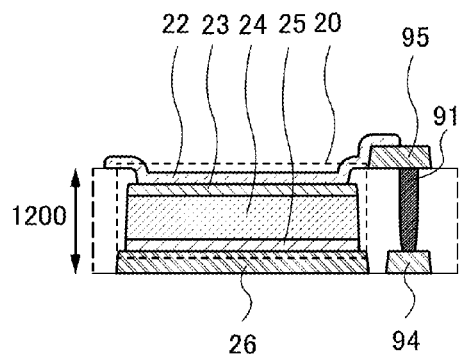

FIG. 19D illustrates a structure in which an opening exposing the n-type semiconductor layer 23 is provided in an insulating layer covering the photoelectric conversion element 20, and the light-transmitting conductive layer 22 that covers the opening is electrically connected to the wiring 95.

Figure 19E:
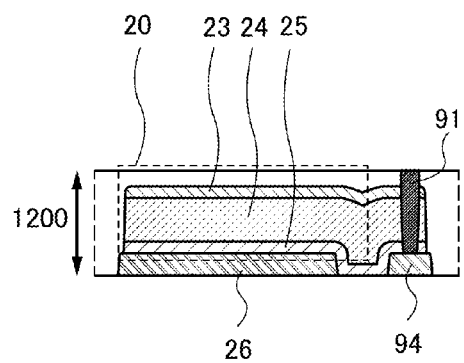

FIG. 19E illustrates a structure provided with the conductor 91 that penetrates the photoelectric conversion element 20. In the structure, the wiring 94 is electrically connected to the n-type semiconductor layer 23 through the conductor 91. Note that in the drawing, the wiring 94 appears to be electrically connected to the electrode 26 through the p-type semiconductor layer 25. However, resistance in the lateral direction of the p-type semiconductor layer 25 is high; therefore, when an appropriate distance is provided between the wiring 94 and the electrode 26, the resistance between the wiring 94 and the electrode 26 is extremely high. Thus, the photoelectric conversion element 20 can have diode characteristics without a short circuit between the anode and the cathode. Note that two or more conductors 91 that are electrically connected to the n-type semiconductor layer 23 may be provided.

Figure 19F:
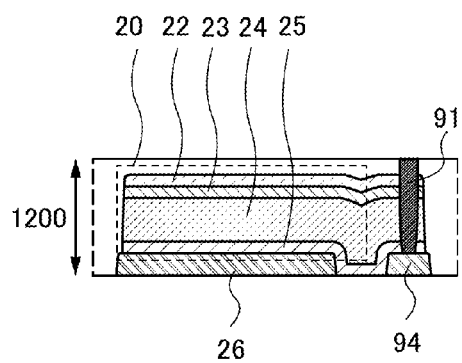

FIG. 19F illustrates a structure in which the photoelectric conversion element 20 in FIG. 19E is provided with the light-transmitting conductive layer 22 in contact with the n-type semiconductor layer 23.

Note that each of the photoelectric conversion elements 20 illustrated in FIGS. 19D to 19F has an advantage of having a large light-receiving area because wirings and the like do not overlap a light-receiving region.

Figure 20:
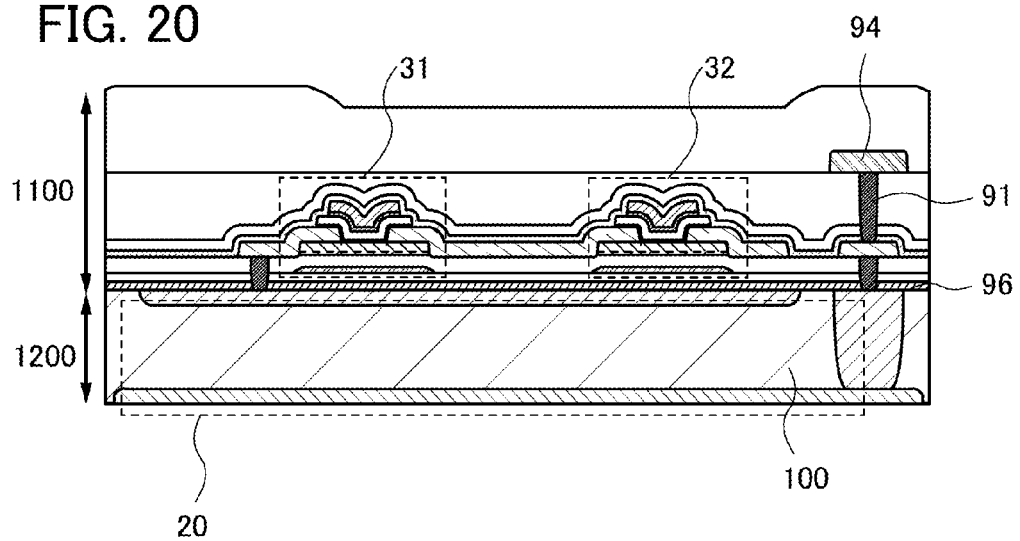
FIG. 20 is a cross-sectional view illustrating a structure of an imaging device.

Alternatively, as illustrated in FIG. 20, the photoelectric conversion element 20 can be a photodiode including a silicon substrate 100 as a photoelectric conversion layer.

The photoelectric conversion element 20 formed using the selenium-based material, amorphous silicon, or the like can be formed through general semiconductor manufacturing processes such as a deposition process, a lithography process, and an etching process. Furthermore, the resistance of the selenium-based material is high; thus, a structure in which the photoelectric conversion layer 21 is not divided between the circuits can be employed as illustrated in FIG. 15A. Therefore, the imaging device in one embodiment of the present invention can be manufactured with a high yield at low cost. Meanwhile, to form a photodiode including the silicon substrate 100 as the photoelectric conversion layer, processes with high difficulty, such as a polishing process and a bonding process, are needed.

Figure 21A:
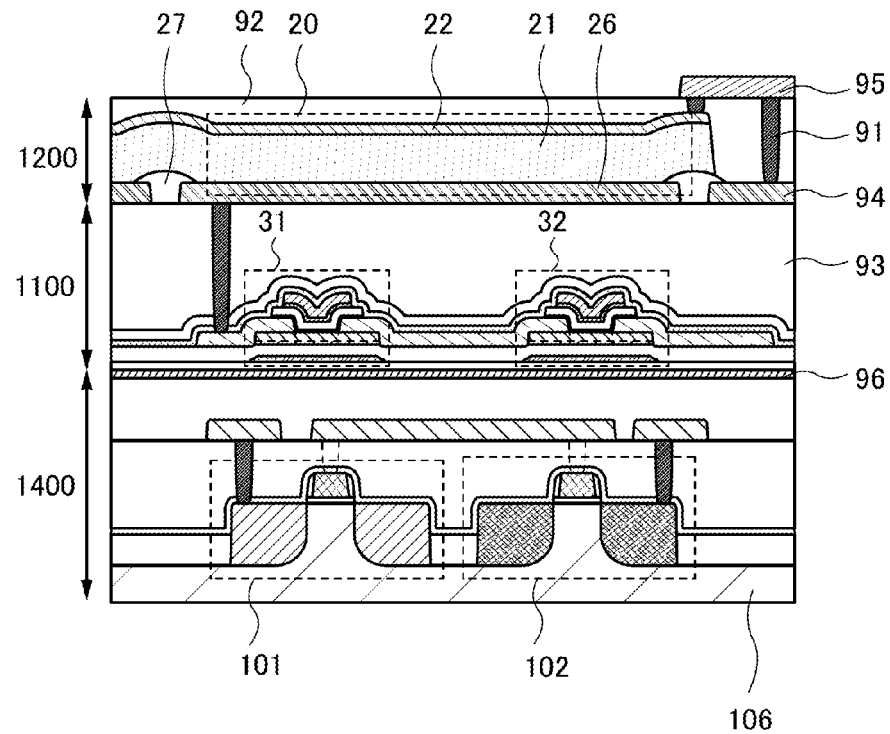
FIGS. 21A to 21C are cross-sectional views and a circuit diagram illustrating a structure of an imaging device.

Furthermore, the imaging device of one embodiment of the present invention may have a multi-layer structure including the silicon substrate 106 on which the circuits are formed. For example, as illustrated in FIG. 21A, the pixel circuit may overlap with a layer 1400 that includes transistors 101 and 102 whose active regions are formed in the silicon substrate 106. Note that FIG. 21B corresponds to a cross section of the transistor in the channel width direction The circuit formed in the silicon substrate 106 is capable of reading a signal output from the pixel circuit and converting the signal; for example, the circuit can include a CMOS inverter as illustrated in the circuit diagram in FIG. 21C. A gate electrode of the transistor 101 (n-channel transistor) is electrically connected to a gate electrode of the transistor 102 (p-channel transistor). One of a source electrode and a drain electrode of one transistor is electrically connected to one of a source electrode and a drain electrode of the other transistor. The other of the source electrode and the drain electrode of the one transistor is electrically connected to a wiring, and the other of the source electrode and the drain electrode of the other transistor is electrically connected to another wiring.

Furthermore, the silicon substrate 106 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 20 and FIG. 21A, an insulating layer 96 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 101 and 102. Therefore, the hydrogen has an effect of improving the reliability of the transistors 101 and 102. Meanwhile, hydrogen in insulating layers which are provided in the vicinity of the oxide semiconductor layer that is the active layer of the transistor 31 or the like causes generation of carriers in the oxide semiconductor layer. Therefore, the hydrogen may reduce the reliability of the transistor 31 or the like. Consequently, in the case where one layer including the Si transistor and the other layer including the OS transistor are stacked, it is preferable that the insulating layer 96 having a function of preventing diffusion of hydrogen be provided between the layers. Hydrogen is confined in the one layer by the insulating layer 96, whereby the reliability of the transistors 101 and 102 can be improved. Furthermore, diffusion of hydrogen from the one layer to the other layer is inhibited, increasing also the reliability of the transistor 31 or the like.

The insulating layer 96 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 21A, a circuit (e.g., a driver circuit) formed using the silicon substrate 106, the transistor 31 or the like, and the photoelectric conversion element 20 can overlap with each other; thus, the integration degree of pixels can be increased. In other words, the resolution of the imaging device can be increased. For example, the imaging device is suitable for an imaging device whose number of pixels is 4K2K, 8K4K, 16K8K, or the like. Note that since the 8K4K imaging device includes thirty-three million pixels, it can also be referred to as "33M". Furthermore, for example, a structure may be employed in which the transistors 34 and 35 in the circuit 11 are Si transistors, and have regions overlapping with the transistors 31 to 33 and the photoelectric conversion element 20. In that case, the transistors 31 to 33 are OS transistors.

In the imaging device in FIG. 21A, no photoelectric conversion element is provided on the silicon substrate 106. Therefore, an optical path for the photoelectric conversion element 20 can be secured without being influenced by the transistors or wirings, and a pixel with a high aperture ratio can be formed.

Figure 21B:
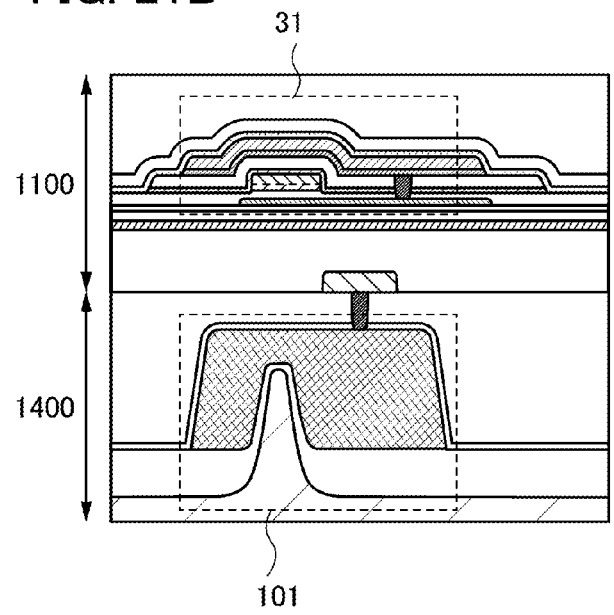
Figure 21C:
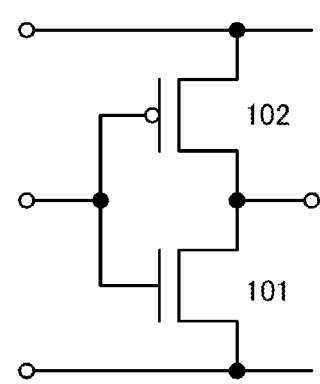
Figure 22A:
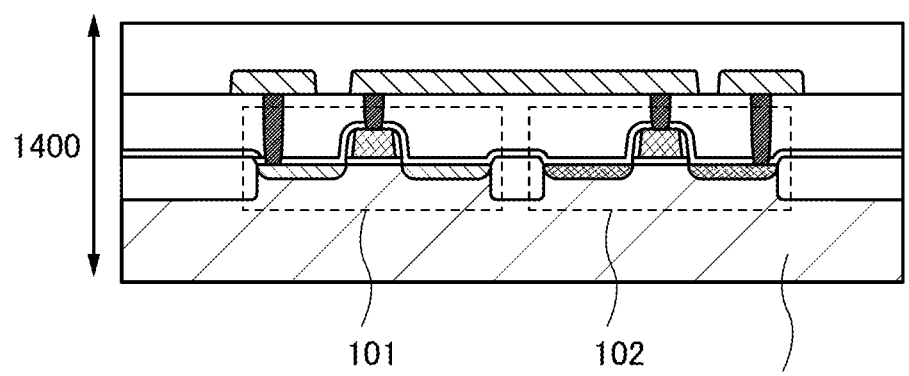
FIGS. 22A and 22B are cross-sectional views each illustrating a structure of an imaging device.
Figure 22B:
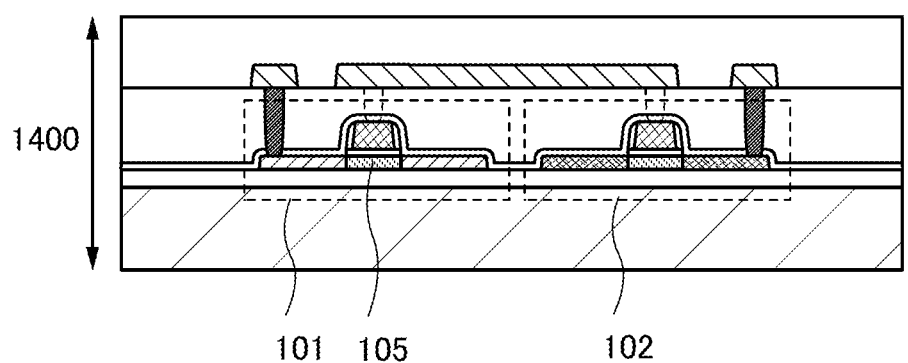

Note that although in FIGS. 21A and 21B, Si transistors are FIN-type transistors, they may be planar-type transistors as illustrated in FIG. 22A. Alternatively, as illustrated in FIG. 22B, the transistors each may be a transistor whose active layer 105 is formed using a silicon thin film. The active layer 105 can be formed using polycrystalline silicon or single crystal silicon of a silicon-on-insulator (SOI) structure.

Figure 23:
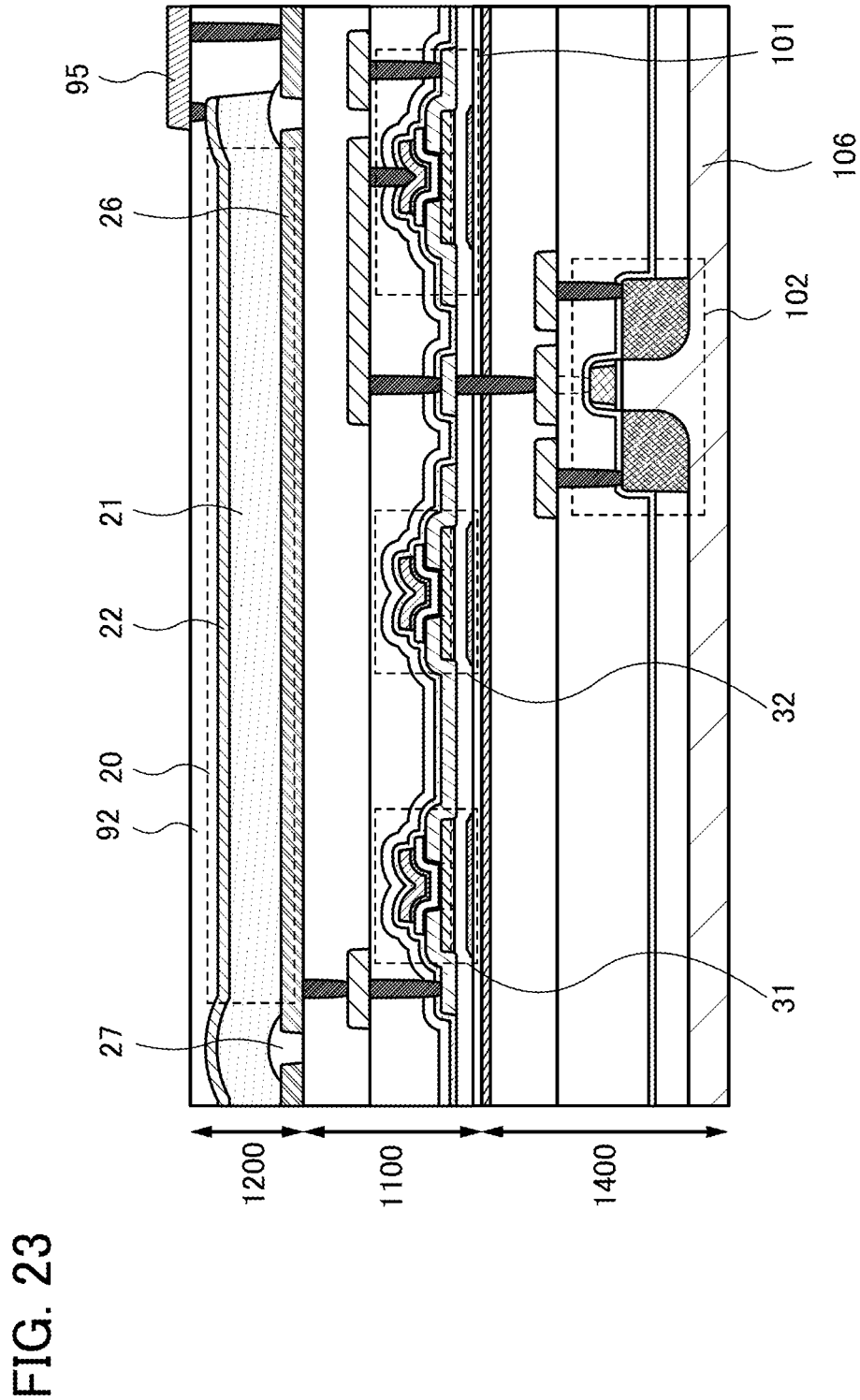
FIG. 23 is a cross-sectional view illustrating a structure of an imaging device.

The imaging device in one embodiment of the present invention can also have a structure illustrated in FIG. 23.

The imaging device in FIG. 23 is a modification example of the imaging device in FIG. 21A. A CMOS inverter is formed using an OS transistor and a Si transistor.

Here, the transistor 102 is a p-channel Si transistor provided in the layer 1400, and the transistor 101 is an n-channel OS transistor provided in the layer 1100. When only the p-channel transistor is provided on the silicon substrate 106, a step of forming a well, an n-type impurity layer, or the like can be skipped.

Although selenium or the like is used for the photoelectric conversion element 20 in the imaging device in FIG. 23, a PIN thin film photodiode may be used as in FIG. 18.

In the imaging device in FIG. 23, the transistor 101 can be formed in the same process as the transistors 31 and 32 formed in the layer 1100. Thus, the manufacturing process of the imaging device can be simplified.

Figure 24:
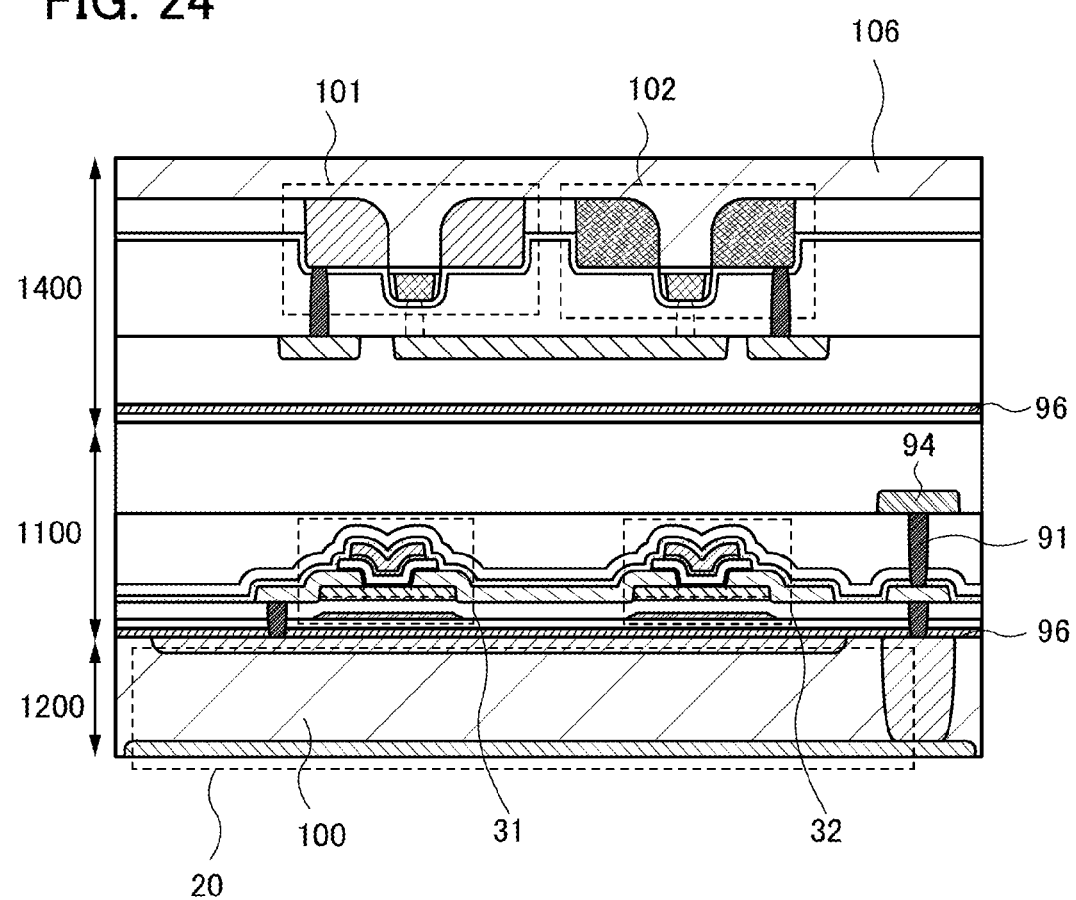
FIG. 24 is a cross-sectional view illustrating a structure of an imaging device.

The imaging device of one embodiment of the present invention may have the following structure: a pixel including a photodiode formed over the silicon substrate 100 and an OS transistor formed thereover is attached to the silicon substrate 106 on which circuits are formed as illustrated in FIG. 24. With such a structure, the effective area of the photodiode formed over the silicon substrate 100 can be easily improved. Furthermore, a high-performance semiconductor device can be provided by high integration of the circuits including miniaturized Si transistors in the silicon substrate 106.

Figure 25:
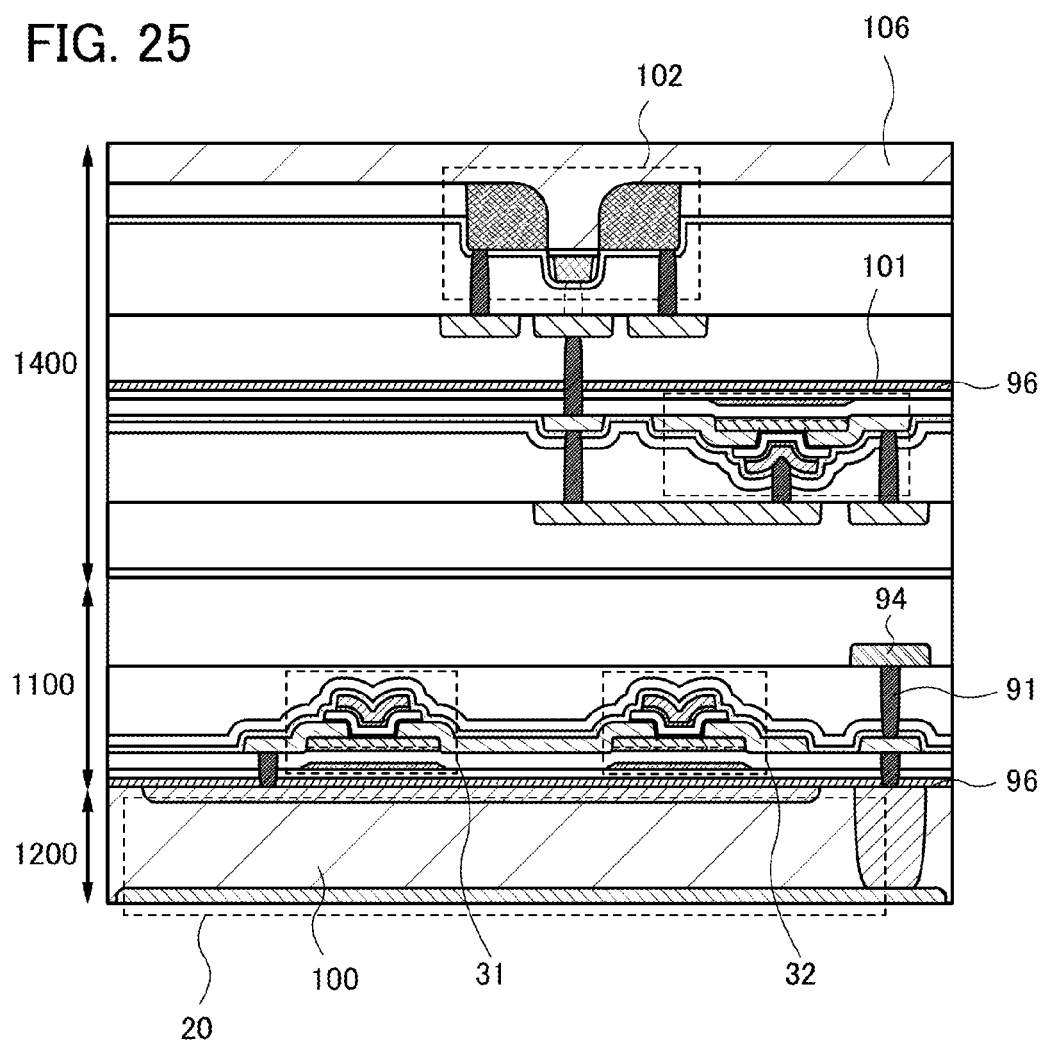
FIG. 25 is a cross-sectional view illustrating a structure of an imaging device.
Figure 26:
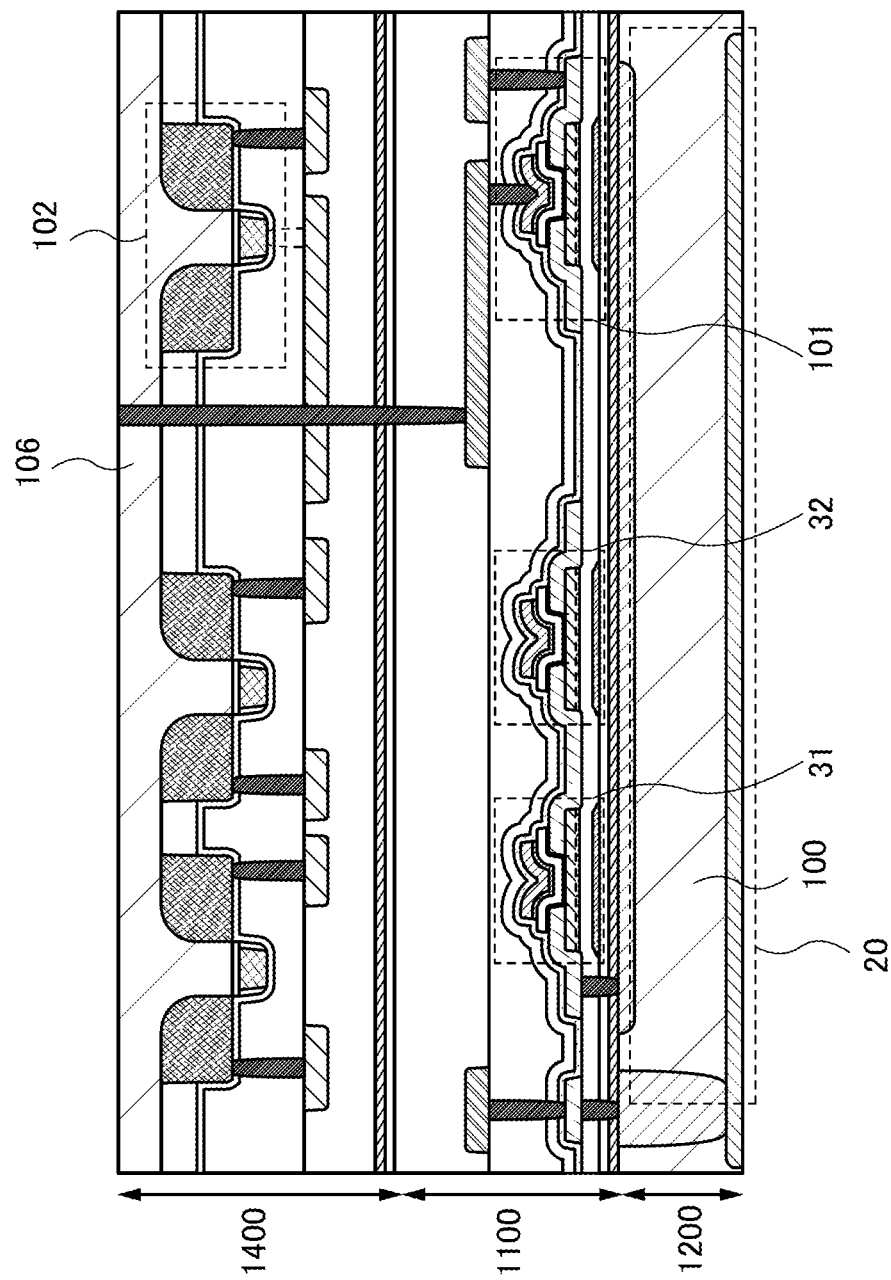
FIG. 26 is a cross-sectional view illustrating a structure of an imaging device.

Furthermore, as a modification example of FIG. 24, as illustrated in FIG. 25 and FIG. 26, the circuit may be configured to include an OS transistor and a Si transistor. With such a structure, the effective area of the photodiode formed over the silicon substrate 100 can be easily improved. Furthermore, a high-performance semiconductor device can be provided by high integration of the circuits including miniaturized Si transistors in the silicon substrate 106.

In the case of the structure in FIG. 25, a CMOS circuit can be formed using the OS transistor and the Si transistor over the silicon substrate 106. Since the OS transistor has extremely low off-state current, the CMOS circuit with extremely low leakage current can be formed.

In the case of the structure in FIG. 26, a CMOS circuit can be formed using the OS transistor over the silicon substrate 100 and the Si transistor over the silicon substrate 106.

Figure 27A:
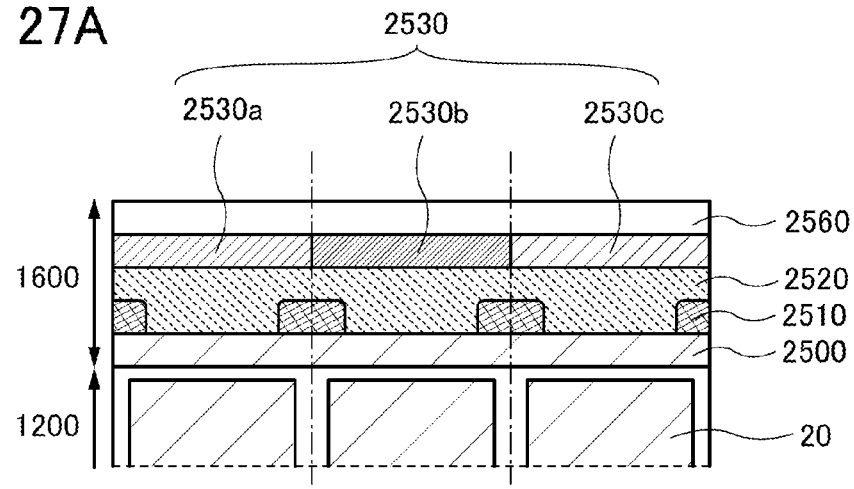
FIGS. 27A to 27C are cross-sectional views each illustrating a structure of an imaging device.

FIG. 27A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element 20 is formed. As the insulating layer 2500, for example, a silicon oxide film with a high visible-light transmitting property can be used. In addition, a silicon nitride film may be stacked as a passivation film. Furthermore, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed using a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530a, a color filter 2530b, and a color filter 2530c) is formed in each pixel. For example, color filters 2530a, a color filter 2530b, and a color filter 2530c have any of colors of red (R), green (G), blue (B), yellow (Y), cyan (C), magenta (M), and the like, so that a color image can be obtained.

A light-transmitting insulating layer 2560 or the like can be provided over the color filter 2530.

Figure 27B:
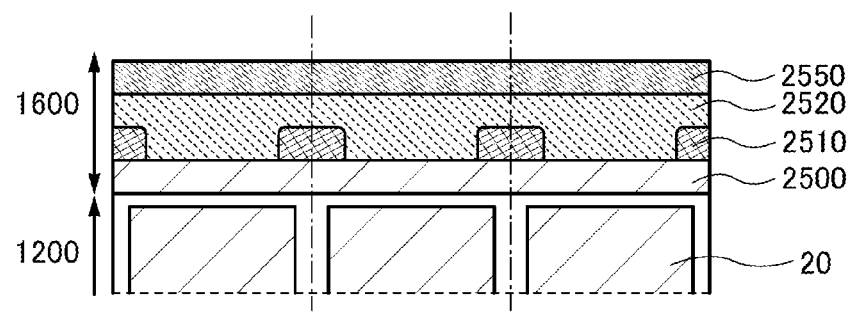

As illustrated in FIG. 27B, an optical conversion layer 2550 may be used instead of the color filter 2530. Such a structure enables the imaging device to capture images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that captures an image visualizing the intensity of radiation and is used for an X-ray imaging device, for example, can be obtained. Radiation such as X-rays passes through an object to enter a scintillator, and then is converted into light (fluorescence) such as visible light or ultraviolet light owing to a phenomenon known as photoluminescence. Then, the photoelectric conversion element 20 detects the light to obtain image data. Furthermore, the imaging device having the structure may be used in a radiation detector or the like.

A scintillator contains a substance that, when irradiated with radial rays such as X-rays or gamma-rays, absorbs energy of the radial rays to emit visible light or ultraviolet light or a material containing the substance. For example, a resin or ceramics in which any of $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, and $ZnO$ is dispersed can be used.

In the photoelectric conversion element 20 including a selenium-based material, radiation such as X-rays can be directly converted into charge; thus, the scintillator is not necessarily used.

A microlens array 2540 may be provided over the color filters 2530a, 2530b, and 2530c. Light penetrating lenses included in the microlens array 2540 goes through the color filters positioned thereunder to reach the photoelectric conversion element 20. Note that a region other than the layer 1200 in FIGS. 27A to 27C is referred to as a layer 1600.

Figure 27C:
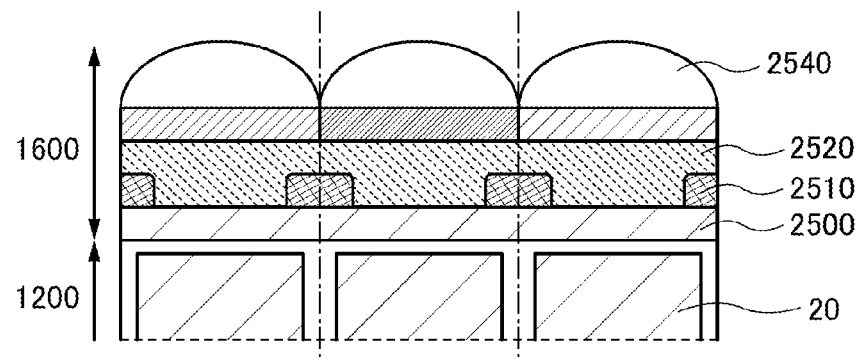
Figure 28:
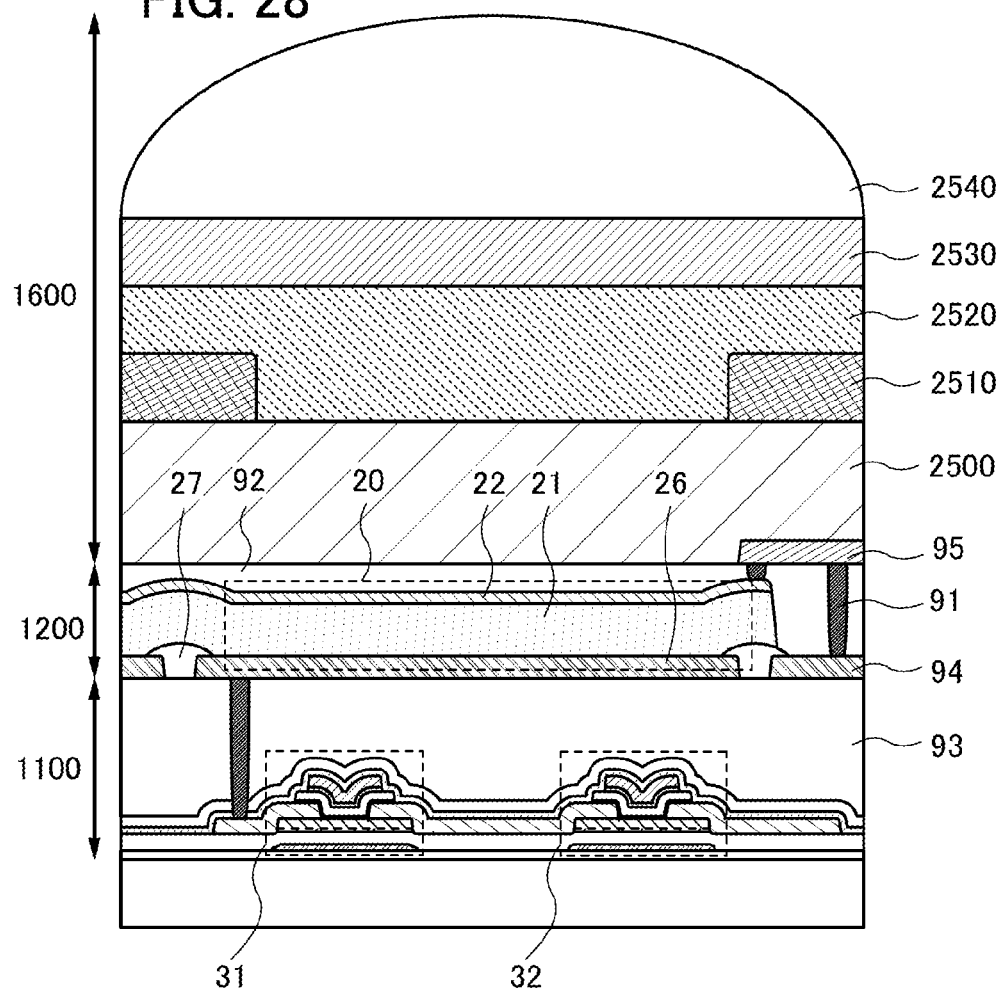
FIG. 28 is a cross-sectional view illustrating a structure of an imaging device.
Figure 29:
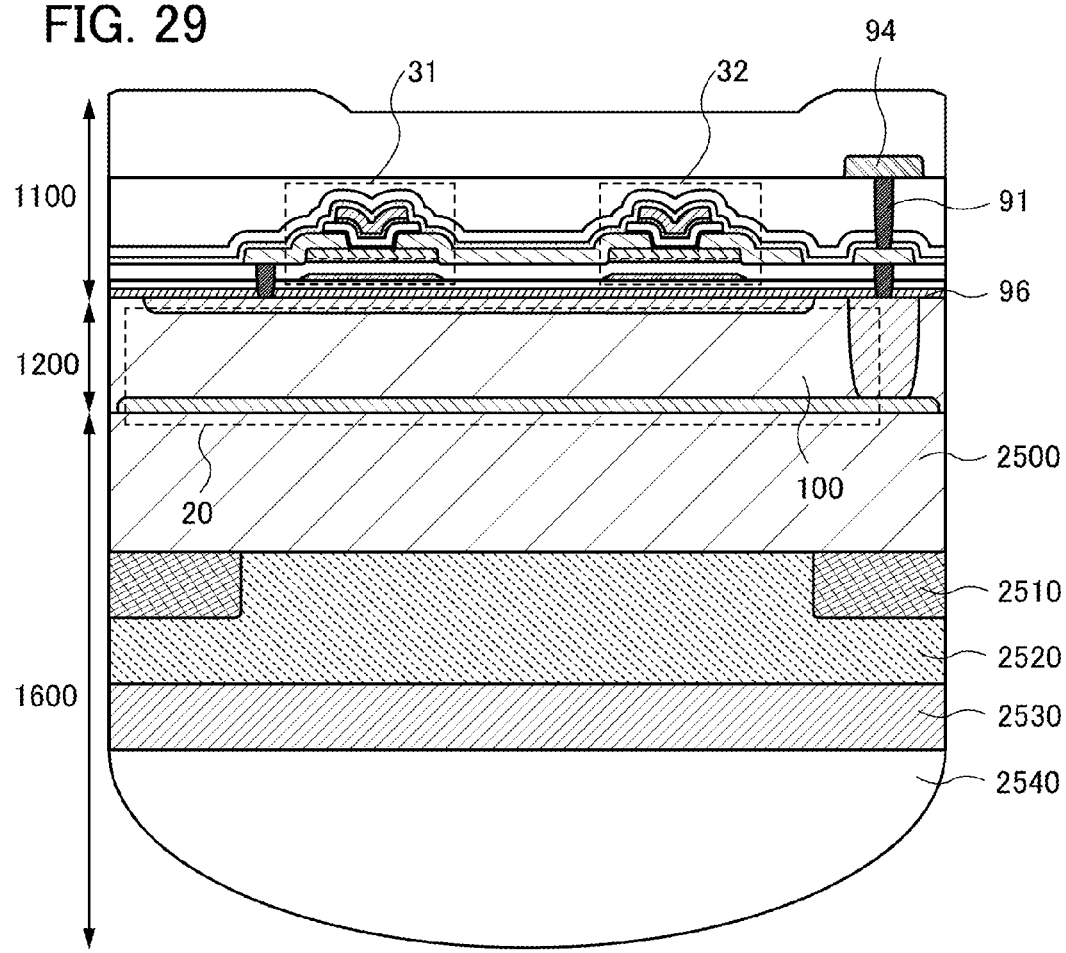
FIG. 29 is a cross-sectional view illustrating a structure of an imaging device.

The specific structure of the imaging device in FIG. 27C is illustrated in FIG. 28 by taking an example of the imaging device in FIG. 15A. In addition, the specific structure of the imaging device in FIG. 27C is illustrated in FIG. 29 by taking an example of the imaging device in FIG. 20.

Figure 30:
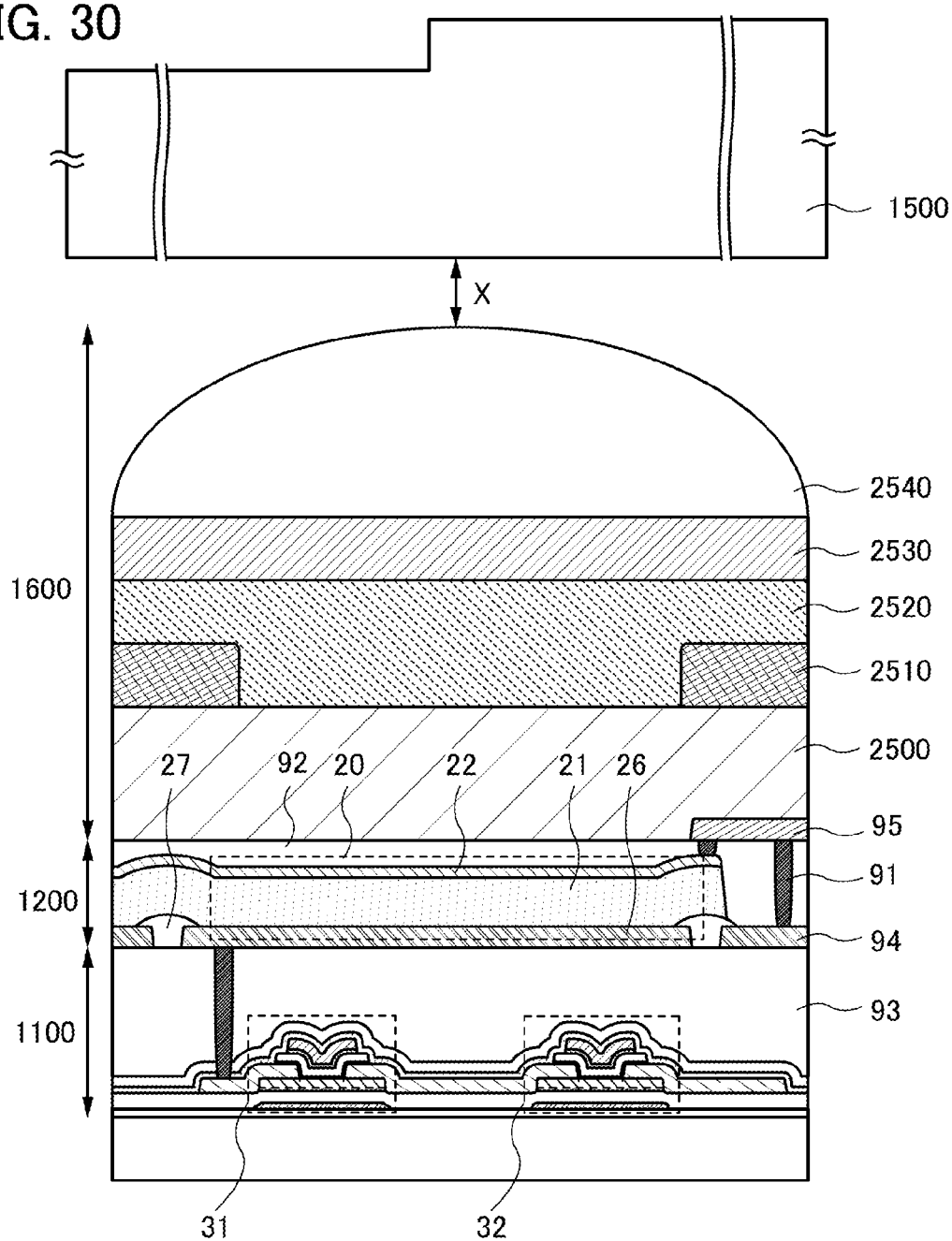
FIG. 30 is a cross-sectional view illustrating a structure of an imaging device.
Figure 31:
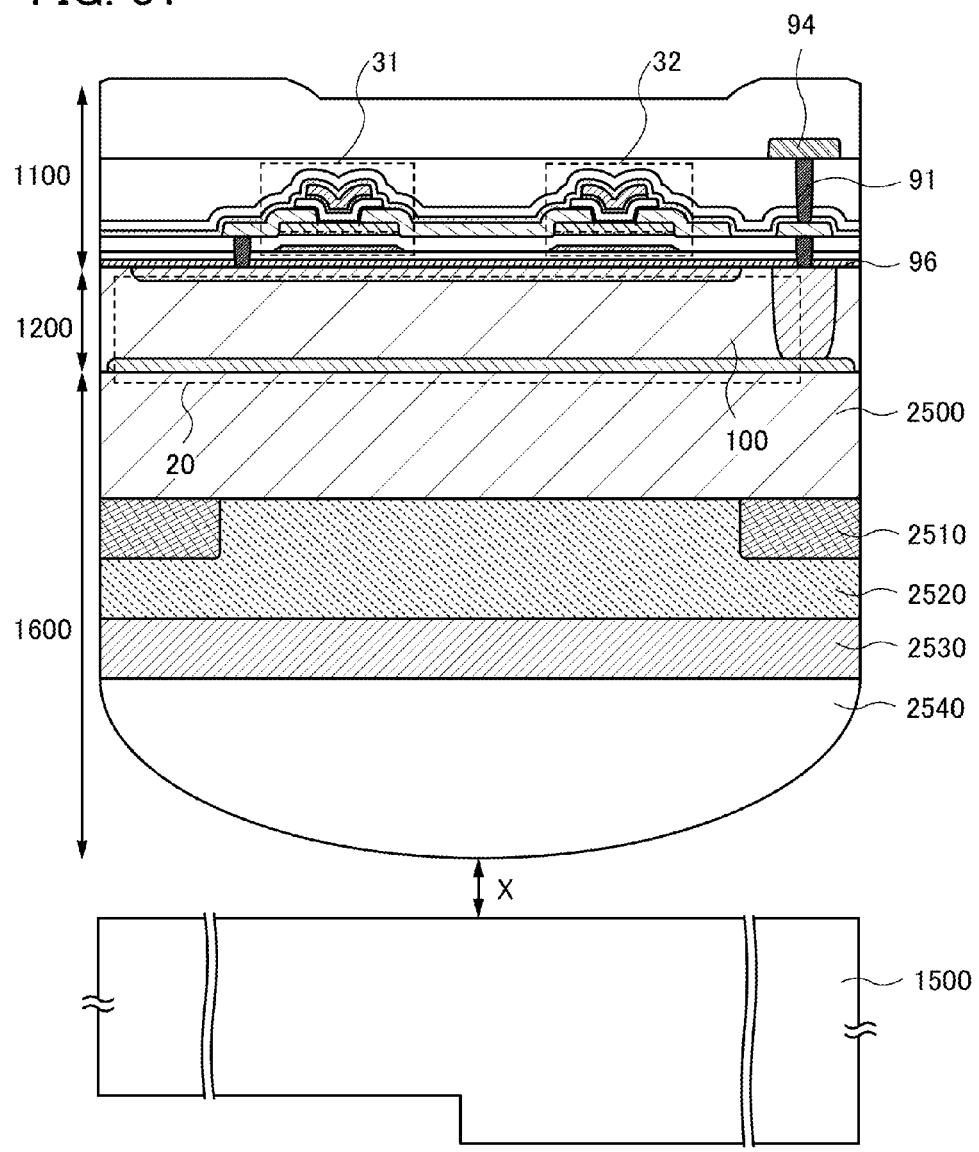
FIG. 31 is a cross-sectional view illustrating a structure of an imaging device.

The imaging device in one embodiment of the present invention may be combined with a diffraction grating 1500 as illustrated in FIG. 30 and FIG. 31. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIG. 32, an imaging device in one embodiment of the present invention can include a pixel portion 400 that includes the circuits 11 arranged in a matrix, a row driver 410 connected to the circuits 11, the circuits 12 connected to the circuits 11, an A/D converter 420 connected to the circuits 12, and a column driver 430 connected to the A/D converter 420. In the wirings in the circuit 11, the wiring 61 (TX), the wiring 62 (RES), the wiring 63 (AZ), and the wiring 65 (SEL) are connected to the column driver 410.

Imaging data obtained in the circuit 11 selected by the row driver 410 is input to the A/D converter 420 through the circuit 12. The A/D converter 420 converts input imaging data into digital data by A/D conversion. The A/D converted digital data are sequentially extracted to the outside by the column driver 430. As the row driver 410 and the column driver 430, for example, a variety of circuits such as a decoder and a shift register can be used.

As illustrated in FIGS. 33A1 and 33B1, the imaging device may be bent. FIG. 33A1 illustrates a state in which the imaging device is bent in the direction of dashed-two dotted line X1-X2. FIG. 33A2 is a cross-sectional view illustrating a portion indicated by dashed-two dotted line X1-X2 in FIG. 33A1. FIG. 33A3 is a cross-sectional view illustrating a portion indicated by dashed-two dotted line Y1-Y2 in FIG. 33A1.

FIG. 33B1 illustrates a state where the imaging device is bent in the direction of dashed-two dotted line X3-X4 and the direction of dashed-two dotted line Y3-Y4. FIG. 33B2 is a cross-sectional view illustrating a portion indicated by two-dotted chain line X3-X4 in FIG. 33B1. FIG. 33B3 is a cross-sectional view illustrating a portion indicated by two-dot chain line Y3-Y4 in FIG. 33B1.

The bent imaging device enables the curved field and astigmatism to be reduced. Thus, the optical design of lens and the like, which is used in combination of the imaging device, can be facilitated. For example, the number of lenses used for aberration correction can be reduced; accordingly, the size or weight of semiconductor devices including the imaging device can be easily reduced. In addition, the quality of a captured image can be improved.

In this embodiment, one embodiment of the present invention has been described. Other embodiments of the present invention are described in the other embodiments. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. For example, depending on circumstances or conditions, either one or both the transistors 31 and 32 do not necessarily include an oxide semiconductor in the active layer.

This embodiment can be implemented in an appropriate combination with any of the structures described in the other embodiments.

Embodiment 4

In this embodiment, a transistor including an oxide semiconductor that can be used in one embodiment of the present invention is described with reference to drawings. In the drawings in this embodiment, some components are enlarged, reduced in size, or omitted for easy understanding.

Figure 34A:
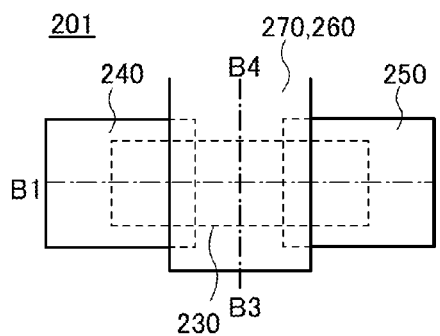
FIGS. 34A to 34F are top views and cross sectional views illustrating transistors.
Figure 34B:
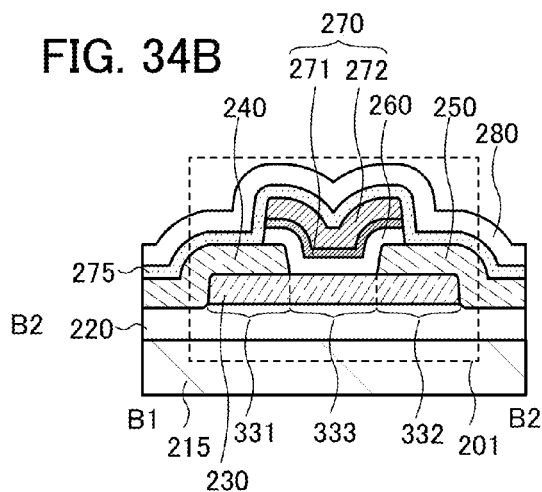
Figure 36A:
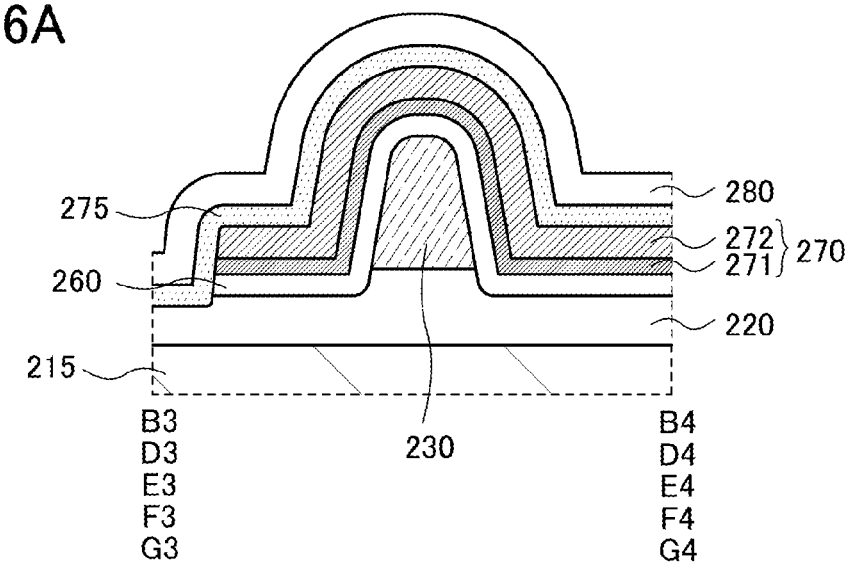
FIGS. 36A to 36D each illustrate a cross section of a transistor in a channel width direction.

FIGS. 34A and 34B are a top view and a cross-sectional view illustrating a transistor 201 in one embodiment of the present invention. FIG. 34A is a top view, and a cross section in the direction of dashed-dotted line B1-B2 in FIG. 34A is illustrated in FIG. 34B. A cross section in the direction of dashed-dotted line B3-B4 in FIG. 34A is illustrated in FIG. 36A. The direction of dashed-dotted line B1-B2 is referred to as a channel length direction, and the direction of dashed-dotted line B3-B4 is referred to as a channel width direction.

The transistor 201 includes a substrate 215, an insulating layer 220, an oxide semiconductor layer 230, a conductive layer 240, a conductive layer 250, an insulating layer 260, a conductive layer 270, an insulating layer 275, and an insulating layer 280.

The insulating layer 220 is in contact with the substrate 215. The oxide semiconductor layer 230 is in contact with the insulating layer 220. Conductive layers 240 and 250 are in contact with the insulating layer 220 and the oxide semiconductor layer 230. The insulating layer 260 is in contact with the insulating layer 220, the oxide semiconductor layer 230, and the conductive layers 240 and 250. The conductive layer 270 is in contact with insulating layer 260. The insulating layer 275 is in contact with the insulating layer 220, the conductive layers 240 and 250, and the conductive layer 270. The insulating layer 280 is in contact with the insulating layer 275.

Here, in the oxide semiconductor layer 230, a region overlapping with the conductive layer 240, a region overlapping with the conductive layer 250, and a region overlapping with the insulating layer 260 are referred to as a region 331, a region 332, and a region 333, respectively.

Furthermore, the conductive layers 240 and 250 are electrically connected to the oxide semiconductor layer 230.

The conductive layer 240 functions as one of a source electrode and a drain electrode. The conductive layer 250 functions as the other of the source electrode and the drain electrode. The insulating layer 260 functions as a gate insulating layer. The conductive layer 270 functions as a gate electrode.

The region 331, the region 332, and the region 333 which are illustrated in FIG. 34B function as one of a source region and a drain region, the other of the source region and the drain region, and a channel formation region, respectively.

Each of the conductive layers 240 and 250 is a single layer in the drawing, but also may be a stack of two or more layers. The conductive layer 270 includes two layers, a conductive layer 271 and a conductive layer 272, in the drawing, but also may be a single layer or a lamination of three or more layers. The same applies to other transistors described in this embodiment.

The insulating layer 280 may function as a planarization film as necessary.

Figure 34C:
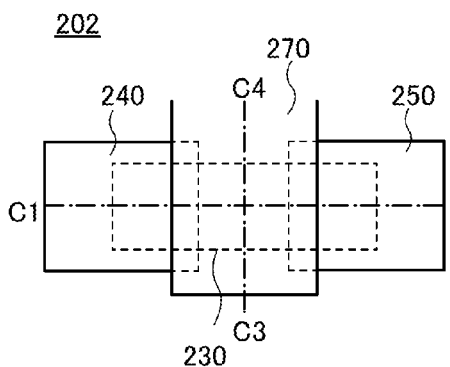
Figure 34D:
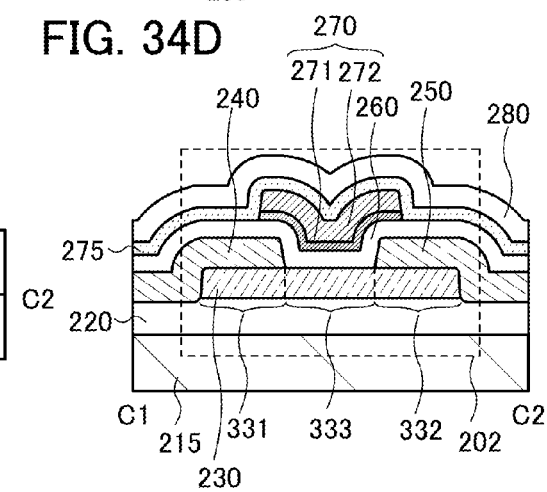
Figure 36B:
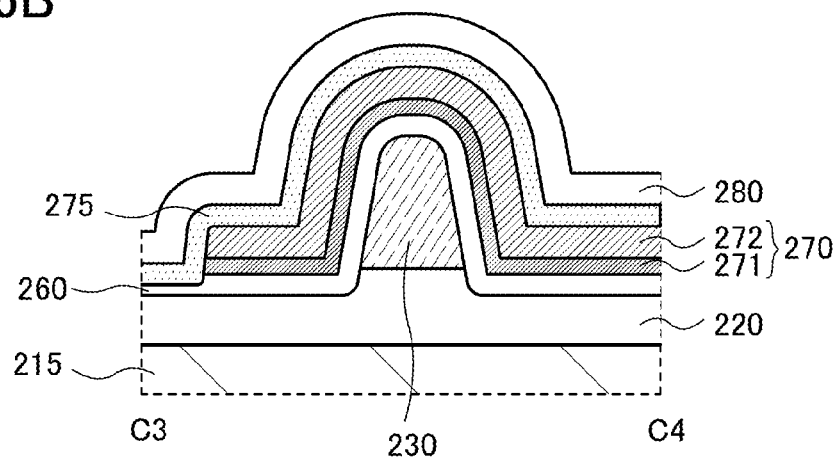

The transistor in one embodiment of the present invention may have a structure illustrated in FIGS. 34C and 34D. FIG. 34C is a top view of a transistor 202. A cross section in the direction of dashed-dotted line C1-C2 in FIG. 34C is illustrated in FIG. 34D. A cross section in the direction of dashed-dotted line C3-C4 in FIG. 34C is illustrated in FIG. 36B. In some cases, the direction of the dashed-dotted line C1-C2 is referred to as a channel length direction, and the direction of the dashed-dotted line C3-C4 is referred to as a channel width direction.

The transistor 202 is different from the transistor 201 in that an end portion of the insulating layer 260 is not aligned with an end portion of the conductive layer 270. In the transistor 202, wide areas of the conductive layer 240 and the conductive layer 250 are covered with the insulating layer 260 and accordingly the resistance between the conductive layer 270 and the conductive layers 240 and 250 is high; therefore, the transistor 202 has a feature of low gate leakage current.

The transistor 201 and the transistor 202 each have a top-gate structure including a region where the conductive layer 270 overlaps with each of the conductive layers 240 and 250. To reduce parasitic capacitance, the width of the region in the channel length direction is preferably greater than or equal to 3 nm and less than 300 nm. Since an offset region is not formed in the oxide semiconductor layer 230 in this structure, a transistor with a high on-state current can be easily formed.

Figure 34E:
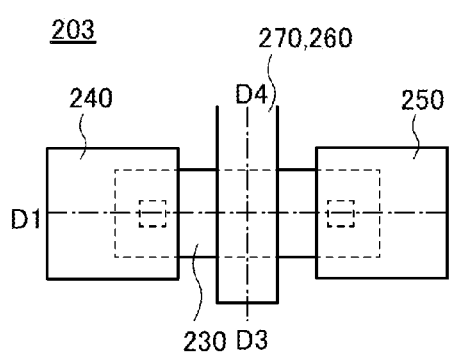
Figure 34F:
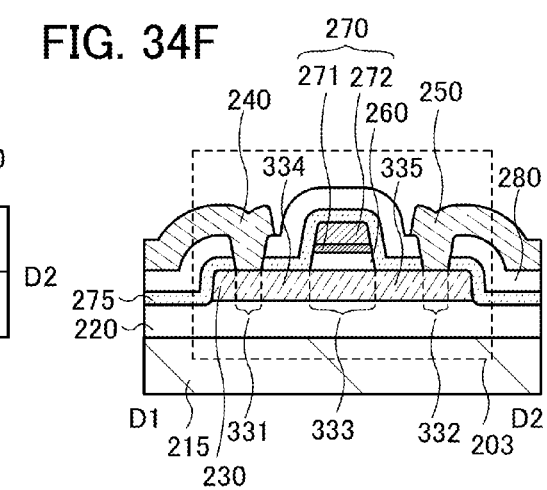

The transistor in one embodiment of the present invention may have a structure illustrated in FIGS. 34E and 34F. FIG. 34E is a top view of a transistor 203. A cross section in the direction of dashed-dotted line D1-D2 in FIG. 34E is illustrated in FIG. 34F. A cross section in the direction of dashed-dotted line D3-D4 in FIG. 34E is illustrated in FIG. 36A. In some cases, the direction of the dashed-dotted line D1-D2 is referred to as a channel length direction, and the direction of the dashed-dotted line D3-D4 is referred to as a channel width direction.

In the transistor 203, the insulating layer 220 is in contact with the substrate 215; the oxide semiconductor layer 230 is in contact with the insulating layer 220; the insulating layer 260 is in contact with the insulating layer 220 and the oxide semiconductor layer 230; the conductive layer 270 is in contact with the insulating layer 260; the insulating layer 275 is in contact with the insulating layer 220, the oxide semiconductor layer 230, and the conductive layer 270; the insulating layer 280 is in contact with the insulating layer 275; the conductive layers 240 and 250 are in contact with the oxide semiconductor layer 230 and the insulating layer 280.

Openings are formed in the insulating layers 275 and 280, and the conductive layers 240 and 250 are electrically connected to the oxide semiconductor layer 230 through the openings.

The transistor 203 may further include, for example, an insulating layer (planarization film) in contact with the conductive layers 240 and 250 and the insulating layer 280 as necessary.

In the oxide semiconductor layer 230, a region that overlaps with the insulating layer 275 and is sandwiched between the region 331 and the region 333 is referred to as a region 334. In addition, a region that overlaps with the insulating layer 275 and is sandwiched between the region 332 and the region 333 is referred to as a region 335.

Figure 35A:
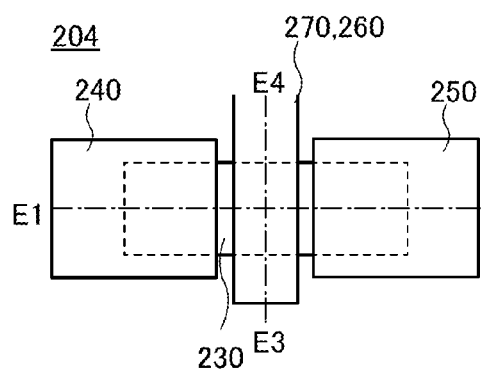
FIGS. 35A to 35F are top views and cross sectional views illustrating transistors.
Figure 35B:
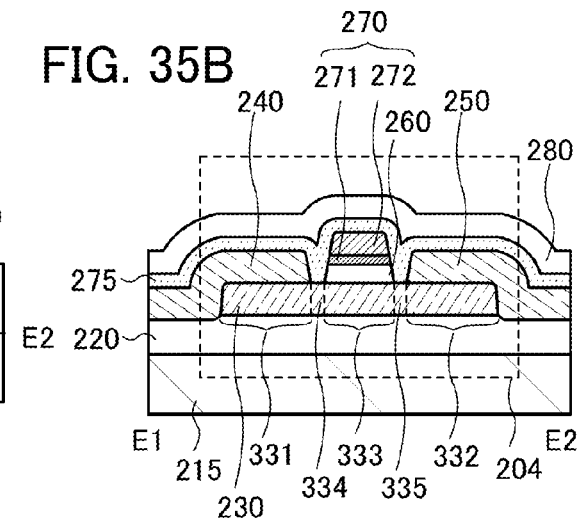

The transistor in one embodiment of the present invention may have a structure illustrated in FIGS. 35A and 35B. FIG. 35A is a top view of a transistor 204. A cross section in the direction of dashed-dotted line E1-E2 in FIG. 35A is illustrated in FIG. 35B. A cross section in the direction of dashed-dotted line E3-E4 in FIG. 35A is illustrated in FIG. 36A. In some cases, the direction of the dashed-dotted line E1-E2 is referred to as a channel length direction, and the direction of the dashed-dotted line E3-E4 is referred to as a channel width direction.

In the transistor 204, the insulating layer 220 is in contact with the substrate 215; the oxide semiconductor layer 230 is in contact with the insulating layer 220; the conductive layers 240 and 250 are in contact with the insulating layer 220 and the oxide semiconductor layer 230; the insulating layer 260 is in contact with the insulating layer 220 and the oxide semiconductor layer 230; the conductive layer 270 is in contact with the insulating layer 260; the insulating layer 275 is in contact with the insulating layer 220, the oxide semiconductor layer 230, conductive layers 240 and 250, and the conductive layer 270; and the insulating layer 280 is in contact with the insulating layer 275.

The transistor 204 is different from the transistor 203 in that the conductive layers 240 and 250 are in contact with the oxide semiconductor layer 230 so as to cover ends portions of the oxide semiconductor layer 230.

The transistor 203 and the transistor 204 each have a self-aligned structure not including a region where the conductive layer 270 overlaps with each of the conductive layers 240 and 250. A transistor with a self-aligned structure, which has extremely low parasitic capacitance between a gate electrode and source and drain electrodes, is suitable for applications that require high-speed operation.

Figure 35C:
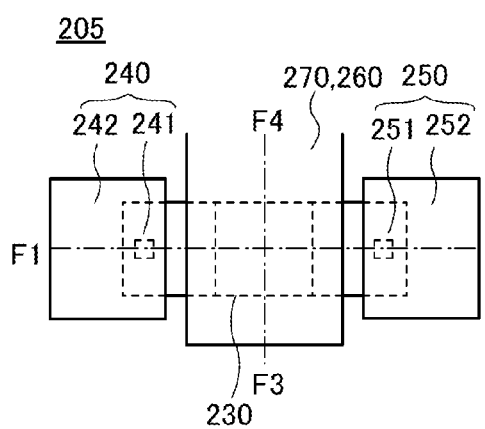
Figure 35D:
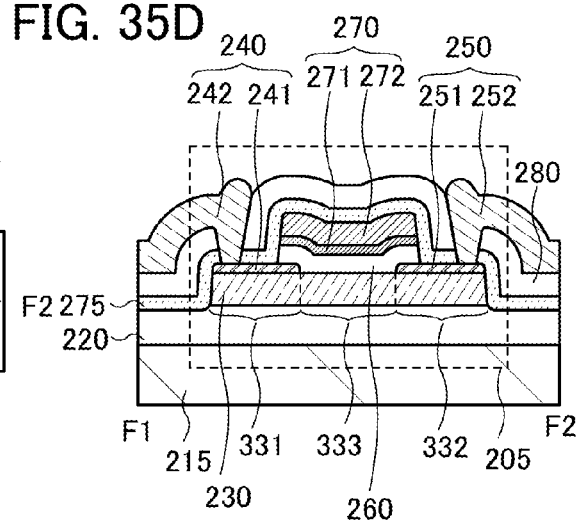

The transistor of one embodiment of the present invention may have a structure illustrated in FIGS. 35C and 35D. FIG. 35C is a top view of a transistor 205. A cross section in the direction of dashed-dotted line F1-F2 in FIG. 35C is illustrated in FIG. 35D. A cross section in the direction of dashed-dotted line F3-F4 in FIG. 35C is illustrated in FIG. 36A. In some cases, the direction of the dashed-dotted line F1-F2 is referred to as a channel length direction, and the direction of the dashed-dotted line F3-F4 is referred to as a channel width direction.

In the transistor 205, the conductive layer 240 includes two layers of conductive layers 241 and 242, and the conductive layer 250 includes two layers of conductive layers 251 and 252. The insulating layer 220 is in contact with the substrate 215; the oxides semiconductor layer 230 is in contact with the insulating layer 220; the conductive layers 241 and 251 is in contact with the oxide semiconductor layer 230; the insulating layer 260 is in contact with the insulating layer 220, the oxide semiconductor layer 230, and the conductive layers 241 and 251; the conductive layer 270 is in contact with the insulating layer 260; the insulating layer 275 is in contact with the insulating layer 220, the conductive layer 241, the conductive layer 251, and the conductive layer 270; the insulating layer 280 is in contact with the insulating layer 275; the conductive layer 242 is in contact with the conductive layer 241 and the insulating layer 280; and the conductive layer 252 is in contact with the conductive layer 251 and the insulating layer 280.

Here, the conductive layers 241 and 251 are in contact with the top surface of the oxide semiconductor layer 230 and are not in contact with side surfaces of the oxide semiconductor layer 230.

The transistor 205 may further include, for example, an insulating layer in contact with the insulating layer 280 and the conductive layers 242 and 252 as necessary.

Furthermore, the conductive layers 241 and 251 are electrically connected to the oxide semiconductor layer 230. The conductive layer 242 is electrically connected to the conductive layer 241, and the conductive layer 252 is electrically connected to the conductive layer 251.

In the oxide semiconductor layer 230, a region overlapping with the conductive layer 241 is a region 331 functioning as one of a source region and a drain region, and a region overlapping with the conductive layer 251 is a region 332 functioning as the other of the source region and the drain region.

Figure 35E:
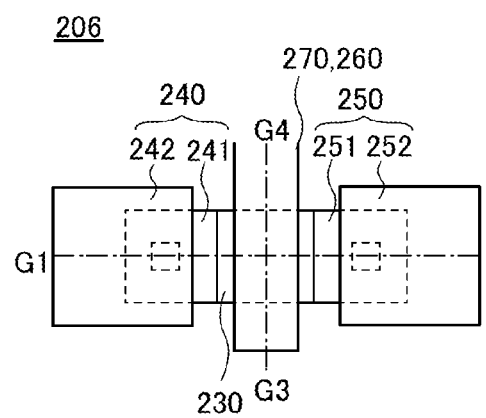
Figure 35F:
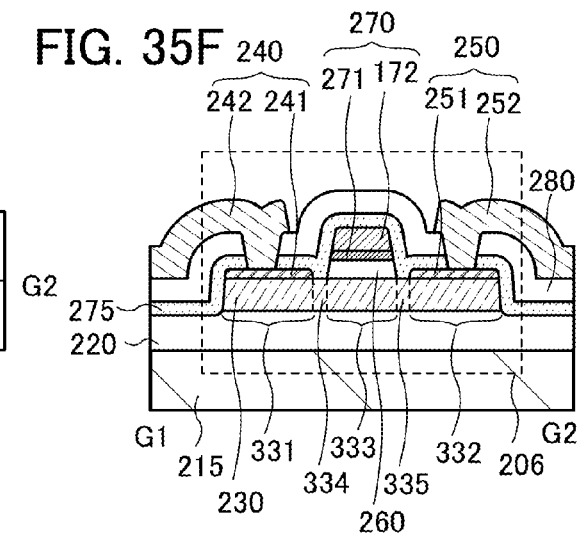

The transistor in one embodiment of the present invention may have a structure illustrated in FIGS. 35E and 35F. FIG. 35E is a top view of a transistor 206. A cross section in the direction of dashed-dotted line G1-G2 in FIG. 35E is illustrated in FIG. 35F. A cross section in the direction of dashed-dotted line G3-G4 in FIG. 35E is illustrated in FIG. 36A. In some cases, the direction of the dashed-dotted line G1-G2 is referred to as a channel length direction, and the direction of the dashed-dotted line G3-G4 is referred to as a channel width direction.

The transistor 206 is different from the transistor 203 in that the conductive layer 240 includes two layers of the conductive layers 241 and 242, and the conductive layer 250 includes two layers of the conductive layers 251 and 252.

In the structures of the transistors 205 and 206, the conductive layers 240 and 250 are not in contact with the insulating layer 220. These structures make the insulating layer 220 less likely to be deprived of oxygen by the conductive layers 240 and 250 and facilitate oxygen supply from the insulating layer 220 to the oxide semiconductor layer 230.

Note that an impurity for forming an oxygen vacancy to increase conductivity may be added to the region 334 and the region 335 in each of the transistors 203, 204 and 206. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, whereby an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property in a manner similar to the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode and a drain electrode; thus, contact resistance between the oxide conductor layer and the conductive layers functioning as the source electrode and the drain electrode can be reduced.

Although the transistors 201 to 206 in FIGS. 34A to 34F, FIGS. 35A to 35F, and FIGS. 36A to 36D are examples in which the oxide semiconductor layer 230 is a single layer, the oxide semiconductor layer 230 may be a stacked layer. FIG. 37A is a top view of the oxide semiconductor layer 230, and FIGS. 37B and 37C are cross-sectional views of the oxide semiconductor layer 230 having a two-layer structure of an oxide semiconductor layer 230a and an oxide semiconductor layer 230b. FIGS. 37D and 37E are cross-sectional views of the oxide semiconductor layer 230 having a three-layer structure of the oxide semiconductor layer 230a, the oxide semiconductor layer 230b, and an oxide semiconductor layer 230c.

Since a channel region is not formed in the oxide semiconductor layer 230a or 230c, the oxide semiconductor layers 230a and 230c can also be referred to as insulating layers.

Oxide semiconductor layers with different compositions, for example, can be used as an oxide semiconductor layer 230a, an oxide semiconductor layer 230b, and an oxide semiconductor layer 230c.

The oxide semiconductor layer 230 in the transistors 201 to 206 can be replaced with the oxide semiconductor layer 230 in FIG. 37B, 37C, 37D, or 37E.

Figure 38A:
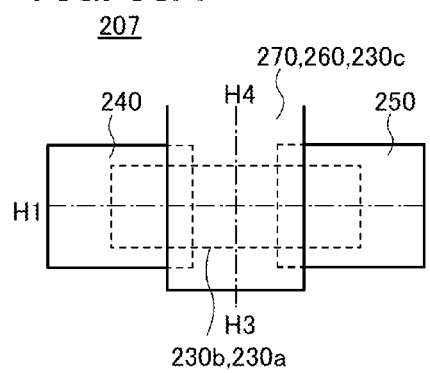
FIGS. 38A to 38F are top views and cross-sectional views illustrating transistors.
Figure 38B:
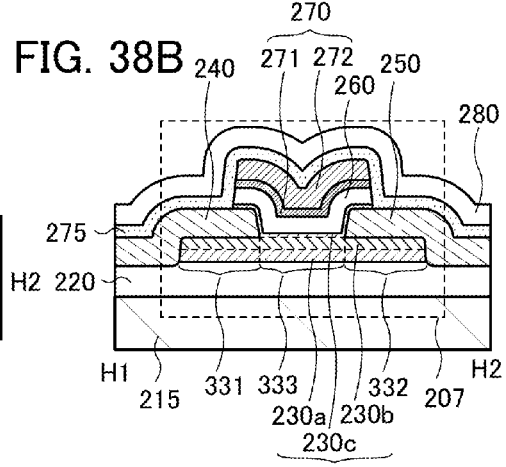
Figure 38C:
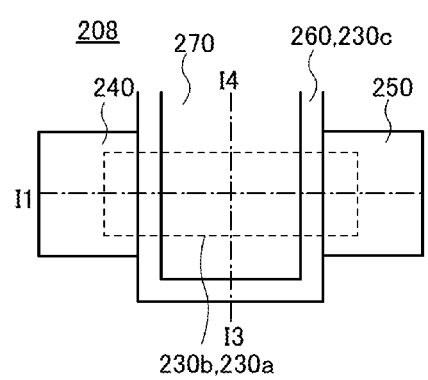
Figure 38D:
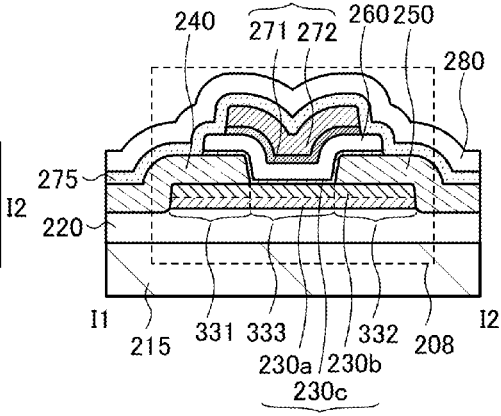
Figure 38E:
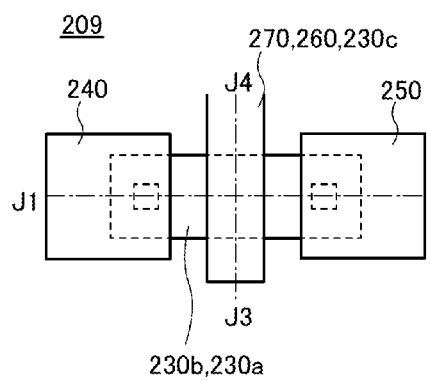
Figure 38F:
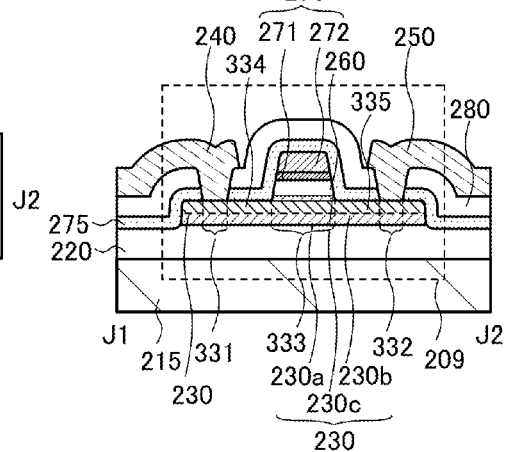
Figure 39A:
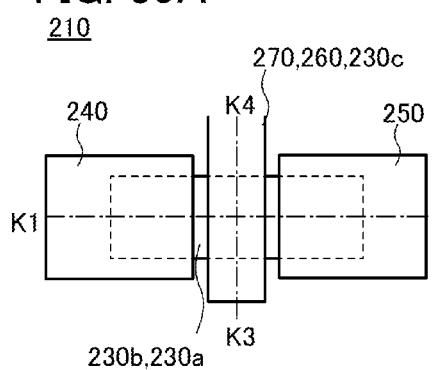
FIGS. 39A to 39F are top views and cross-sectional views illustrating transistors.
Figure 39B:
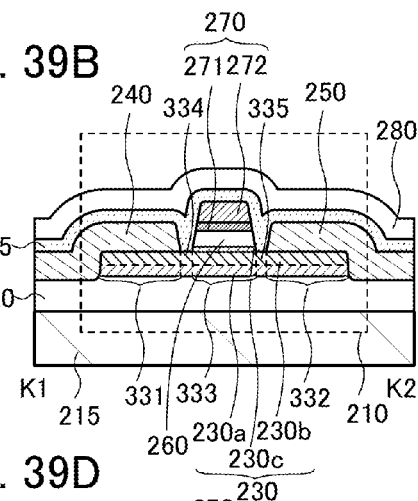
Figure 39C:
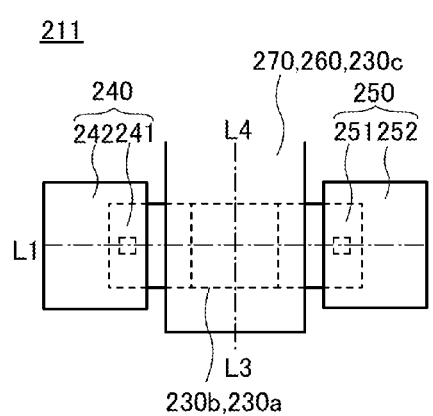
Figure 39D:
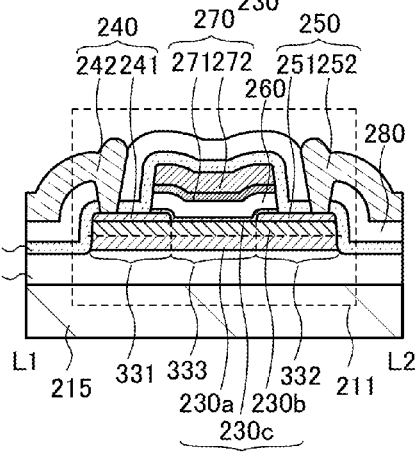
Figure 39E:
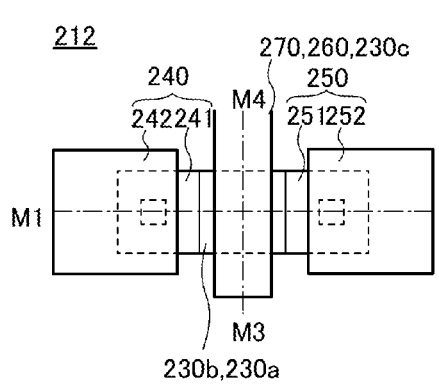
Figure 39F:
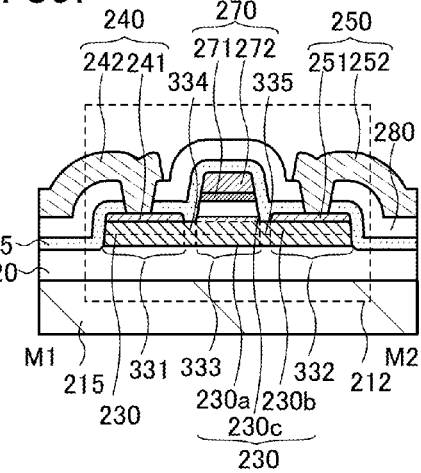
Figure 40A:
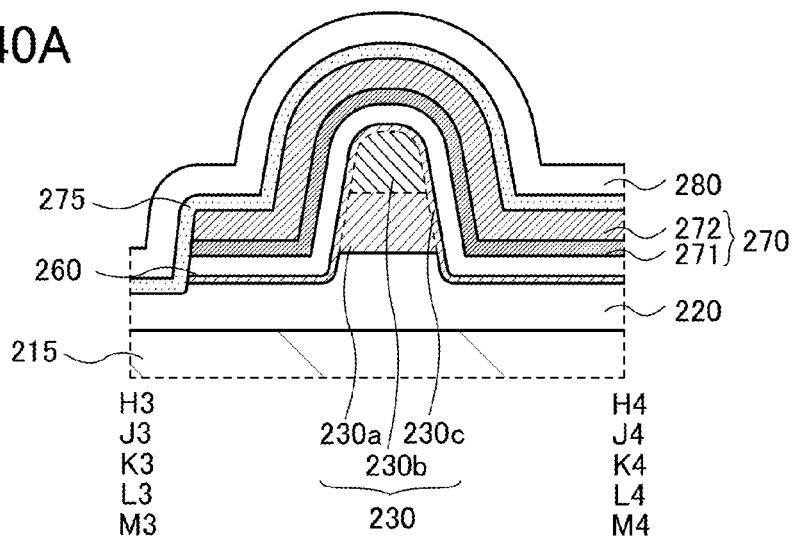
FIGS. 40A to 40D each illustrate a cross section of a transistor in a channel width direction.
Figure 40B:
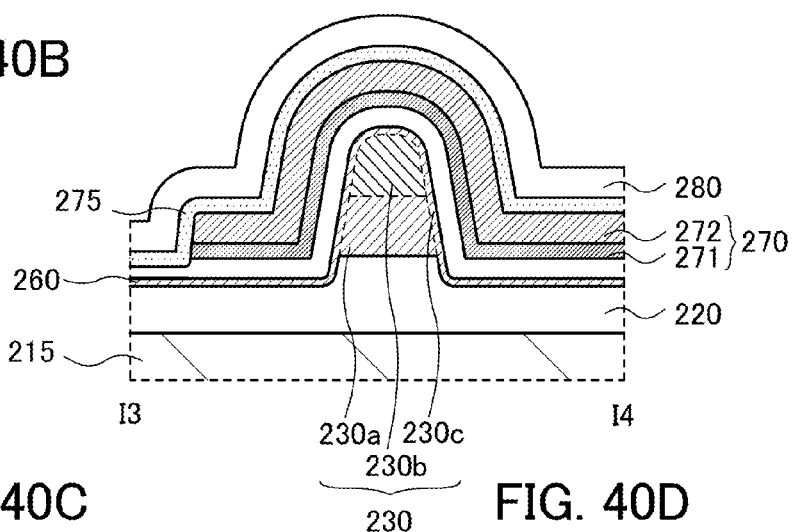

The transistor in one embodiment of the present invention may have a structure illustrated in FIGS. 38A to 38F, FIGS. 39A to 39F, and FIGS. 40A to 40D. FIGS. 38A, 38C, and 38E and FIGS. 39A, 39C, and 39E are top views of transistors 207, 208, 209, 210, 211, and 212, respectively. A cross section in the direction of dashed-dotted line H1-H2 in FIG. 38A is illustrated in FIG. 38B. A cross section in the direction of dashed-dotted line 11-12 in FIG. 38C is illustrated in FIG. 38D. A cross section in the direction of dashed-dotted line J1-J2 in FIG. 38E is illustrated in FIG. 38F. A cross section in the direction of dashed-dotted line K1-K2 in FIG. 39A is illustrated in FIG. 39B. A cross section in the direction of dashed-dotted line L1-L2 in FIG. 39C is illustrated in FIG. 39D. A cross section in the direction of dashed-dotted line M1-M2 in FIG. 39E is illustrated in FIG. 39F. Furthermore, cross sections in the directions of dashed-dotted lines H3-H4 in FIG. 38A, J3-J4 in FIG. 38E, K3-K4 in FIG. 39A, L3-L4 in FIG. 39C, and M3-M4 in FIG. 39E are illustrated in FIG. 40A. A cross section in the direction of dashed-dotted line 13-14 in FIG. 38C is illustrated in FIG. 40B.

The transistors 207 and 208 have the same structure as the transistors 201 and 202 except that the oxide semiconductor layer 230 includes two layers (the oxide semiconductor layer 230a and the oxide semiconductor layer 230b) in the region 331 and the region 332, that the oxide semiconductor layer 230 includes three layers (the oxide semiconductor layer 230a, the oxide semiconductor layer 230b, and the oxide semiconductor layer 230c) in the region 333, and that part of the oxide semiconductor layer (the oxide semiconductor layer 230c) exists between the insulating layer 260 and the conductive layers 240 and 250.

The transistors 209, 210, and 212 have the same structure as the transistors 203, 204, and 206 except that the oxide semiconductor layer 230 includes two layers (the oxide semiconductor layer 230a and the oxide semiconductor layer 230b) in the region 331, the region 332, the region 334, and the region 335 and that the oxide semiconductor layer 230 includes three layers (the oxide semiconductor layer 230a, the oxide semiconductor layer 230b, and the oxide semiconductor layer 230c) in the region 333.

The transistor 211 has the same structure as the transistor 205 except that the oxide semiconductor layer 230 includes two layers (the oxide semiconductor layer 230a and the oxide semiconductor layer 230b) in the region 331 and the region 332, that the oxide semiconductor layer 230 includes three layers (the oxide semiconductor layer 230a, the oxide semiconductor layer 230b, and the oxide semiconductor layer 230c) in the region 333, and that part of the oxide semiconductor layer (the oxide semiconductor layer 230c) exists between the insulating layer 260 and the conductive layers 241 and 251.

Figure 36C:
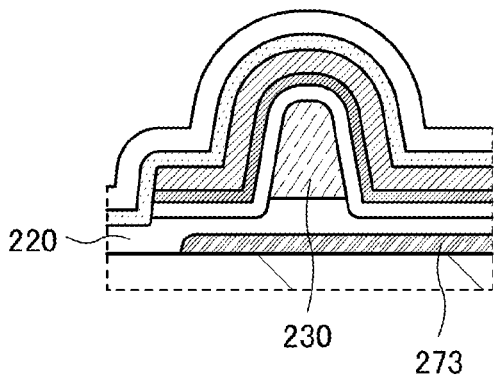
Figure 37A:
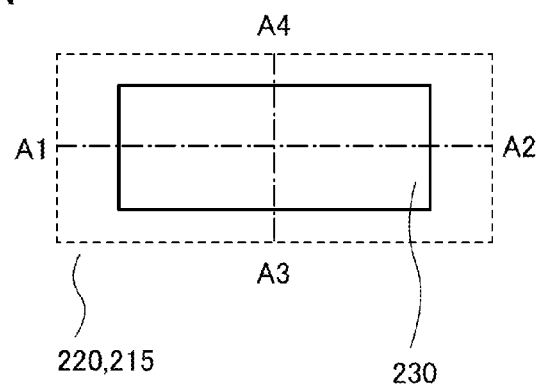
FIGS. 37A to 37E are a top view and cross-sectional views illustrating an oxide semiconductor layer.
Figure 37B:
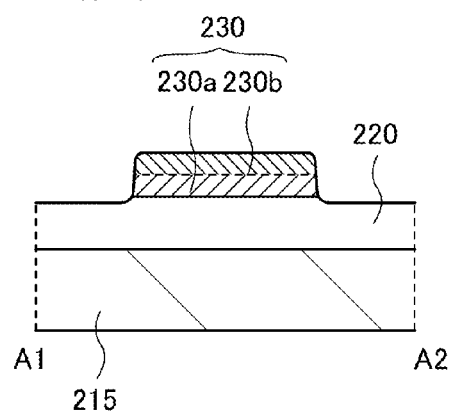
Figure 37C:
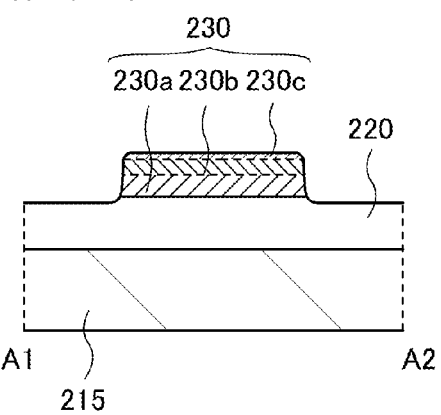
Figure 37D:
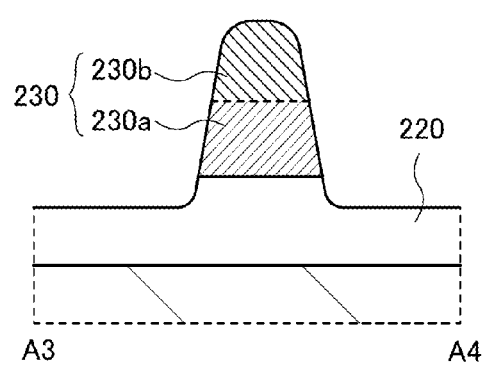
Figure 37E:
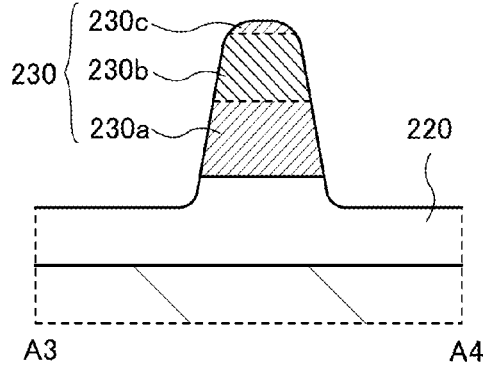
Figure 40C:
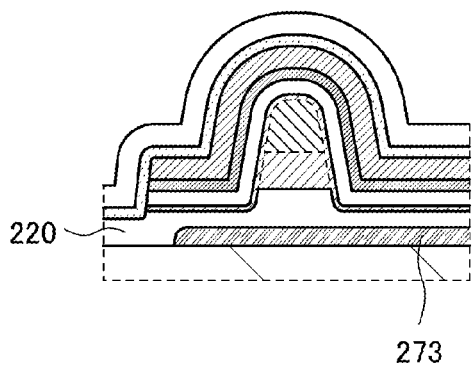

The transistor in one embodiment of the present invention may include a conductive layer 273 between the oxide semiconductor layer 230 and the substrate 215 as illustrated in the cross-sectional views in the channel length directions of the transistors 201 to 212 in FIGS. 41A to 41F and FIGS. 42A to 42F, the cross-sectional view in the channel width direction of the transistors 201 to 206 in FIG. 36C, and the cross-sectional view in the channel width direction of the transistors 207 to 212 in FIG. 40C. The conductive layer 273 is used as a second gate electrode (also referred to as a back gate electrode), whereby the channel formation region of the oxide semiconductor layer 230 is electrically surrounded by the conductive layers 270 and 273. This transistor structure is referred to as a surrounded channel (s-channel) structure. Such a structure can increase the on-state current, and can control the threshold voltage. In the cross-sectional views in FIGS. 41A to 41F and 42A to 42F, the width of the conductive layer 273 may be shorter than that of the oxide semiconductor layer 230. Moreover, the width of the conductive layer 273 may be shorter than that of the conductive layer 270.

Figure 36D:
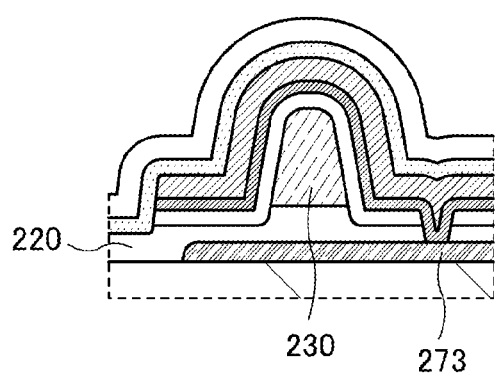
Figure 40D:
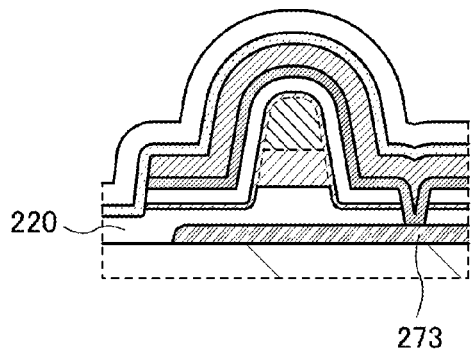
Figure 41A:
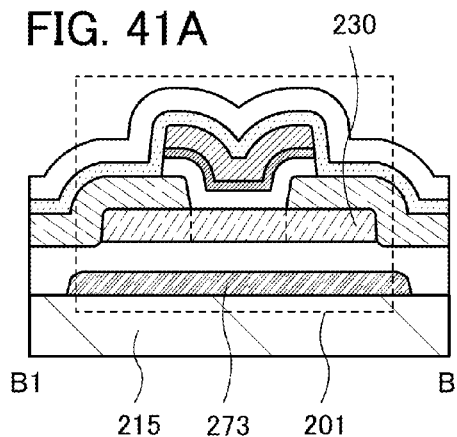
FIGS. 41A to 41F each illustrate a cross section of a transistor in a channel length direction.
Figure 41B:
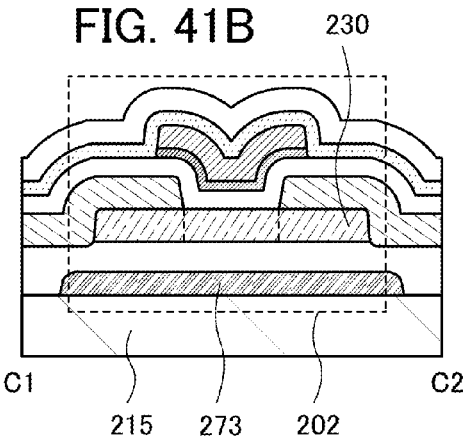
Figure 41C:
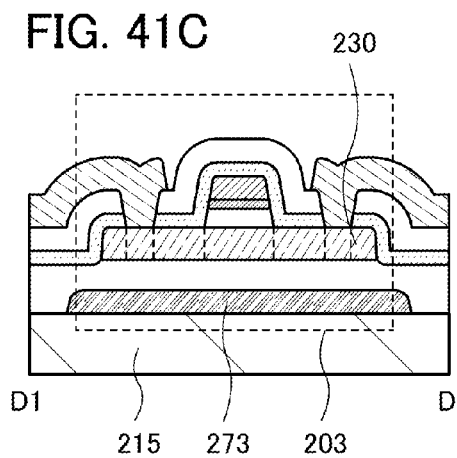
Figure 41D:
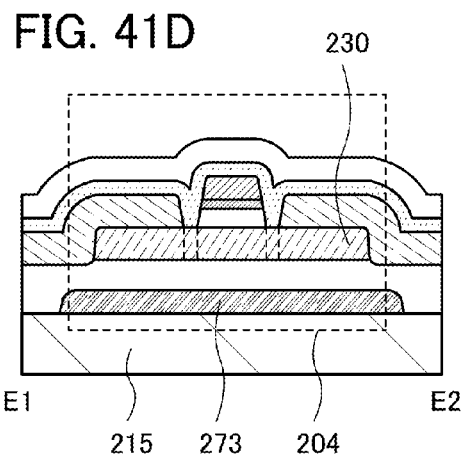
Figure 41E:
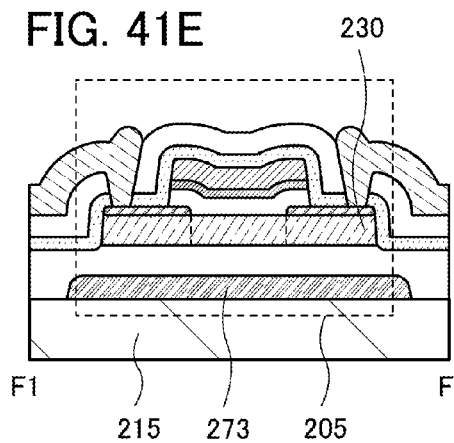
Figure 41F:
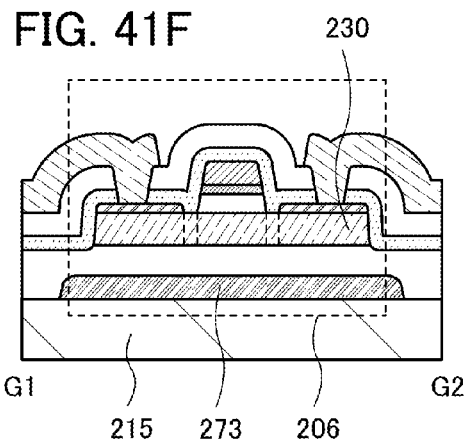
Figure 42A:
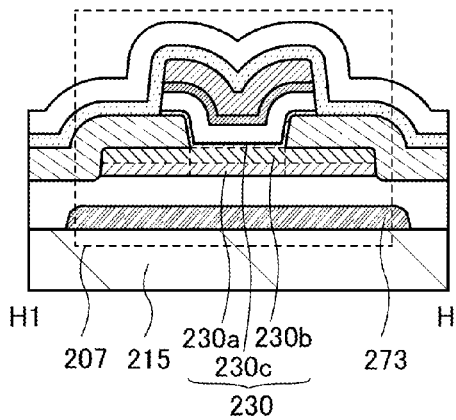
FIGS. 42A to 42F each illustrate a cross section of a transistor in a channel length direction.
Figure 42B:
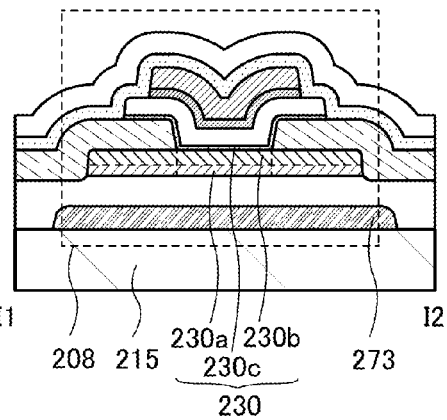
Figure 42C:
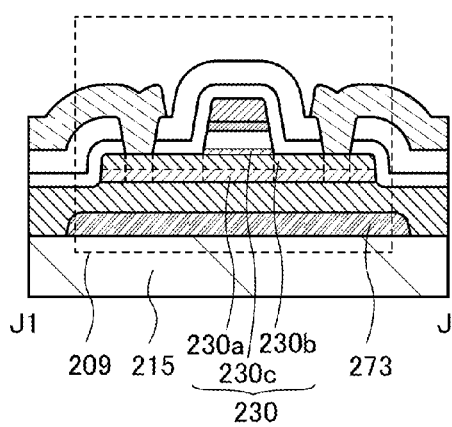
Figure 42D:
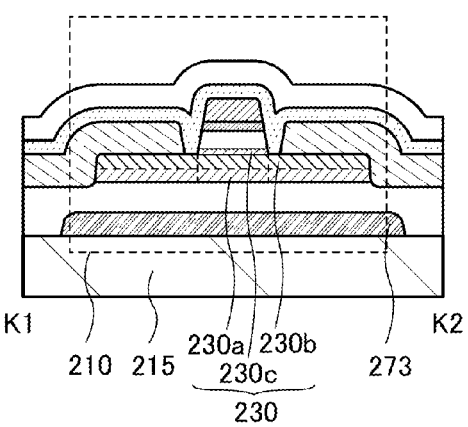
Figure 42E:
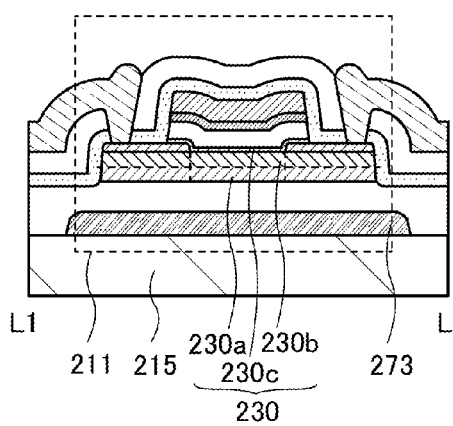
Figure 42F:
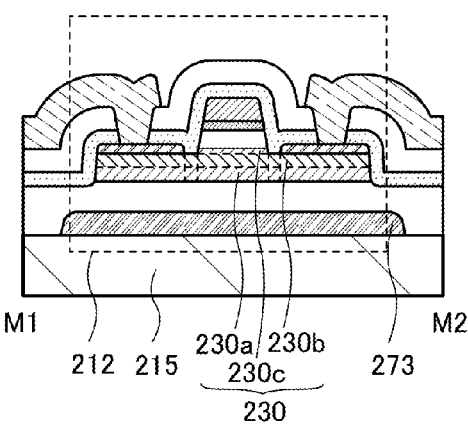

In order to increase the on-state current, for example, the conductive layer 270 and the conductive layer 273 are set to have the same potential, and the transistor is driven as a double-gate transistor. To control the threshold voltage, a fixed potential, which is different from a potential of the conductive layer 270, is supplied to the conductive layer 273. To set the conductive layers 270 and 273 at the same potential, for example, as illustrated in FIG. 36D and FIG. 40D, the conductive layers 270 and 273 may be electrically connected to each other through a contact hole.

Figure 43A:
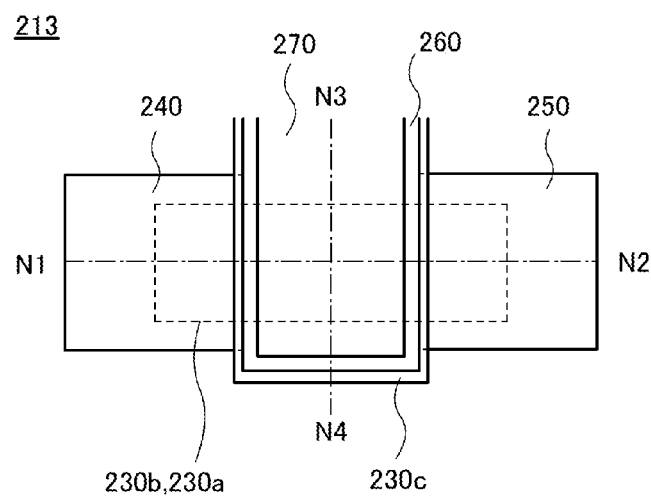
FIGS. 43A to 43C are a top view and cross-sectional views of a transistor.
Figures 43B, 43C:
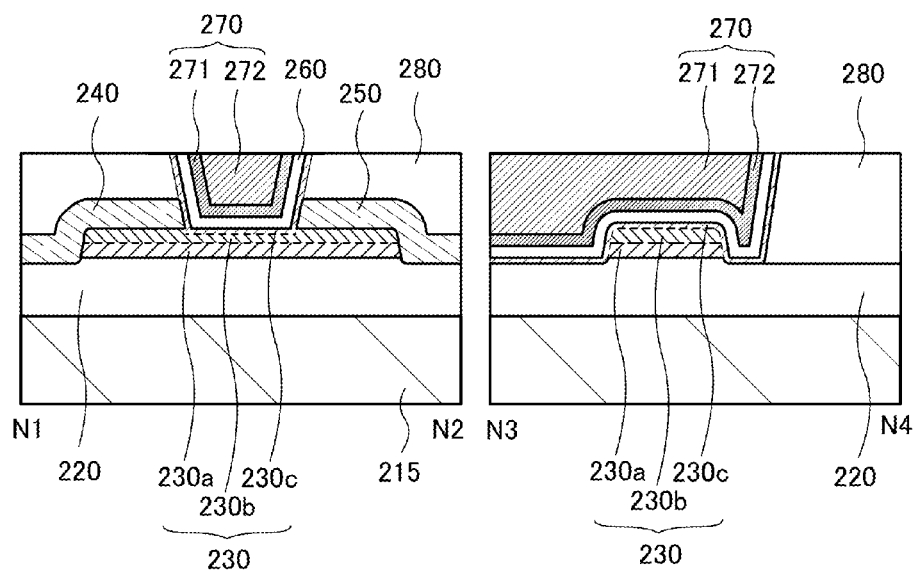

The transistor in one embodiment of the present invention may have a structure shown in FIGS. 43A and 43B. FIG. 43A is a top view and FIG. 43B is a cross-sectional view taken along dashed-dotted line N1-N2 in FIG. 43A. FIG. 43C is a cross-sectional view taken along dashed-dotted line N3-N4 in FIG. 43A. Note that for simplification of the drawing, some components in the top view in FIG. 43A are not illustrated.

In a transistor 213, the insulating layer 220 is in contact with the substrate 215; the oxide semiconductor layer 230 (the oxide semiconductor layers 230a to 230c) is in contact with the insulating layer 220; the conductive layers 240 and 250 are in contact with the oxide semiconductor layer 230b; the insulating layer 260 is in contact with the oxide semiconductor layer 230c; the conductive layer 270 is in contact with the insulating layer 260; the insulating layer 280 is in contact with the insulating layer 220 and the conductive layers 240 and 250. Note that the oxide semiconductor layer 230c, the insulating layer 260, and the conductive layer 270 are provided in an opening reaching the oxide semiconductor layer 230b in the insulating layer 280.

Since, in the structure of the transistor 213, a region where the conductive layer 270 overlaps with the conductive layer 240 or 250 is smaller than that in any of the above-described structures of the other transistors, parasitic capacitance can be small. Thus, the transistor 213 is suitable for components of a circuit which needs to operate at high speed. Note that the top surface of the transistor 213 is preferably planarized by chemical mechanical polishing (CMP) or the like as illustrated in FIGS. 43B and 43C; however, a structure in which planarization is not performed may be employed.

Figure 44A:
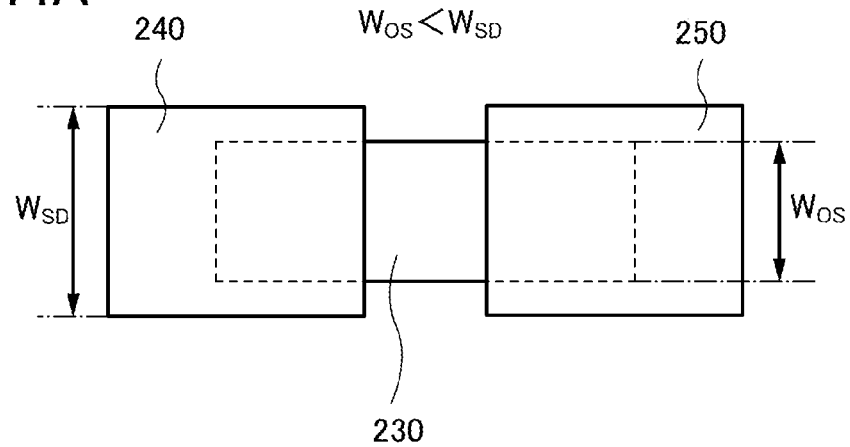
FIGS. 44A to 44C are top views each illustrating a transistor.
Figure 44B:
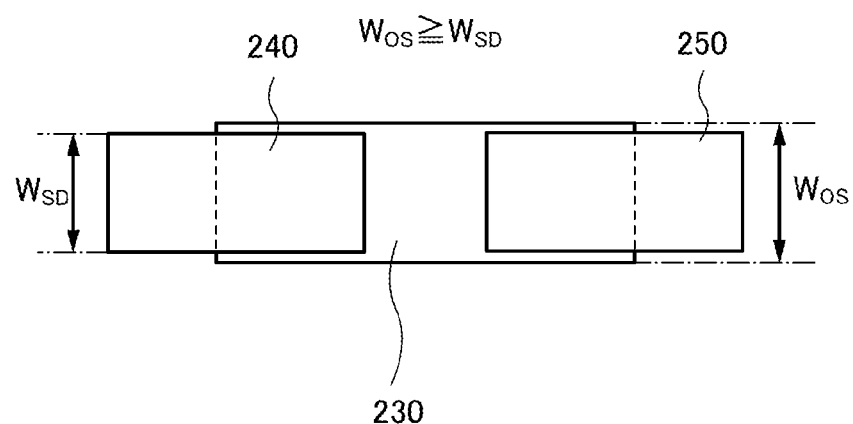
Figure 44C:
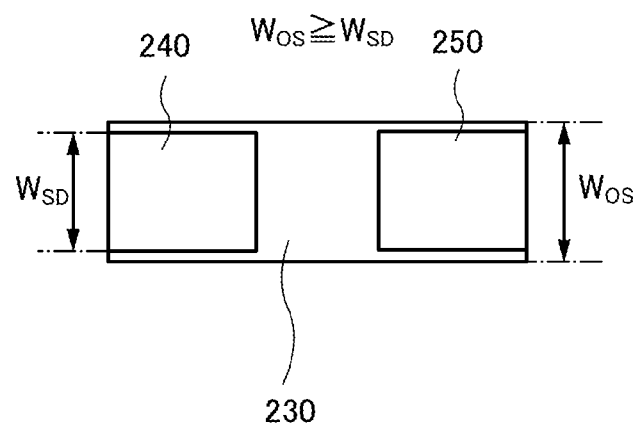

As shown in the top views in FIGS. 44A and 44B (showing only the oxide semiconductor layer 230, the conductive layer 240, and the conductive layer 250), the width ($W_{SD}$) of the conductive layers 240 and 250 may be either longer than or shorter than the width ($W_{OS}$) of the oxide semiconductor layer. When $W_{OS}$ is greater than or equal to $W_{SD}$ ($W_{SD}$ is less than or equal to $W_{OS}$) is satisfied, a gate electric field is easily applied to the entire oxide semiconductor layer 230, so that electrical characteristics of the transistor can be improved. As illustrated in FIG. 44C, the conductive layers 240 and 250 may be formed only in regions overlapping with the oxide semiconductor layer 230.

In the transistor including the oxide semiconductor layers 230a and 230b and the transistor including the oxide semiconductor layers 230a, 230b, and 230c, selecting appropriate materials for the two or three layers forming the oxide semiconductor layer 230 allows current to flow in the oxide semiconductor layer 230b. Since current flows in the oxide semiconductor layer 230b, the current is hardly influenced by interface scattering, leading to a large on-state current. Therefore, increasing the thickness of the oxide semiconductor layer 230b might increase the on-state current.

A semiconductor device using a transistor with any of the above structures can have favorable electrical characteristics.

The structure described in this embodiment can be used in appropriate combination with the structure described in any of the other embodiments.

Embodiment 5

In this embodiment, components of the transistors described in Embodiment 4 are described in detail.

As the substrate 215, a glass substrate, a quartz substrate, a semiconductor substrate, a ceramic substrate, a metal substrate having a surface subjected to insulation treatment, or the like can be used. Alternatively, the substrate 215 can be a silicon substrate provided with a transistor. Still alternatively, the substrate 215 can be the silicon substrate over which an insulating layer, a wiring, a conductor functioning as a contact plug, or the like are formed. Note that when only p-channel transistors are formed over the silicon substrate, a silicon substrate with n⁻-type conductivity is preferably used. Alternatively, an SOI substrate including an n⁻-type or i-type silicon layer may be used. A surface of the silicon substrate where the transistor is formed preferably has a (110) plane orientation. Forming a p-channel transistor using a silicon substrate having the (110) plane on the surface can increase the mobility.

The insulating layer 220 can have a function of supplying oxygen to the oxide semiconductor layer 230 as well as a function of preventing diffusion of impurities from a component included in the substrate 215. For this reason, the insulating layer 220 is preferably an insulating layer containing oxygen, more preferably an insulating layer in which the oxygen content is higher than that in the stoichiometric composition. For example, the insulating layer 220 is a film of which the amount of released oxygen when converted into oxygen atoms is $1.0 \times 10^{19}$ atoms/cm³ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. Note that in the case where the substrate 215 is a substrate for which another device is provided, the insulating layer 220 also functions as an interlayer insulating layer. In that case, the insulating layer 220 is preferably subjected to planarization treatment such as CMP treatment so as to have a flat surface.

For example, the insulating layer 220 can be formed using an oxide insulating layer including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating layer including silicon nitride, silicon nitride oxide, aluminum nitride, aluminum nitride oxide, or the like; or a mixed material of any of these. Alternatively, a stack of the above materials may be used.

In this embodiment, detailed description is given mainly on the case where the oxide semiconductor layer 230 of the transistor has a three-layer structure in which the oxide semiconductor layer 230a, the oxide semiconductor layer 230b, and the oxide semiconductor layer 230c are stacked in this order from the insulating layer 220 side.

Note that in the case where the oxide semiconductor layer 230 is a single layer, a layer corresponding to the oxide semiconductor layer 230b described in this embodiment is used.

In the case where the oxide semiconductor layer 230 has a two-layer structure, a stack in which a layer corresponding to the oxide semiconductor layer 230a and a layer corresponding to the oxide semiconductor layer 230b are sequentially stacked from the insulating layer 220 side described in this embodiment is used. In such a case, the oxide semiconductor layer 230a and the oxide semiconductor layer 230b can be replaced with each other.

In the case where the oxide semiconductor layer 230 has a stacked-layer structure of four or more layers, for example, a structure in which another oxide semiconductor layer is added to the three-layer stack of the oxide semiconductor layer 230 described in this embodiment can be employed.

For the oxide semiconductor layer 230b, for example, an oxide semiconductor whose electron affinity (an energy difference between a vacuum level and the conduction band minimum) is higher than those of the oxide semiconductor layers 230a and 230c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 230a and 230c each contain one or more kinds of metal elements contained in the oxide semiconductor layer 230b. For example, the oxide semiconductor layers 230a and 230c are preferably formed using an oxide semiconductor whose conduction band minimum is closer to a vacuum level than that of the oxide semiconductor layer 230b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 270, a channel is formed in the oxide semiconductor layer 230b whose conduction band minimum is the lowest in the oxide semiconductor layer 230.

Furthermore, since the oxide semiconductor layer 230a contains one or more kinds of metal elements contained in the oxide semiconductor layer 230b, an interface state is unlikely to be formed at the interface between the oxide semiconductor layers 230a and 230b, compared with the interface between the oxide semiconductor layer 230b and the insulating layer 220 on the assumption that the oxide semiconductor layer 230b is in contact with the insulating layer 220. The interface state sometimes forms a channel; therefore, the threshold voltage of the transistor is changed in some cases. Thus, with the oxide semiconductor layer 230a, variation in the electrical characteristics of the transistor, such as a threshold voltage, can be reduced. Moreover, the reliability of the transistor can be improved.

Furthermore, since the oxide semiconductor layer 230c contains one or more kinds of metal elements contained in the oxide semiconductor layer 230b, scattering of carriers is unlikely to occur at the interface between the oxide semiconductor layers 230b and 230c, compared with the interface between the oxide semiconductor layer 230b and the gate insulating layer (the insulating layer 260) on the assumption that the oxide semiconductor layer 230b is in contact with the gate insulating layer. Thus, with the oxide semiconductor layer 230c, the field-effect mobility of the transistor can be increased.

For the oxide semiconductor layers 230a and 230c, for example, a material containing Al, Ti, Ga, Ge, Y, Zr, Sn, La, Ce, or Hf with a higher atomic ratio than that used for the oxide semiconductor layer 230b can be used. Specifically, the atomic ratio of any of the above metal elements in the oxide semiconductor layers 230a and 230c is 1.5 times or more, preferably 2 times or more, more preferably 3 times or more as large as that in the oxide semiconductor layer 230b. Any of the above metal elements is strongly bonded to oxygen and thus has a function of suppressing generation of an oxygen vacancy in the oxide semiconductor layers 230a and 230c. That is, an oxygen vacancy is less likely to be generated in the oxide semiconductor layers 230a and 230c than in the oxide semiconductor layer 230b.

An oxide semiconductor that can be used for each of the oxide semiconductor layers 230a to 230c preferably contains at least In or Zn. Alternatively, both In and Zn are preferably contained. In order to reduce variations in the electrical characteristics of the transistors including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 230a to 230c is an In-M-Zn oxide containing at least indium, zinc, and M (M is a metal such as Al, Ti, Ga, Ge, Y, Zr, Sn, La, Ce, or Hf), in the case where the oxide semiconductor layer 230a has an atomic ratio of In to M and Zn which is $x_1:y_1:z_1$, the oxide semiconductor layer 230b has an atomic ratio of In to M and Zn which is $x_2:y_2:z_2$, and the oxide semiconductor layer 230c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$. At this time, when $y_2$ is greater than or equal to $x_2$ in the oxide semiconductor layer 230b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 230a and 230c are preferably less than 50 atomic % and greater than 50 atomic %, respectively, more preferably less than 25 atomic % and greater than 75 atomic %, respectively. Furthermore, in the case where Zn and O are not taken into consideration, the proportion of In and the proportion of M in the oxide semiconductor layer 230b are preferably greater than 25 atomic % and less than 75 atomic %, respectively, more preferably greater than 34 atomic % and less than 66 atomic %, respectively.

The indium content in the oxide semiconductor layer 230b is preferably higher than those in the oxide semiconductor layers 230a and 230c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 230b, a transistor having high field-effect mobility can be obtained.

The thickness of the oxide semiconductor layer 230a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 230b is greater than or equal to 3 nm and less than or equal to 200 nm, preferably greater than or equal to 5 nm and less than or equal to 150 nm, more preferably greater than or equal to 10 nm and less than or equal to 100 nm. The thickness of the oxide semiconductor layer 230c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 230b is preferably thicker than the oxide semiconductor layer 230c.

Note that in order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1\times10^{15}/cm^3$, preferably lower than $1\times10^{13}/cm^3$, further preferably lower than $8\times10^{11}/cm^3$, still further preferably higher than or equal to $1\times10^{-9}/cm^3$ and lower than $1\times10^8/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 230a to 230c and at interfaces between the oxide semiconductor layers.

In order to form an intrinsic or substantially intrinsic oxide semiconductor layer, the oxide semiconductor layer is arranged to have a region in which the concentration of silicon estimated by secondary ion mass spectrometry (SIMS) is lower than $1\times10^{19}$ atoms/cm$^3$, preferably lower than $5\times10^{18}$ atoms/cm$^3$, further preferably lower than $1\times10^{18}$ atoms/cm$^3$. Further, the oxide semiconductor layer is arranged to have a region in which the concentration of hydrogen is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The high concentration of silicon or carbon might reduce the crystallinity of the oxide semiconductor layer. In order to avoid the reduction of the crystallinity of the oxide semiconductor layer, for example, the oxide semiconductor layer is arranged to have a region in which the concentration of silicon is lower than $1\times10^{19}$ atoms/cm$^3$, preferably lower than $5\times10^{18}$ atoms/cm$^3$, further preferably lower than $1\times10^{18}$ atoms/cm$^3$. Further, the oxide semiconductor layer is arranged to have a region in which the concentration of carbon is lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor using the oxide semiconductor layer which is purified as described above for its channel formation region has extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

An insulating layer containing silicon is often used as a gate insulating layer of a transistor. For the above-described reason, it is preferable that a region of the oxide semiconductor layer, which serves as a channel, be not in contact with the gate insulating layer as in the transistor in one embodiment of the present invention. In the case where a channel is formed at the interface between the gate insulating layer and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating layer.

Accordingly, with the oxide semiconductor layer 230 having a stacked-layer structure including the oxide semiconductor layer 230a, the oxide semiconductor layer 230b, and the oxide semiconductor layer 230c, a channel can be formed in the oxide semiconductor layer 230b; thus, the transistor can have a high field-effect mobility and stable electrical characteristics.

In a band structure, the conduction band minimums of the oxide semiconductor layers 230a to 230c are continuous. This can be understood also from the fact that the compositions of the oxide semiconductor layers 230a to 230c are close to one another and oxygen is easily diffused among the oxide semiconductor layers 230a to 230c. Thus, the oxide semiconductor layers 230a to 230c have a continuous physical property though they have different compositions and form a stack. In the drawings, interfaces between the oxide semiconductor layers of the stack are indicated by dotted lines.

The oxide semiconductor layer 230 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 230a and 230c, and an In—Ga—Zn oxide whose atomic ratio of In to Ga and Zn is 1:1:1, 2:1:3, 5:5:6, or 3:1:2 can be used for the oxide semiconductor layer 230b. In each of the oxide semiconductor layers 230a, 230b, and 230c, the proportion of each atom in the atomic ratio varies within a range of ±40% as an error.

The oxide semiconductor layer 230b of the oxide semiconductor layer 230 serves as a well, so that a channel is formed in the oxide semiconductor layer 230b. Since the conduction band minimums are continuous, the oxide semiconductor layer 230 can also be referred to as a U-shaped well. Furthermore, a channel formed to have such a structure can also be referred to as a buried channel.

Trap levels due to impurities or defects might be formed in the vicinity of the interface between an insulating layer such as a silicon oxide film and each of the oxide semiconductor layers 230a and 230c. The oxide semiconductor layer 230b can be distanced away from the trap levels owing to existence of the oxide semiconductor layers 230a and 230c.

However, when the energy differences between the conduction band minimum of the oxide semiconductor layer 230b and the conduction band minimum of each of the oxide semiconductor layers 230a and 230c are small, an electron in the oxide semiconductor layer 230b might reach the trap level by passing over the energy differences. When the electron is trapped in the trap level, negative charge is generated at the interface with the insulating layer, so that the threshold voltage of the transistor is shifted in a positive direction.

The oxide semiconductor layers 230a to 230c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 240 functioning as a source electrode layer and the conductive layer 250 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus makes subsequent process temperatures comparatively high. It is also possible to use a stack of any of the above materials and Cu or an alloy such as Cu—Mn, which has low resistance. In the transistors 205, 206, 211, and 212, for example, it is possible to use W for the conductive layers 241 and 251 and use a stack of Ti and Al for the conductive layers 242 and 252.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the film and the oxygen vacancy are bonded to each other, so that the region is markedly changed to an n-type region. Accordingly, the n-type region can serve as a source electrode or a drain electrode of the transistor.

In the case where W is used for the conductive layers 240 and 250, the conductive layers 240 and 250 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 240 and 250 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 260 functioning as a gate insulating layer can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 260 may be a stack including any of the above materials. The insulating layer 260 may contain La, N, Zr, or the like as an impurity.

An example of a layered structure of the insulating layer 260 is described. The insulating layer 260 includes, for example, oxygen, nitrogen, silicon, or hafnium. Specifically, the insulating layer 260 preferably includes hafnium oxide and silicon oxide or silicon oxynitride.

Hafnium oxide and aluminum oxide have higher dielectric constants than silicon oxide and silicon oxynitride. Therefore, the insulating layer 260 using hafnium oxide or aluminum oxide can have larger thickness than the insulating layer 260 using silicon oxide, so that leakage current due to tunnel current can be reduced. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating layers 220 and 260 in contact with the oxide semiconductor layer 230, a film that releases less nitrogen oxide is preferably used. In the case where the oxide semiconductor is in contact with an insulating layer that releases a large amount of nitrogen oxide, the density of states due to nitrogen oxide becomes high in some cases. For the insulating layers 220 and 260, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 220 and 260, a shift in the threshold voltage of the transistor can be reduced, which leads to reduced fluctuations in the electrical characteristics of the transistor.

For the conductive layer 270 functioning as a gate electrode layer, for example, a conductive layer formed using Al, Ti, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 271 and tungsten is used for the conductive layer 272 to form the conductive layer 270.

As the insulating layer 275, a silicon nitride film, an aluminum nitride film, or the like containing hydrogen can be used. Since the oxide semiconductor layer 230 is partly in contact with the insulating layer 275 in the transistors 203, 204, 206, 209, 210, and 212 described in Embodiment 4, the use of an insulating layer containing hydrogen as the insulating layer 275 allows the oxide semiconductor layer 230 to be partly changed to n-type. In addition, a nitride insulating film functions as a blocking film against moisture and the like and can improve the reliability of the transistor.

An aluminum oxide film can also be used as the insulating layer 275. It is particularly preferable to use an aluminum oxide film as the insulating layer 275 in the transistors 201, 202, 205, 207, 208, and 211 described in Embodiment 4. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 230, preventing release of oxygen from the oxide semiconductor layer, and preventing unnecessary release of oxygen from the insulating layer 220. Furthermore, oxygen contained in the aluminum oxide film can be diffused into the oxide semiconductor layer.

Furthermore, the insulating layer 280 is preferably formed over the insulating layer 275. The insulating layer 280 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 280 may be a stack of any of the above materials.

Here, like the insulating layer 220, the insulating layer 280 preferably contains oxygen more than that in the stoichiometric composition. Oxygen released from the insulating layer 280 can be diffused into the channel formation region in the oxide semiconductor layer 230 through the insulating layer 260, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 207 to 212 in one embodiment of the present invention, the oxide semiconductor layer 230c is formed to cover the oxide semiconductor layer 230b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 270) is formed to electrically surround the oxide semiconductor layer 230 in the channel width direction; accordingly, a gate electric field is applied to the oxide semiconductor layer 230 in the side surface direction in addition to the perpendicular direction. In other words, a gate electric field is applied to the entire channel formation layer and an effective channel width is increased, leading to a further increase in the on-state current.

Furthermore, in the transistor in one embodiment of the present invention in which the oxide semiconductor layer 230 has a two-layer structure or a three-layer structure, since the oxide semiconductor layer 230b where a channel is formed is provided over the oxide semiconductor layer 230a, an effect of making an interface state less likely to be formed is obtained. In the transistor in one embodiment of the present invention in which the oxide semiconductor layer 230 has a three-layer structure, since the oxide semiconductor layer 230b is positioned at the middle of the three-layer structure, an effect of eliminating the influence of an impurity that enters from upper and lower layers on the oxide semiconductor layer 230b is obtained as well. Therefore, the transistor can achieve not only the increase in the on-state current of the transistor but also stabilization of the threshold voltage and a reduction in the S value (subthreshold value). Thus, current when gate voltage VG is 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma chemical vapor deposition (plasma CVD), such films may be formed by another method such as thermal CVD. Examples of thermal CVD include metal organic chemical vapor deposition (MOCVD) and atomic layer deposition (ALD).

A thermal CVD method has an advantage that no defect due to plasma damage is generated since it does not utilize plasma for forming a film.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in a film can be reduced. In addition, the use of the facing-target-type sputtering apparatus enables low-pressure deposition. Accordingly, the concentration of impurities (e.g., hydrogen, a rare gas (e.g., argon), or water) in a deposited oxide semiconductor layer can be lowered.

The structure described above in this embodiment can be combined with any of the structures described in the other embodiments as appropriate.

Embodiment 6

The structure of an oxide semiconductor layer that can be used for one embodiment of the present invention is described below.

An oxide semiconductor layer is classified into, for example, a non-single-crystal oxide semiconductor layer and a single crystal oxide semiconductor layer. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor layers including a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor layer having low impurity concentration. The impurity is an element other than the main components of the oxide semiconductor layer, such as hydrogen, carbon, silicon, or a transition metal element. In particular, an element that has higher bonding strength to oxygen than a metal element included in the oxide semiconductor layer, such as silicon, disturbs the atomic order of the oxide semiconductor layer by depriving the oxide semiconductor layer of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor layer and causes a decrease in crystallinity when it is contained in the oxide semiconductor layer. Note that the impurity contained in the oxide semiconductor layer might serve as a carrier trap or a carrier generation source.

The CAAC-OS film is an oxide semiconductor layer having a low density of defect states. For example, oxygen vacancies in the oxide semiconductor layer serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor layer has few carrier generation sources, and thus has a low carrier density. Thus, a transistor including the oxide semiconductor layer rarely has negative threshold voltage (is rarely normally on). A highly purified intrinsic or substantially highly purified intrinsic oxide semiconductor layer has few carrier traps. Accordingly, the transistor using the oxide semiconductor layer has little variation in electrical characteristics and high reliability. Note that charges trapped by the carrier traps in the oxide semiconductor layer take a long time to be released and may behave like fixed charges. Thus, the transistor using the oxide semiconductor layer with a high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor layer will be described.

In the high-resolution TEM image of the microcrystalline oxide semiconductor layer, there are a region where a crystal part is clearly observed and a region where a crystal part is not observed. In most cases, the size of a crystal part included in the microcrystalline oxide semiconductor layer is greater than or equal to 1 nm and less than or equal to 100 nm, or greater than or equal to 1 nm and less than or equal to 10 nm, for example. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor layer depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor layer that has high regularity than an amorphous oxide semiconductor layer. Thus, the nc-OS film has a lower density of defect states than the amorphous oxide semiconductor layer. Note that there is no regularity of crystal orientation between different crystal parts in the nc-OS film; thus, the nc-OS film has a higher density of defect states than the CAAC-OS film.

Next, an amorphous oxide semiconductor layer is described.

The amorphous oxide semiconductor layer has disordered atomic arrangement and no crystal part. For example, the amorphous oxide semiconductor layer does not have a specific state as in quartz.

In a high-resolution TEM image of the amorphous oxide semiconductor layer, crystal parts cannot be found.

When the amorphous oxide semiconductor layer is subjected to structural analysis by an out-of-plane method with an XRD apparatus, a peak which shows a crystal plane does not appear. A halo pattern is observed when the amorphous oxide semiconductor layer is subjected to electron diffraction. Furthermore, a spot is not observed and only a halo pattern appears when the amorphous oxide semiconductor layer is subjected to nanobeam electron diffraction.

Note that an oxide semiconductor layer may have a structure having physical properties between the nc-OS film and the amorphous oxide semiconductor layer. The oxide semiconductor layer having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

The density of an oxide semiconductor layer might vary depending on its structure. For example, if the composition of an oxide semiconductor layer is determined, the structure of the oxide can be estimated from a comparison between the density of the oxide semiconductor and the density of a single-crystal oxide having the same composition as the oxide. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor layer having a density of lower than 78% of the density of the single crystal oxide semiconductor.

Specific examples of the above description are given. For example, in the case of an oxide semiconductor layer having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor layer having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor layer having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor layer may be a stacked film including two or more films of an amorphous oxide semiconductor layer, an a-like OS film, a microcrystalline oxide semiconductor layer, and a CAAC-OS film, for example.

The structure described in this embodiment can be used in appropriate combination with the structure described in any of the other embodiments.

Embodiment 7

In this embodiment, an example of a package including the imaging device of one embodiment of the present invention is described.

Figure 45A:
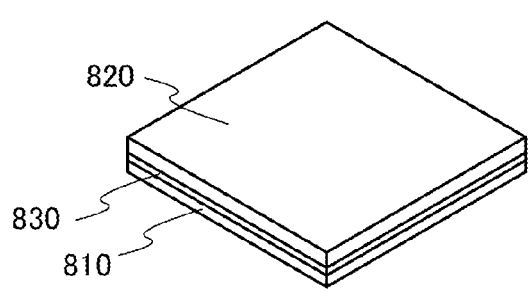
FIGS. 45A to 45D are perspective views and a cross-sectional view of a package including an imaging device.

FIG. 45A is an external perspective view of the package including the imaging device in one embodiment of the present invention. The package includes an interposer 810 for fixing the imaging device, a cover glass 820, and an adhesive 830 for bonding the interposer 810 and the cover glass 820.

Figure 45B:
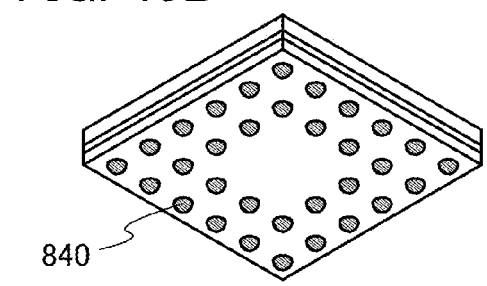

FIG. 45B is an external perspective view of a rear surface side of the package. The package has a so-called ball grid array (BGA) structure including solder balls on the rear surface of the package as bumps 840. Although the BGA structure is employed, land grid array (LGA), pin grid array (PGA), or the like may be employed without limitation thereto.

Figure 45C:
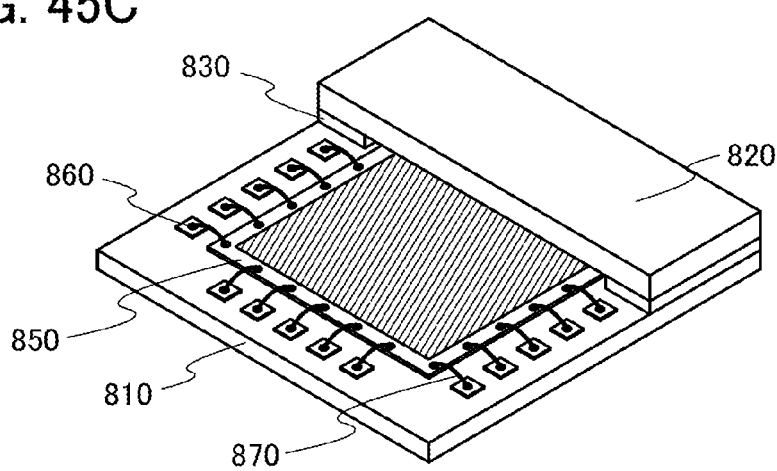
Figure 45D:
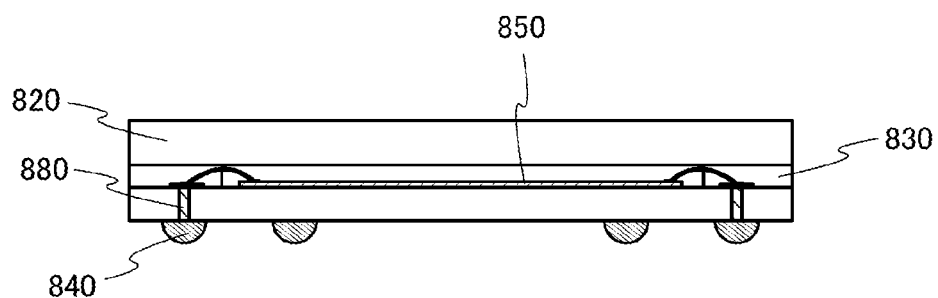

FIG. 45C is a perspective view of the package in which the cover glass 820 and the adhesive 830 are partly omitted. FIG. 45D is a cross sectional view of a given position parallel to a side of the package. An electrode pad 860 is formed on the interposer 810, and the electrode pad 860 and the bumps 840 are electrically connected via through holes 880 formed in the interposer 810. The electrode pad 860 is electrically connected to an electrode of the imaging device 850 through a wire 870.

The imaging device of one embodiment of the present invention is easily mounted and can be incorporated in various electronic devices when used as a package of the above-described structure.

The structure described in this embodiment can be used in appropriate combination with the structure described in any of the other embodiments.

Embodiment 8

An imaging device in one embodiment of the present invention and a semiconductor device including the imaging device can be used for display devices, personal computers, or image reproducing devices provided with recording media (typically, devices that reproduce the content of recording media such as digital versatile discs (DVD) and have displays for displaying the reproduced images). Furthermore, as electronic devices that can include the imaging device in one embodiment of the present invention and the semiconductor device including the imaging device, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 46A to 46F illustrate specific examples of these electronic devices.

Figure 46A:
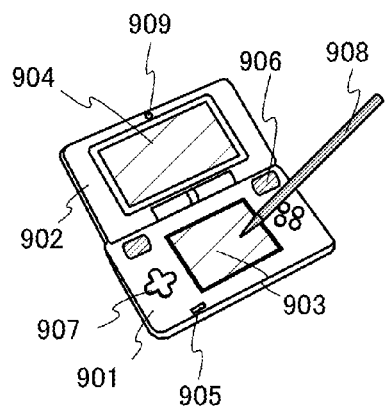
FIGS. 46A to 46F illustrate electronic devices.

FIG. 46A illustrates a portable game machine, which includes housings 901 and 902, display portions 903 and 904, a microphone 905, speakers 906, an operation key 907, a stylus 908, a camera 909, and the like. Although the portable game machine in FIG. 46A includes the two display portions 903 and 904, the number of display portions included in the portable game machine is not limited to this. The imaging device in one embodiment of the present invention can be used for the camera 909.

Figure 46B:
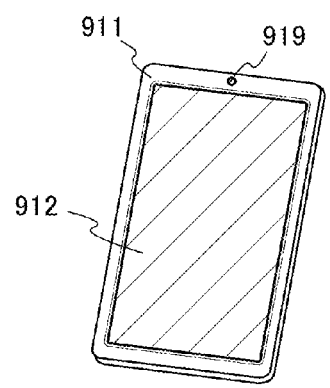

FIG. 46B illustrates a portable data terminal, which includes a first housing 911, a display portion 912, a camera 919, and the like. The touch panel function of the display portion 912 enables input and output of information. The imaging device in one embodiment of the present invention can be used for the camera 919.

Figure 46C:
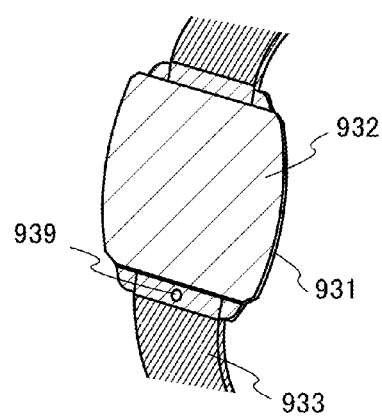

FIG. 46C illustrates a wrist-watch-type information terminal, which includes a housing 931, a display portion 932, a wristband 933, a camera 939, and the like. The display portion 932 may be a touch panel. The imaging device in one embodiment of the present invention can be used for the camera 939.

Figure 46D:
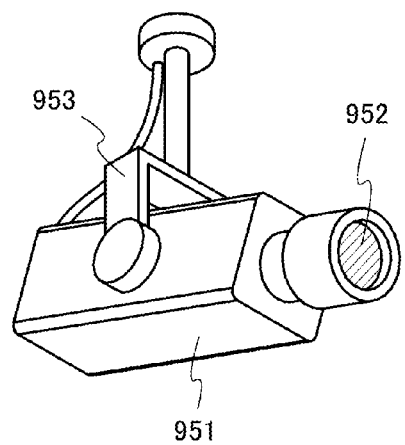

FIG. 46D illustrates a surveillance camera, which includes a housing 951, a lens 952, a support portion 953, and the like. The imaging device in one embodiment of the present invention can be provided in a focus of the lens 952.

Figure 46E:
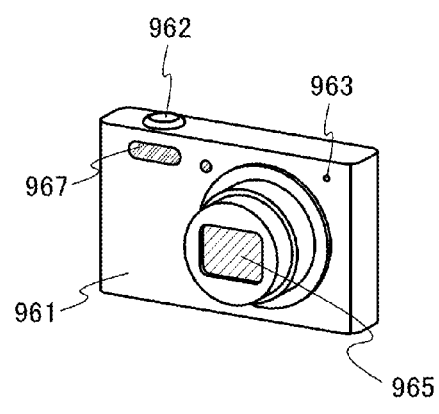

FIG. 46E illustrates a digital camera, which includes a housing 961, a shutter button 962, a microphone 963, a light-emitting portion 967, a lens 965, and the like. The imaging device in one embodiment of the present invention can be used provided in a focus of the lens 965.

Figure 46F:
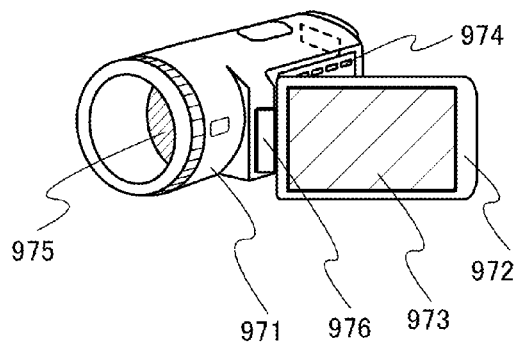

FIG. 46F illustrates a video camera, which includes a first housing 971, a second housing 972, a display portion 973, operation keys 974, a lens 975, a joint 976, and the like. The operation keys 974 and the lens 975 are provided in the first housing 971, and the display portion 973 is provided in the second housing 972. The first housing 971 and the second housing 972 are connected to each other with the joint 976, and an angle between the first housing 971 and the second housing 972 can be changed with the joint 976. An image displayed on the display portion 973 may be switched in accordance with the angle between the first housing 971 and the second housing 972 at the joint 976. The imaging device in one embodiment of the present invention can be provided in a focus of the lens 975.

This embodiment can be combined with any of the other embodiments in this specification as appropriate.

REFERENCE NUMERALS

11: circuit, 12: circuit, 20: photoelectric conversion element, 21: photoelectric conversion layer, 22: light-transmitting conductive layer, 23: semiconductor layer, 24: semiconductor layer, 25: semiconductor layer, 26; electrode, 26a: conductive layer, 26b: conductive layer, 27: partition wall, 31: transistor, 32: transistor, 33: transistor, 34: transistor, 35: transistor, 36: transistor, 41: capacitor, 42: capacitor, 51: wiring, 52: wiring, 53: wiring, 54: wiring, 55: wiring, 56: wiring, 61: wiring, 62: wiring, 63: wiring, 65: wiring, 66: wiring, 70: wiring, 81: imaging operation, 82: data holding operation, 83: read operation, 91: conductor, 92: insulating layer, 92a: insulating layer, 92b: insulating layer, 93: insulating layer, 94: wiring, 94a: conductive layer, 94b: conductive layer, 95: wiring, 96: insulating layer, 100: silicon substrate, 101: transistor, 102: transistor, 105: active layer, 106: silicon substrate, 201: transistor, 202: transistor, 203: transistor, 204: transistor, 205: transistor, 206: transistor, 207: transistor, 208: transistor, 209: transistor, 210: transistor, 211: transistor, 212: transistor, 213: transistor, 215: substrate, 220: insulating layer, 230: oxide semiconductor layer, 230a: oxide semiconductor layer, 230b: oxide semiconductor layer, 230c: oxide semiconductor layer, 240: conductive layer, 241: conductive layer, 242: conductive layer, 250: conductive layer, 251: conductive layer, 252: conductive layer, 260: insulating layer, 270: conductive layer, 271: conductive layer, 272: conductive layer, 273: conductive layer, 275: insulating layer, 280: insulating layer, 331: region, 332: region, 333: region, 334: region, 335: region, 400: pixel portion, 410: row driver, 420: A/D converter, 430: column driver, 810: interposer, 820: cover glass, 830: adhesive, 840: bump, 850: imaging device, 860: electrode pad, 870: wire, 880: through hole, 901: housing, 902: housing, 903: display portion, 904: display portion, 905: microphone, 906: speaker, 907: operation key, 908: stylus, 909: camera, 911: housing, 912: display portion, 919: camera, 931: housing, 932: display portion, 933: wristband, 939: camera, 951: housing, 952: lens, 953: support portion, 961: housing, 962: shutter button, 963: microphone, 965: lens, 967: light-emitting portion, 971: housing, 972: housing, 973: display portion, 974: operation key, 975: lens, 976: joint, 1100: layer, 1200: layer, 1400: layer, 1500: diffraction grating, 1600: layer, 2500: insulating layer, 2510: light-blocking layer, 2520: organic region layer, 2530: color filter, 2530a: color filter, 2530b: color filter, 2530c: color filter, 2540: microlens array, 2550: optical conversion layer, 2560: insulating layer.

This application is based on Japanese Patent Application serial no. 2015-087194 filed with Japan Patent Office on Apr. 22, 2015, the entire contents of which are hereby incorporated by reference.

The invention claimed is:
1. An imaging device comprising:
a photoelectric conversion element;
a first transistor;
a second transistor;
a third transistor;
a fourth transistor;
a fifth transistor;
a sixth transistor; and
a first capacitor,
wherein one terminal of the photoelectric conversion element is directly connected to one of a source electrode and a drain electrode of the first transistor,
wherein the other terminal of the photoelectric conversion element is directly connected to a first power supply line,
wherein the other of the source electrode and the drain electrode of the first transistor is electrically connected to one of a source electrode and a drain electrode of the sixth transistor, wherein the other of the source electrode and the drain electrode of the first transistor is directly connected to one terminal of the first capacitor, wherein one of a source electrode and a drain electrode of the third transistor is electrically connected to the other terminal of the first capacitor, wherein the one of the source electrode and the drain electrode of the third transistor is electrically connected to a gate electrode of the fourth transistor, wherein the other of the source electrode and the drain electrode of the third transistor is electrically connected to one of a source electrode and a drain electrode of the fourth transistor, wherein the other of the source electrode and the drain electrode of the third transistor is directly connected to one of a source electrode and a drain electrode of the fifth transistor, wherein the gate electrode of the fourth transistor is directly connected to the other terminal of the first capacitor, wherein the other of the source electrode and the drain electrode of the fifth transistor is directly connected to a second power supply line, and wherein the other of the source electrode and the drain electrode of the fourth transistor is electrically connected to one of a source electrode and a drain electrode of the second transistor.

2. The imaging device according to claim 1,
wherein each of the first transistor, the third transistor, and the sixth transistor includes an oxide semiconductor, and
wherein the oxide semiconductor includes In, Zn, and M (M is Al, Ti, Ga, Sn, Y, Zr, La, Ce, Nd, or Hf).

3. The imaging device according to claim 1,
wherein each of the first transistor, the third transistor, and the sixth transistor has a back gate electrode.

4. The imaging device according to claim 1, further comprising: a second capacitor,
wherein one terminal of the second capacitor is electrically connected to the other terminal of the first capacitor.

5. The imaging device according to claim 1,
wherein the photoelectric conversion element includes a material containing selenium.

6. An electronic device comprising:
the imaging device according to claim 1; and
a display device.

7. An imaging device comprising:
a photoelectric conversion element;
a first transistor;
a second transistor;
a third transistor;
a fourth transistor;
a fifth transistor; and
a first capacitor,
wherein one terminal of the photoelectric conversion element is directly connected to one of a source electrode and a drain electrode of the first transistor,
wherein the other terminal of the photoelectric conversion element is directly connected to a first power supply line,
wherein the other of the source electrode and the drain electrode of the first transistor is directly connected to one terminal of the first capacitor;
wherein one of a source electrode and a drain electrode of the third transistor is electrically connected to the other terminal of the first capacitor, wherein the one of the source electrode and the drain electrode of the third transistor is electrically connected to a gate electrode of the fourth transistor, wherein the other of the source electrode and the drain electrode of the third transistor is electrically connected to one of a source electrode and a drain electrode of the fourth transistor, wherein the other of the source electrode and the drain electrode of the third transistor is directly connected to one of a source electrode and a drain electrode of the fifth transistor, wherein the gate electrode of the fourth transistor is directly connected to the other terminal of the first capacitor, wherein the other of the source electrode and the drain electrode of the fifth transistor is directly connected to a second power supply line, and wherein the other of the source electrode and the drain electrode of the fourth transistor is electrically connected to one of a source electrode and a drain electrode of the second transistor.

8. The imaging device according to claim 7,
wherein each of the first transistor and the third transistor includes an oxide semiconductor, and
wherein the oxide semiconductor includes In, Zn, and M (M is Al, Ti, Ga, Sn, Y, Zr, La, Ce, Nd, or Hf).

9. The imaging device according to claim 7,
wherein each of the first transistor and the third transistor has a back gate electrode.

10. The imaging device according to claim 7, further comprising: a second capacitor,
wherein one terminal of the second capacitor is electrically connected to the other terminal of the first capacitor.

11. The imaging device according to claim 7,
wherein the photoelectric conversion element includes a material containing selenium.

12. An electronic device comprising:
the imaging device according to claim 7; and
a display device.

13. A method for driving an imaging device,
the imaging device comprising a plurality of pixels,
wherein each of the plurality of pixels comprises:
a photoelectric conversion element;
a first transistor;
a second transistor;
a third transistor;
a fourth transistor;
a fifth transistor;
a sixth transistor; and
a first capacitor,
wherein one terminal of the photoelectric conversion element is electrically connected to one of a source electrode and a drain electrode of the first transistor,
wherein the other of the source electrode and the drain electrode of the first transistor is electrically connected to one of a source electrode and a drain electrode of the sixth transistor,
wherein the other of the source electrode and the drain electrode of the first transistor is electrically connected to one terminal of the first capacitor,
wherein one of a source electrode and a drain electrode of the third transistor is electrically connected to the other terminal of the first capacitor,
wherein the one of the source electrode and the drain electrode of the third transistor is electrically connected to a gate electrode of the fourth transistor, wherein the other of the source electrode and the drain electrode of the third transistor is electrically connected to one of a source electrode and a drain electrode of the fourth transistor,
wherein the other of the source electrode and the drain electrode of the third transistor is electrically connected to one of a source electrode and a drain electrode of the fifth transistor, and
wherein the other of the source electrode and the drain electrode of the fourth transistor is electrically connected to one of a source electrode and a drain electrode of the second transistor,
the method of comprising the steps of:
  turning on the first transistor, the third transistor, the fifth transistor, and the sixth transistor, and turning off the second transistor at a first time, and
  turning off the fifth transistor and turning on the second transistor at a second time to compensate variation in threshold voltage of the fourth transistor.

14. The method for driving the imaging device according to claim 13,
wherein a potential that is applied to a gate electrode of the second transistor at the second time is higher than a potential applied to the gate electrode of the second transistor in imaging operation performed after the second time.

* * * * *